US008258033B2

(12) United States Patent
Watanabe

(10) Patent No.: US 8,258,033 B2
(45) Date of Patent: Sep. 4, 2012

(54) METHOD OF MANUFACTURING NONVOLATILE SEMICONDUCTOR MEMORY DEVICE

(75) Inventor: Nobutaka Watanabe, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 220 days.

(21) Appl. No.: 12/728,763

(22) Filed: Mar. 22, 2010

(65) Prior Publication Data

US 2011/0031547 A1 Feb. 10, 2011

(30) Foreign Application Priority Data

Aug. 10, 2009 (JP) .................................. 2009-185763

(51) Int. Cl.
*H01L 21/8239* (2006.01)

(52) U.S. Cl. .................. 438/283; 438/287; 257/E21.423

(58) Field of Classification Search .................. 438/197, 438/283, 287, 288; 257/E21.423, E29.309
See application file for complete search history.

(56) References Cited

U.S. PATENT DOCUMENTS

| 2007/0252201 A1 | 11/2007 | Kito et al. |
| 2009/0242967 A1 | 10/2009 | Katsumata et al. |

FOREIGN PATENT DOCUMENTS

| JP | 2001-110920 | 4/2001 |
| JP | 2006-186245 | 7/2006 |
| JP | 2007-266143 | 10/2007 |
| JP | 2007-320215 | 12/2007 |
| JP | 2008-65882 | 3/2008 |
| JP | 2008-171838 | 7/2008 |
| JP | 2009-135324 | 6/2009 |
| JP | 2009-146954 | 7/2009 |
| JP | 2009-224465 | 10/2009 |
| KR | 10-2008-0035211 | 4/2008 |
| KR | 10-2009-0047614 | 5/2009 |
| WO | WO 2009/075370 A1 | 6/2009 |

OTHER PUBLICATIONS

U.S. Appl. No. 13/004,229, filed Jan. 11, 2011, Watanabe et al.
U.S. Appl. No. 12/839,784, filed Jul. 20, 2010, Ichinose, et al.
Office Action issued May 30, 2011 in Korean Patent Application No. 10-2010-20248 (with English translation).
Office Action issued Jan. 5, 2012 in Japan Application No. 2009-185763 (With English Translation).
U.S. Appl. No. 12/728,763, filed Mar. 22, 2010, Watanabe.
U.S. Appl. No. 13/351,420, filed Jan. 17, 2012, Ko.
U.S. Appl. No. 13/423,464, filed Mar. 19, 2012, Ohsawa.

*Primary Examiner* — Evan Pert
(74) *Attorney, Agent, or Firm* — Oblon, Spivak, McClelland, Maier & Neustadt, L.L.P.

(57) ABSTRACT

A nonvolatile semiconductor memory device includes: a substrate; a plurality of gate electrodes provided on the substrate, extended in a first direction parallel to an upper surface of the substrate, arranged in a matrix in an up-to-down direction perpendicular to the upper surface and a second direction, and having a through-hole respectively extended in the up-to-down direction, the second direction being orthogonal to both the first direction and the up-to-down direction; an insulation plate provided between the gate electrodes in the second direction and extended in the first direction and the up-to-down direction; a block insulation film provided on an interior surface of the through-hole and on an upper surface and a lower surface of the gate electrodes and being contact with the insulation plate; a charge storage film provided on the block insulation film; a tunnel insulation film provided on the charge storage film; and a semiconductor pillar provided in the through-hole and extended in the up-to-down direction.

9 Claims, 39 Drawing Sheets

METHOD OF MANUFACTURING NONVOLATILE SEMICONDUCTOR MEMORY DEVICE

CROSS-REFERENCE TO RELATED APPLICATIONS

This application is based upon and claims the benefit of priority from the prior Japanese Patent Application No. 2009-185763, filed on Aug. 10, 2009; the entire contents of which are incorporated herein by reference.

BACKGROUND

1. Field

Embodiments of the invention relate generally to a nonvolatile semiconductor memory device and a method for manufacturing the same.

2. Background Art

Conventionally, semiconductor memory devices, such as flash memories and the like have been formed by memory cells two-dimensionally integrated on the surfaces of silicon substrates. To decrease the bit unit cost of such semiconductor memory devices to make their capacities large, memory cells must be highly integrated. Recently, however, the high integration has been difficult in terms of costs and techniques.

As a technique to break through the limit of the high integration, there is a method to integrate three-dimensionally by stacking memory cells. However, simply stacking and processing one layer after another increase the process number as the stacked layer number increases, and the cost increases. Here is proposed a technique of stacking gate electrodes and an insulation film alternately to form a stacked body, collectively processing to form through-holes in the stacked body, stacking a block insulation film, a charge storage film and a tunnel insulation film in this order on the side surfaces of the though-holes, and burying silicon pillars inside the through-holes (for example, refer to JP-A 2007-266143 (Kokai)).

In such correctively processed three-dimensional stacked memory, memory cell transistors are formed at the intersections between each gate electrode and silicon pillars, and the potential of each gate electrode and each silicon pillar are controlled to input and output charges from the silicon pillar into the charge storage film, and information can be stored. This technique, in which the stacked body is correctively processed to form the through-holes, does not increase the number of the lithography process even when the stacking number of the gate electrode is increased, and the cost increase can be suppressed.

However, in such correctively processed three-dimensional stacked memory, it is difficult to form memory cell transistors of uniform characteristics all over the stacked body. For example, in forming the through-holes in the stacked body, it is extremely difficult to process the side surfaces of the through-holes perfectly vertical, and taper angles are formed especially at the portions where the through-holes pierce the insulation films. Accordingly, the through-holes in the lower part of the stacked body are thinner in comparison with the upper part thereof. This varies the characteristics of the memory transistors.

SUMMARY

According to an aspect of the invention, there is provided a nonvolatile semiconductor memory device including: a substrate; a plurality of gate electrodes provided on the substrate, extended in a first direction parallel to an upper surface of the substrate, arranged in a matrix in an up-to-down direction perpendicular to the upper surface and a second direction, and having a through-hole respectively extended in the up-to-down direction, the second direction being orthogonal to both the first direction and the up-to-down direction; an insulation plate provided between the gate electrodes in the second direction and extended in the first direction and the up-to-down direction; a block insulation film provided on an interior surface of the through-hole and on an upper surface and a lower surface of the gate electrodes and being contact with the insulation plate; a charge storage film provided on the block insulation film; a tunnel insulation film provided on the charge storage film; and a semiconductor pillar provided in the through-hole and extended in the up-to-down direction.

According to another aspect of the invention, there is provided a method of manufacturing a nonvolatile semiconductor memory device including: forming a stacked body by alternately stacking impurity-doped silicon layers and silicon layers without impurity on a substrate; forming a slit in the stacked body from an upper surface side of the stacked body to divide each of the impurity-doped silicon layers into a plurality of gate electrodes, the slit being extended in a first direction parallel to an upper surface of the substrate; burying an insulation material in the slit to form an insulation plate; forming a through-hole so as to pierce the stack body, the through-hole being extended in an up-to-down direction perpendicular to the upper surface of the substrate; removing the silicon layers without impurity by performing wet etching via the through-hole; depositing a block insulation film on an interior surface of the through-hole and on an upper surface and a lower surface of the gate electrodes; depositing a charge storage film on the block insulation film; depositing a tunnel insulation film on the charge storage film; and burying a semiconductor material in the through-hole to form a semiconductor pillar extended in the up-to-down direction.

According to still another aspect of the invention, there is provided a method of manufacturing a nonvolatile semiconductor memory device comprising: forming a stacked body by alternately stacking impurity-doped silicon layers and silicon layers without impurity on a substrate; forming a slit on an upper surface of the stacked body to divide each of the impurity-doped silicon layers into a plurality of gate electrodes, the slit being extended in a first direction parallel to an upper surface of the substrate; burying a sacrifice material in the slit; forming a through-hole so as to pierce the stack body, the through-hole being extended in an up-to-down direction perpendicular to the upper surface of the substrate; removing the silicon layers without impurity by performing wet-etching via the through-hole; depositing a block insulation film on an interior surface of the through-hole and an upper surface and a lower surface of the gate electrodes; depositing a charge storage film on the block insulation film; depositing a tunnel insulation film on the charge storage film; burying a semiconductor material in the through-hole to form a semiconductor pillar extended in the up-to-down direction; removing the sacrifice material; forming a metal silicide layer on a surface of each of the gate electrodes exposed in the slit; and burying an insulation material in the slit to form an insulation plate.

DETAILED DESCRIPTION

Embodiments of this invention will be described below with reference to the drawings.

First, a first embodiment of this invention will be described.

Figure 1:
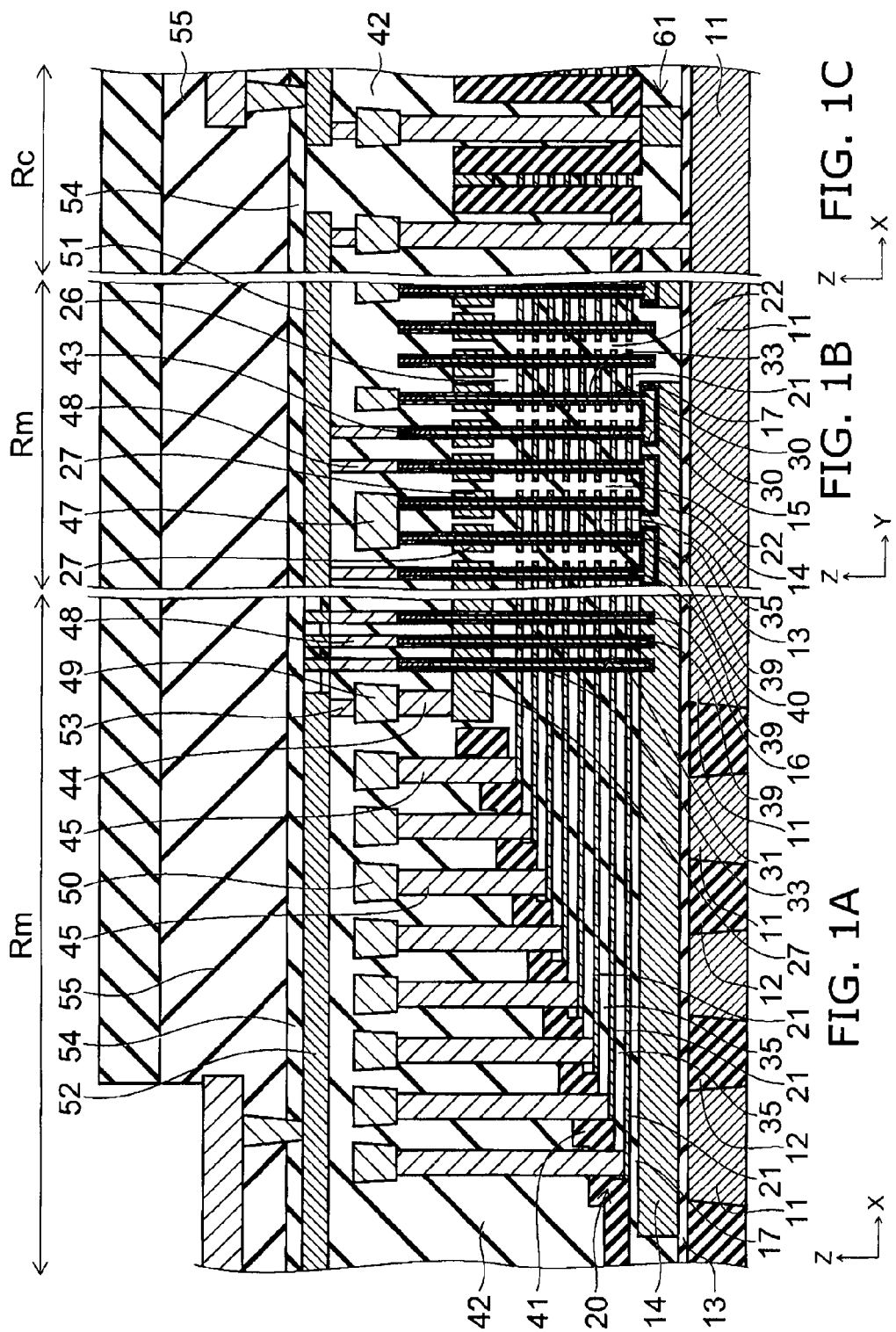
FIGS. 1A to 1C are cross-sectional views illustrating a nonvolatile semiconductor memory device according to a first embodiment of the invention.

FIGS. 1A to 1C are cross-sectional views illustrating the nonvolatile semiconductor memory device according to this embodiment. FIG. 1A shows the end of a memory array region, FIG. 1B shows the central part of the memory array region, and FIG. 1C shows the peripheral circuit region.

Figure 2:
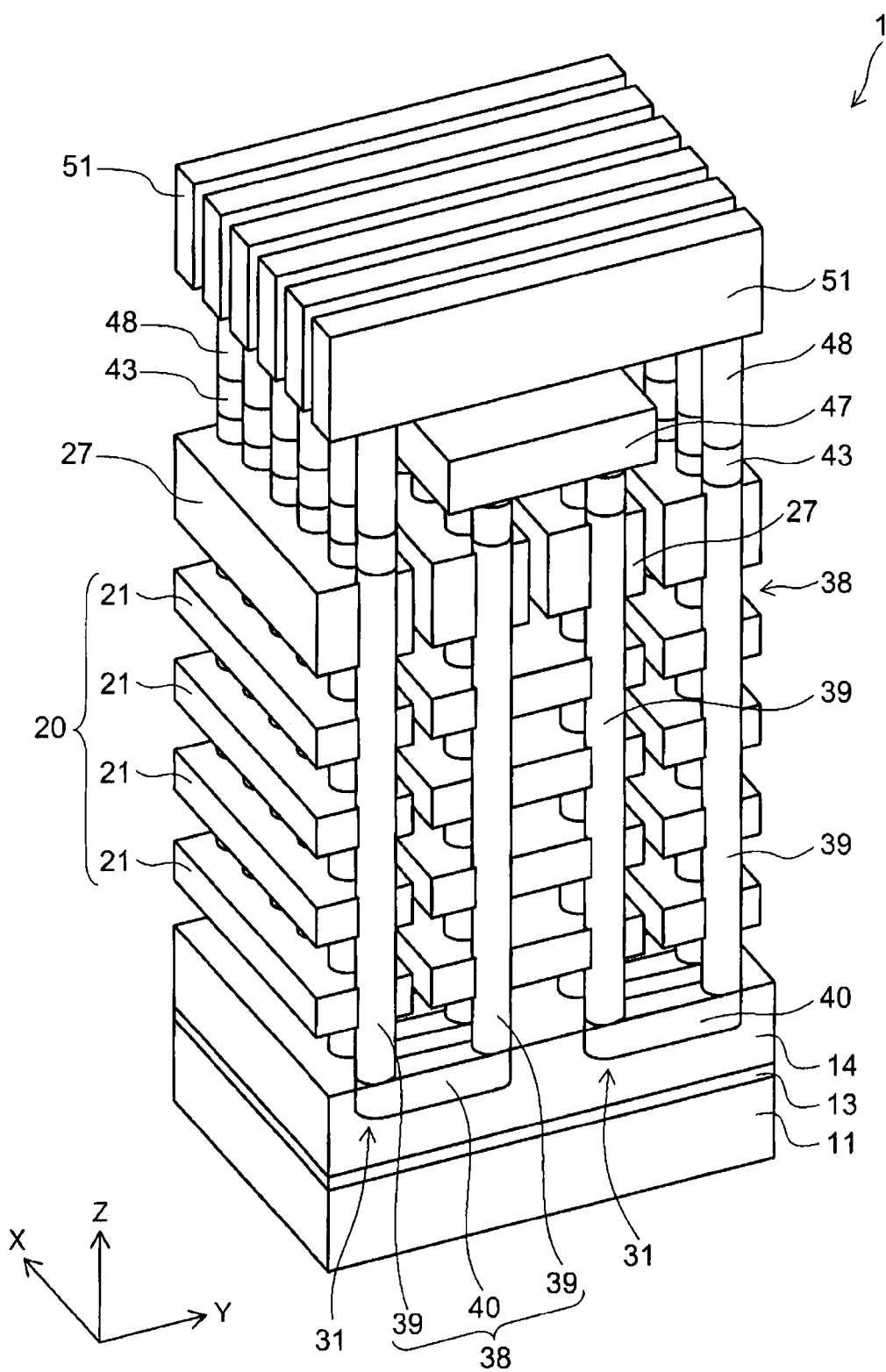
FIG. 2 is a perspective view illustrating the central part of a memory array region of the nonvolatile semiconductor memory device according to the first embodiment.

FIG. 2 is a perspective view illustrating the central part of the memory array region of the nonvolatile semiconductor memory device according to this embodiment.

Figure 3:
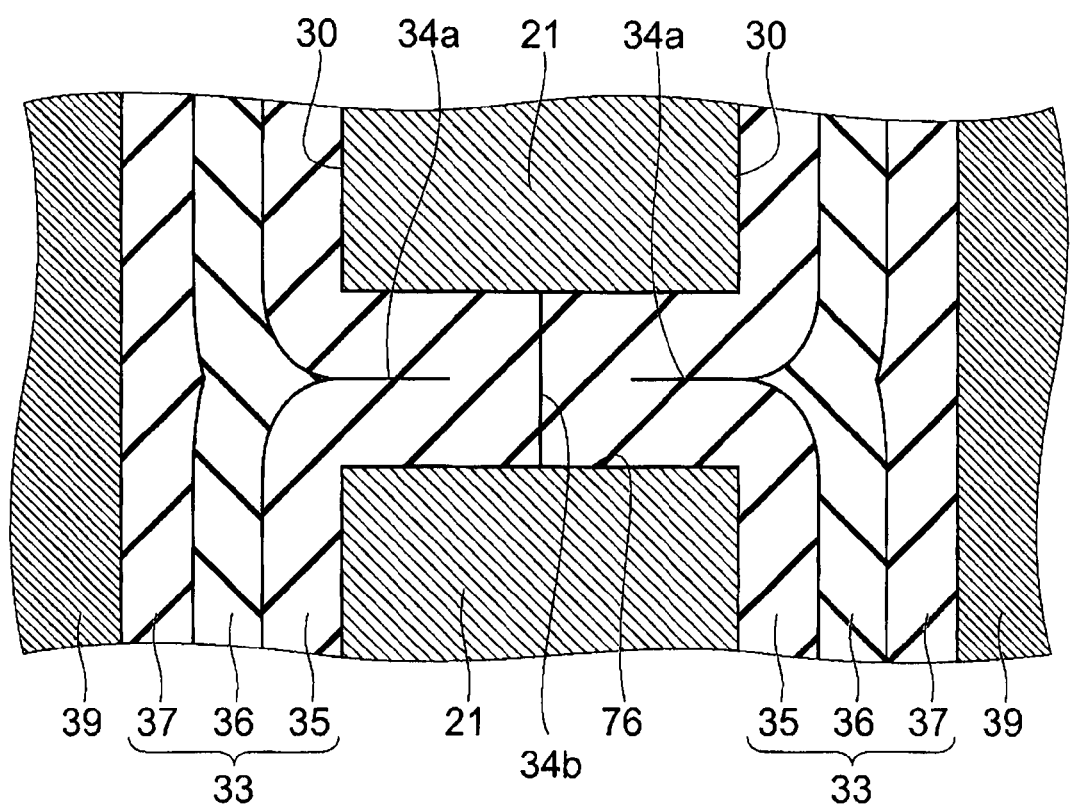
FIG. 3 is a partially enlarged cross-sectional view illustrating a portion between gate electrodes of the nonvolatile semiconductor memory device according to the first embodiment.

FIG. 3 is a partially enlarged cross-sectional view illustrating a portion between gate electrodes of the nonvolatile semiconductor memory device according to this embodiment.

For the convenience of the illustration, FIG. 2 illustrates only the conducting portions, and the insulation portions are omitted.

First, characteristic portions of this embodiment will be schematically described. The following is a characteristic of the nonvolatile semiconductor memory device according to this embodiment. A three-dimensional stacked-type memory device, which includes a plurality of gate electrodes being stacked on a silicon substrate, through-holes being formed in the gate electrodes, silicon pillars extended in the up-to-down direction being buried in the through-holes, and a tunnel insulation film, a charge storage film, and a block insulation film being provided around the silicon pillars, has the block insulation film extended from the interior surfaces of the through-holes onto the upper surfaces and the lower surfaces of the gate electrodes and reaching to slits dividing the gate electrodes. Thus, no interlayer insulation film only for insulating the gate electrodes adjacent to each other in the up-to-down direction is provided. Therefore, the through-holes are free from the variations in the diameter due to the variations in the etched amount of etching the interlayer insulation film, and the characteristics of the memory cell transistors are free from changes due to the variations. The spaces between the gate electrodes are filled with the block insulation film of uniform characteristics and high dielectric strength, which makes the characteristics of the memory cell transistors uniform and the dielectric strength between the gate electrodes high.

The following is a characteristic of the manufacturing method according to this embodiment. A boron-doped silicon layer and a non-doped silicon layer are alternately stacked on a silicon substrate to form a stacked body; then slits are formed in the stacked body to bury insulation plates while the boron-doped silicon layer is divided into a plurality of gate electrodes; subsequently through-holes are formed in the stacked body; the non-doped silicon layer is removed by etching via the through-holes; and a block insulation film is deposited. No insulation film of silicon oxide film or the like presents in the stacked body when the through-holes are formed. Therefore, the through-holes can be formed substantially vertical. The manufacturing method has no process of burying sacrifice materials in the slits and the through-holes and removing them in the later processes. The nonvolatile semiconductor memory device can be manufactured by a smaller number of processes.

The configuration of the nonvolatile semiconductor memory device according to this embodiment will be described below.

As illustrated in FIGS. 1A to 1C, in a nonvolatile semiconductor memory device 1 (hereinafter called simply "device 1") according to this embodiment, a silicon substrate 11 is provided. STIs (Shallow Trench Isolations) 12 are formed selectively in an upper layer portion of the silicon substrate 11. In the device 1, a memory array region Rm and a peripheral circuit region Rc are set.

In this specification, for the convenience of the explanation, the XYZ orthogonal coordinate system is used. In this coordinate system, two directions, which are parallel to the upper surface of the silicon substrate 11 and are orthogonal to each other, are an X direction and a Y direction, and the direction orthogonal to both the X direction and the Y direction, i.e., the up-to-down direction is a Z direction.

First, the memory array region Rm will be described.

As illustrated in FIGS. 1A to 1C and FIG. 2, in the memory array region Rm, a silicon oxide film 13 is formed on the silicon substrate 11, and a back gate electrode 14 of a conductive material, e.g., silicon doped with phosphorus (phosphorus-doped silicon) is provided on the silicon oxide film 13. In the upper layer portion of the back gate electrode 14, a plurality of cuboid recesses 15 extended in the Y direction are formed, and an insulation film of a low dielectric constant, e.g., silicon oxide film 16 is provided on the interior surfaces of the recesses 15. On the back gate electrode 14, a silicon oxide film 17 is provided.

On the silicon oxide film 17, a stacked body 20 is provided. In the stacked body 20, a plurality of gate electrodes 21 are provided. The gate electrodes 21 are formed of silicon doped with boron (boron-doped silicon), are in the shape of strips extended in the X direction, and are arranged in a matrix in the Y direction and the Z direction. The end of the stacked body is processed in a staircase pattern, and each of the gate electrodes 21 arranged in the Z direction configures each step.

Between the gate electrodes 21 adjacent to each other in the Y direction, an insulation plate 22 of, e.g., silicon oxide is provided. The insulation plate 22 has a shape of a plate extended in the X direction and the Z direction and pierces the stacked body 20. Between the gate electrodes 21 adjacent to each other in the Z direction, a block insulation film 35 (see FIG. 3), which will be described later, is buried. A silicon oxide film 26 is provided on the stacked body 20, and a plurality of control electrodes 27 formed of boron-doped silicon and extended in the X direction are provided on the silicon oxide film 26.

In the stacked body 20, the silicon oxide film 26 and the control electrodes 27, a plurality of through-holes 30 extended in the Z direction are formed. The through-holes 30 are arranged in a matrix in the X direction and the Y direction and pierce the control electrodes 27, the silicon oxide film 26 and the stacked body 20, and reach to the both ends of the recesses 15 in the Y direction. Thus, a pair of the through-holes adjacent to each other in the Y direction is communicated by the recess 15, forming a U-shaped hole 31. Each of the through-holes 30 is cylindrical, and each of the U-shaped holes 31 is substantially a U-shape. Two columns of the through holes 30 arranged in the X direction pierce the respective gate electrodes 21. The array of the recesses 15 in the Y direction and the array of the gate electrodes 21 have the same array cycle, and the phases thereof are shifted by a half cycle, and accordingly, each of the two columns of the through-holes 30 piercing the respective gate electrodes 21 belongs to those of the U-shaped holes 31 different from each other.

As illustrated in FIGS. 1A to 1C and FIG. 3, on the interior surface of the U-shaped hole 31, a block insulation film 35 is provided. The block insulation film 35 is a film that substantially prevents the flow of current even when a voltage in the range of the drive voltage of the device 1 and that is formed of a high dielectric constant material, e.g., a material whose dielectric constant is higher than the dielectric constant of a material forming a charge storage film 36, which will be described later. The block insulation film 35 is extended from the interior surfaces of the through-holes 30 onto the upper surfaces and the lower surfaces of the gate electrodes 21 and covers the upper surfaces and the lower surfaces of the gate electrodes 21.

In this embodiment, a portion of the block insulation film 35 provided on the upper surface of one of the gate electrodes 21 and a portion of the block insulation film 35 provided on the lower surface of another one of the gate electrodes 21 disposed one step higher than the former gate electrode 21 are in contact with each other, and a seam 34a is formed in the contact surface. Thus, a space of the gate electrodes 21 adjacent to each other in the Z direction is filed with the block insulation film 35. The block insulation film 35 that has extended from the interior surface of the through-hole 30 onto the upper surface and the lower surface of the gate electrodes 21 and has intruded in the space between the gate electrodes 21 and the block insulation film 35 that has extended from the interior surface of it adjacent through-hole 30 onto the upper surface and the lower surface of the gate electrodes 21 and has intruded in the space between the gate electrodes 21 are in contact with each other, and a seam 34b is formed in the contact surface. In the seams 34a and 34b, the microstructure of the block insulation film 35 is discontinuous. The seams 34a and 34b can be observed by chemical processing and the like to the sections containing seams 34a and 34b.

On the block insulation film 35, a charge storage film 36 is provided. The charge storage film 36 is a film capable of storing charges, e.g., a film containing a trap site of electrons, and e.g., a silicon nitride film. In this embodiment, the charge storage film 36 is disposed only in the U-shaped hole 31 and does not intrude into the space between the gate electrodes 21 adjacent to each other in the Z direction.

On the charge storage film 36, a tunnel insulation film 37 is provided. The tunnel insulation film 37 is a film, which is normally insulation properties but allows flowing tunnel current when a prescribed voltage in the range of the drive voltage of the device 1 is applied, and is formed of e.g., silicon oxide. The tunnel insulation film 37 is also disposed only in the U-shaped hole 31 and does not intrude into the space between the gate electrodes 21 adjacent to each other in the Z direction. Stacking the block insulation film 35, the charge storage film 36, and the tunnel insulation film 37 forms a memory film 33.

An impurity, e.g., polysilicon doped with phosphorus is buried in the U-shaped hole 31 to form a U-shaped pillar 38. The shape of the U-shaped pillar 38 is a U-shape reflecting the shape of the U-shaped hole 31. The U-shaped pillar 38 is in contact with the tunnel insulation film 37. A portion of the U-shaped pillar 38 disposed in the through-hole 30 becomes a silicon pillar 39, and a portion of the U-shaped pillar 38 disposed in the recess 15 becomes a connection member 40. The shape of the silicon pillar 39 is a cylinder reflecting the shape of the through-hole 30, and the shape of the connection member 40 is a cuboid reflecting the shape of the recess 15. Polysilicon may be filled completely in the U-shaped hole 31 to form a pillar-shaped U-shaped pillar 38 or may be filled and left a void along the core axis to form a U-shaped pillar 38 in a pipe shape.

As illustrated in FIGS. 1A to 1C and FIG. 2, a silicon nitride film 41 is provided on the side surface of the stacked body 20, which is processed in a staircase pattern, on the side surface of the silicon oxide film 26, and on the side surfaces of the control gates 27. The silicon nitride film 41 is formed in a staircase pattern reflecting the shape of the end of the stacked body 20. On the control electrodes 27 and on the silicon nitride film 41, an inter-layer insulation film 42 of, e.g., silicon oxide is provided and buries the stacked body 20.

A plug 43 and contacts 44 and 45 are buried in the inter-layer insulation film 42. The plug 43 is disposed in an area directly on the silicon pillar 39 and is connected to the silicon pillar 39. The contact 44 is disposed in an area directly on one end of the control electrodes 27 in the X direction and is connected to the control electrodes 27. The contact 45 is disposed in an area directly on one end of the gate electrodes 21 in the X direction and is connected to the gate electrodes 21.

A source line 47, a plug 48, and interconnections 49 and 50 are buried in a portion of the interlayer insulation film 42 upper than the plug 43 and the contacts 44 and 45. The source line 47 is extended in the X direction and is connected via the plug 43 to one of a pair of the silicon pillars 39 associated with the U-shaped pillar 38. The plug 48 is connected via the plug 43 to the other of the pair of the silicon pillars 39 associated with the U-shaped pillar 38. The interconnections 49 and 50 are extended in the Y direction and are connected to the contacts 44 and 45, respectively.

On the interlayer insulation film 42, a bit line 51 extended in the Y direction is provided and is connected to the plug 48. On the interlayer insulation film 42, an interconnection 52 is provided and is connected to the interconnection 49 via a plug 53. On the interlayer insulation film 42, a silicon nitride film 54 and an interlayer insulation film 55 are provided to bury the bit line 52 and the interconnection 52. Prescribed interconnections and the like are buried therein.

On the other hand, as illustrated in FIG. 1C, in the peripheral circuit region Rc, a transistor 61 and the like are formed in an upper layer portion of the silicon substrate 11, and the interlayer insulation film 42, the silicon nitride film 54, and the interlayer insulation film 55 are provided on the silicon substrate 11. Prescribed interconnections and the like are buried therein. The axis of the abscissa is the X direction in FIG. 1C, but may be the Y direction.

In the device 1, memory cell transistors are formed at the intersections between the gate electrodes 21 and the silicon pillars 39, and selective transistors are formed at the intersections between the control electrodes 27 and the silicon pillars 39. Thus, between the bit line 51 and the source line 47, memory strings having a plurality of memory cell transistors serially connected and selective transistors connected to both sides of the memory cell transistors are configured.

Next, the method for manufacturing the nonvolatile semiconductor memory device according to this embodiment will be described.

FIGS. 4A to 13B are views illustrating the method for manufacturing the nonvolatile semiconductor memory device according to this embodiment. The drawings of the respective views indicated by A are plan views of the non-volatile semiconductor memory device in the processes of its manufacturing method, and the drawings indicated by B are sectional views along the A-A' line in the drawings indicated by A.

FIGS. 4A to 13B illustrate the memory array region Rm of the device 1.

First, as illustrated in FIGS. 1A to 1C, the silicon substrate 11 is prepared. Then, the STIs 12 are selectively formed in an upper layer portion of the silicon substrate 11. Transistors 61 are formed in the peripheral circuit region Rc. In the memory array region Rm, the silicon oxide film 13 is formed on the upper surface of the silicon substrate 11.

Figure 4A:
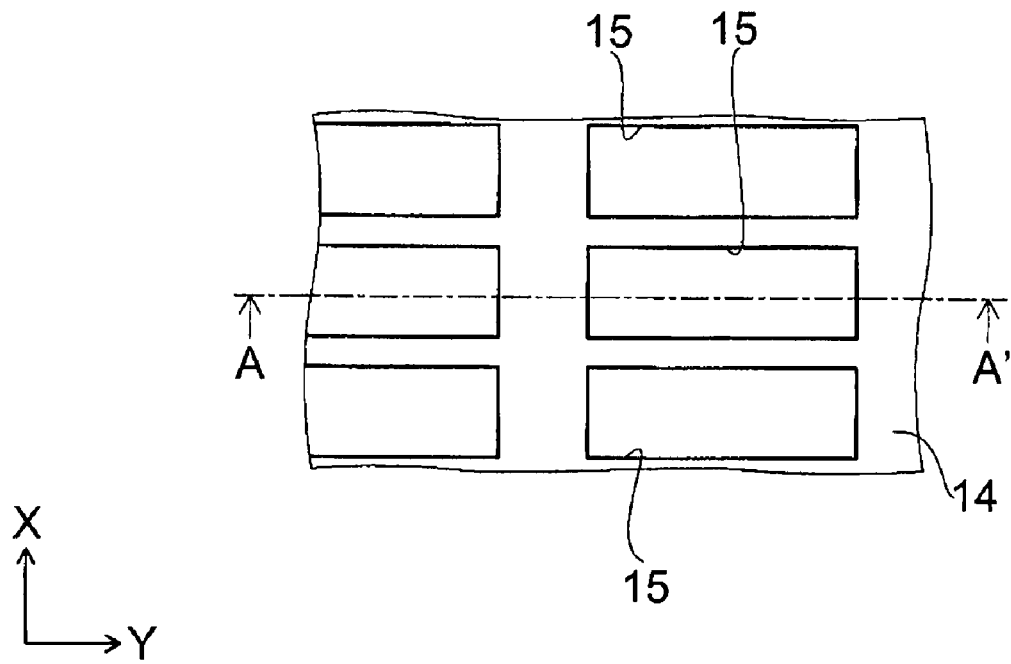
FIG. 4A is a process plan view illustrating a method for manufacturing the nonvolatile semiconductor memory device according to the first embodiment.
Figure 4B:
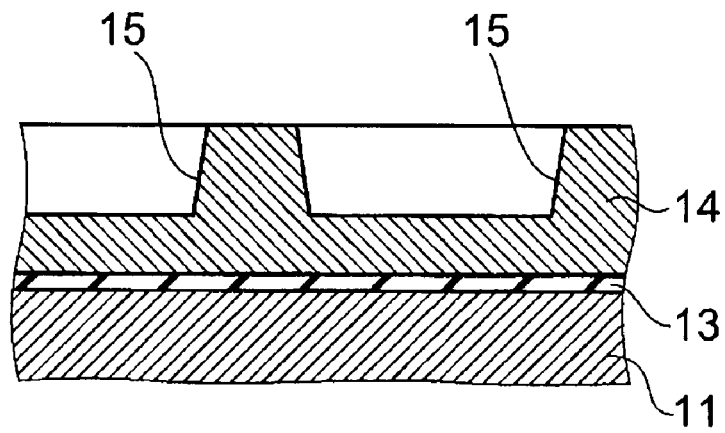
FIG. 4B is a process cross-sectional view along A-A' of FIG. 4A.

Then, as illustrated in FIGS. 4A and 4B, a film of polysilicon doped with phosphorus is formed in the memory array region Rm, and patterned to form the back gate electrode 14. Then, by photolithography, the cuboid recesses 15 having the longitudinal direction in the Y direction are formed on the upper surface of the back gate electrode 14. The recesses 15 are formed in a plurality of regions to be arranged in a matrix along the X direction and the Y direction.

Figure 5A:
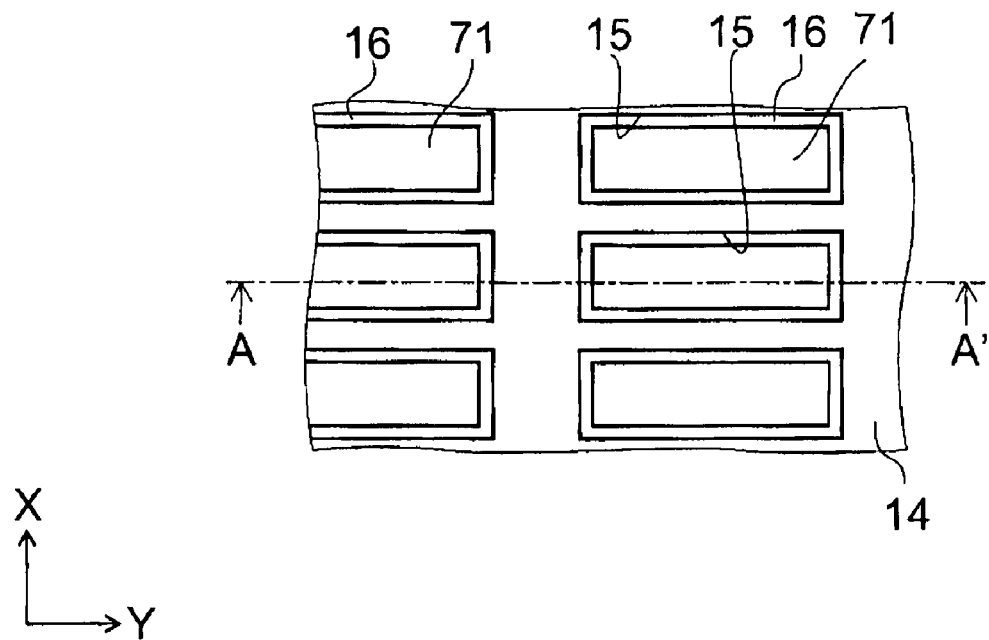
FIG. 5A is a process plan view illustrating the method for manufacturing the nonvolatile semiconductor memory device according to the first embodiment.
Figure 5B:
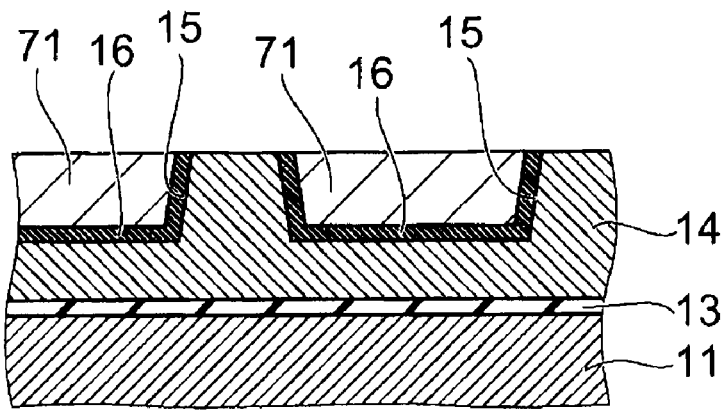
FIG. 5B is a process cross-sectional view along A-A' of FIG. 5A.

Next, as illustrated in FIGS. 5A and 5B, the silicon oxide film 16 is formed on the interior surfaces of the recesses 15. Next, silicon not doped with an impurity (non-doped silicon) is deposited on the entire surface, and the entire surface is etched. Thus, the non-doped silicon is removed from the upper surface of the back gate electrode 14 while being left in the recesses 15. As a result, regions of the upper surface of the back gate electrode 14 between the recesses 15 are exposed while the non-doped silicon material 71 is buried in the recesses 15.

Figure 6A:
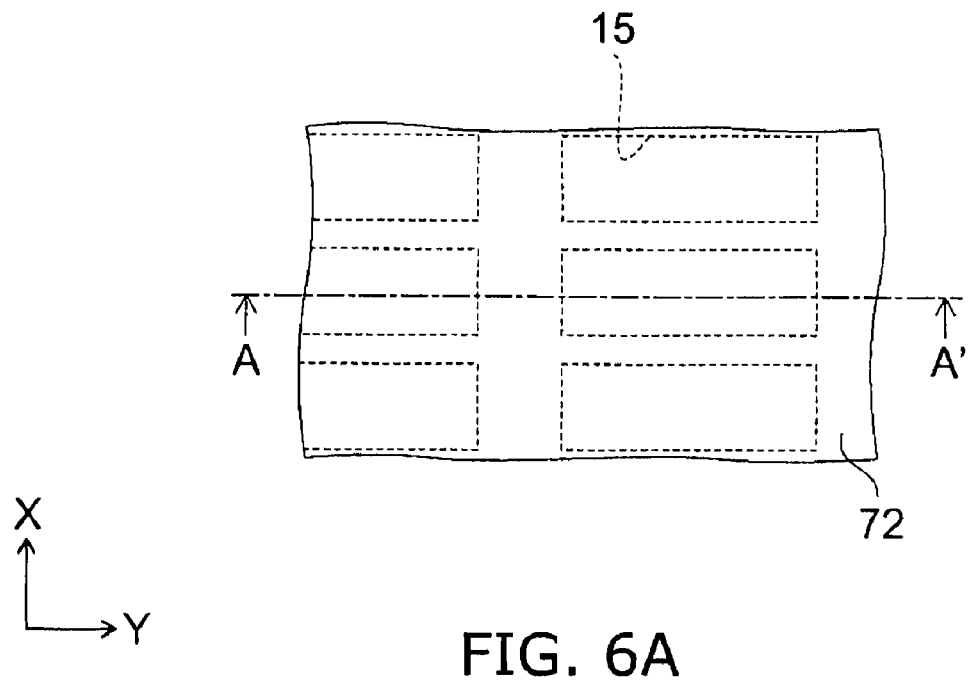
FIG. 6A is a process plan view illustrating the method for manufacturing the nonvolatile semiconductor memory device according to the first embodiment.
Figure 6B:
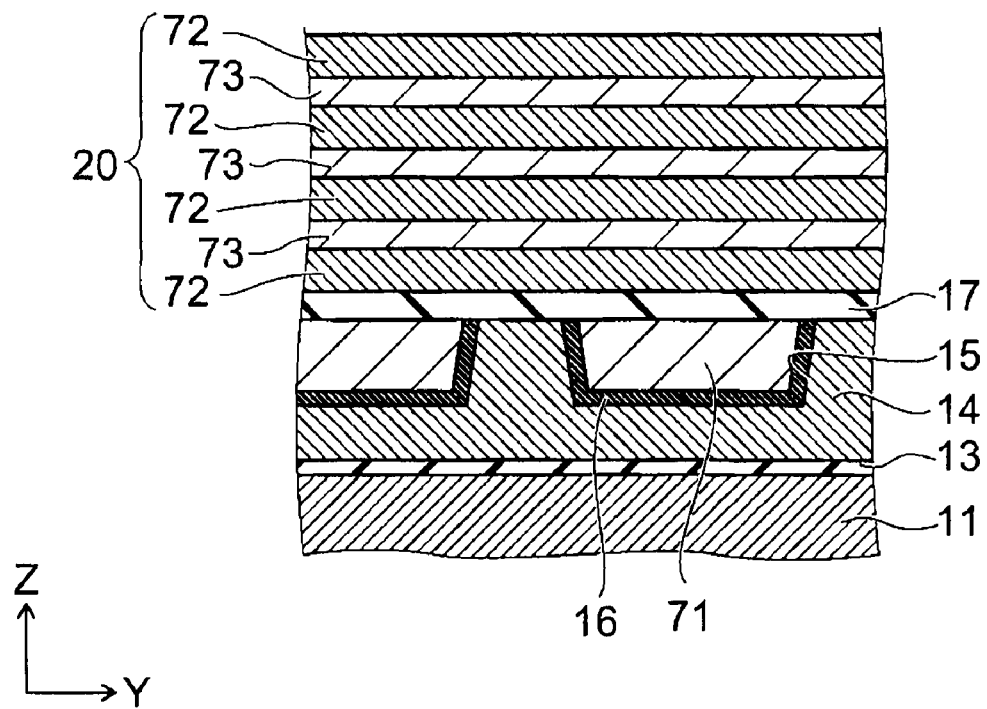
FIG. 6B is a process cross-sectional view along A-A' of FIG. 6A.

Next, as illustrated in FIGS. 6A and 6B, the silicon oxide film 17 is formed on the entire surface of the back gate electrode 14. The silicon oxide film 17 is formed in a film thickness, which ensures the voltage resistance between the back gate electrode 14 and the lowermost one of the gate electrodes 21 to be formed on the silicon oxide film 17 in the later processes. Then, a boron doped polysilicon layer 72 doped with boron and a non-doped polysilicon layer 73 without an impurity are alternately stacked. Thus, the stacked body 20 of the boron-doped polysilicon layer 72 and the non-doped polysilicon layer alternately stacked is formed. In this embodiment, the number of the stacked boron-doped polysilicon layers 72 and the number of the stacked non-doped polysilicon layers 73 is four each; however, the number of the stacked layers is not limited to four layers.

Figure 7A:
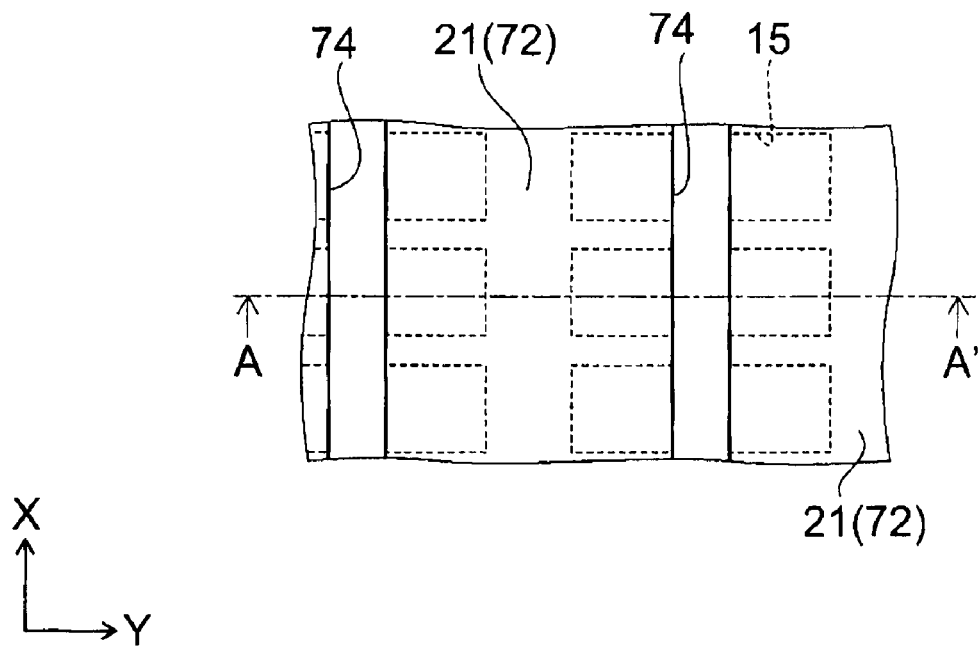
FIG. 7A is a process plan view illustrating the method for manufacturing the nonvolatile semiconductor memory device according to the first embodiment.
Figure 7B:
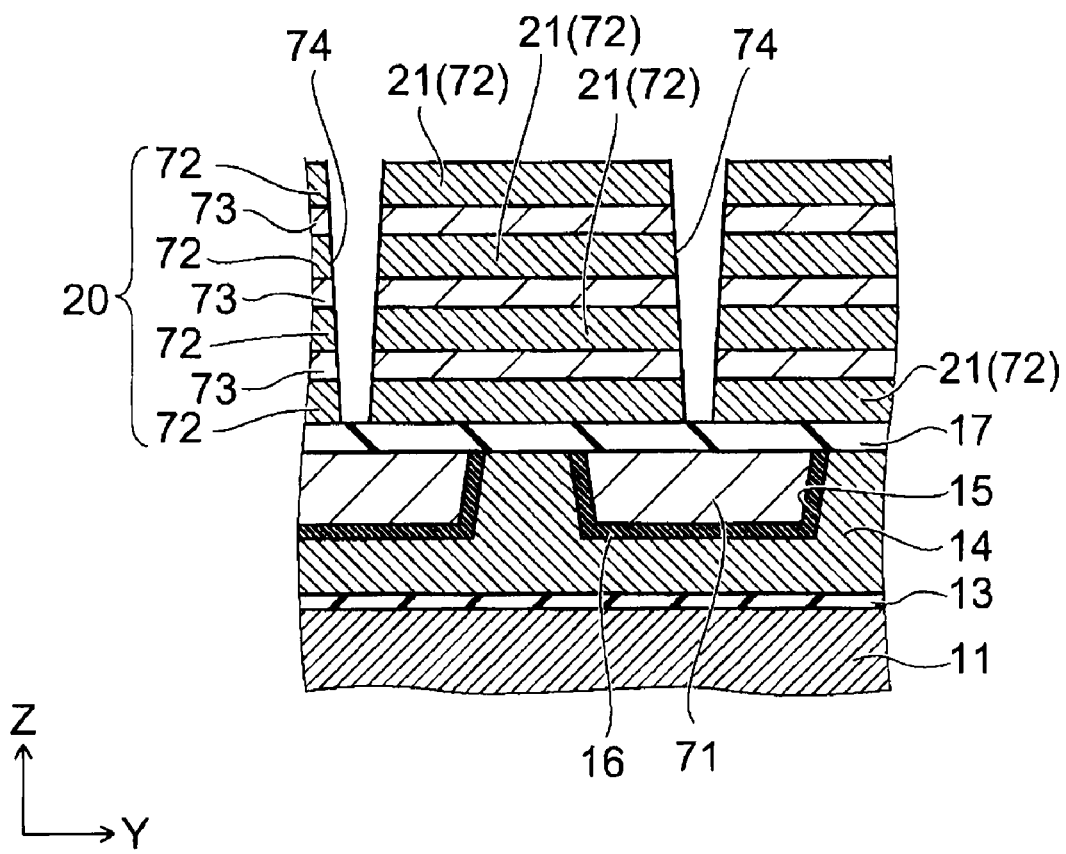
FIG. 7B is a process cross-sectional view along A-A' of FIG. 7A.

Next, as illustrated in FIGS. 7A and 7B, by photolithography and etching, in the stacked body 20, a plurality of slits 74 extended in the X direction from the upper surface side thereof are formed. Each of the slits 74 is formed to pierce the stacked body 20 in the Z direction and pass through the area immediately above the central portion of the recess 15 in the Y direction. Thus, the boron-doped polysilicon layer 72 is divided into a plurality of the gate electrodes 21.

Figure 8A:
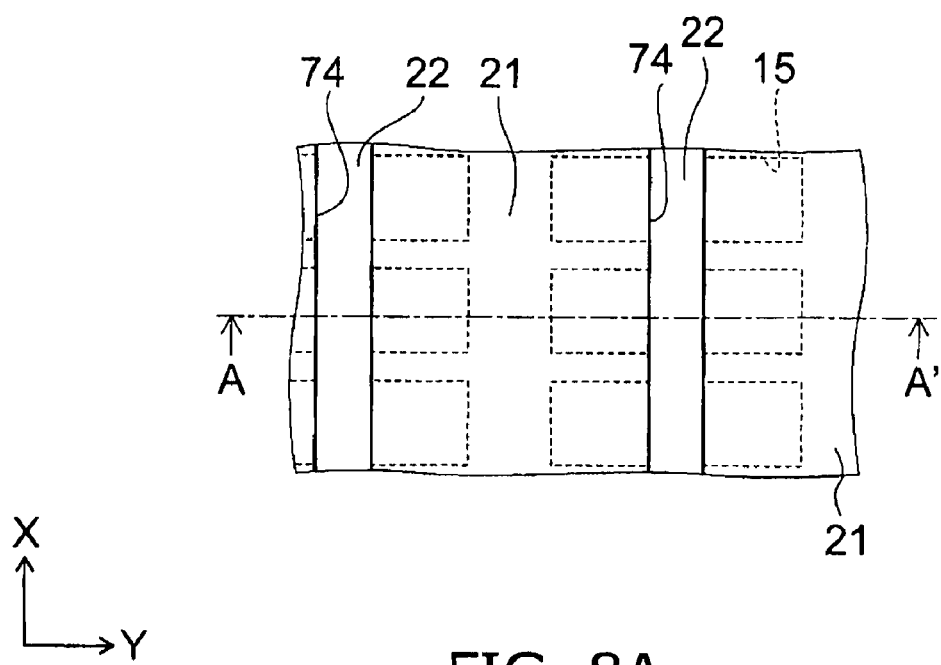
FIG. 8A is a process plan view illustrating the method for manufacturing the nonvolatile semiconductor memory device according to the first embodiment.
Figure 8B:
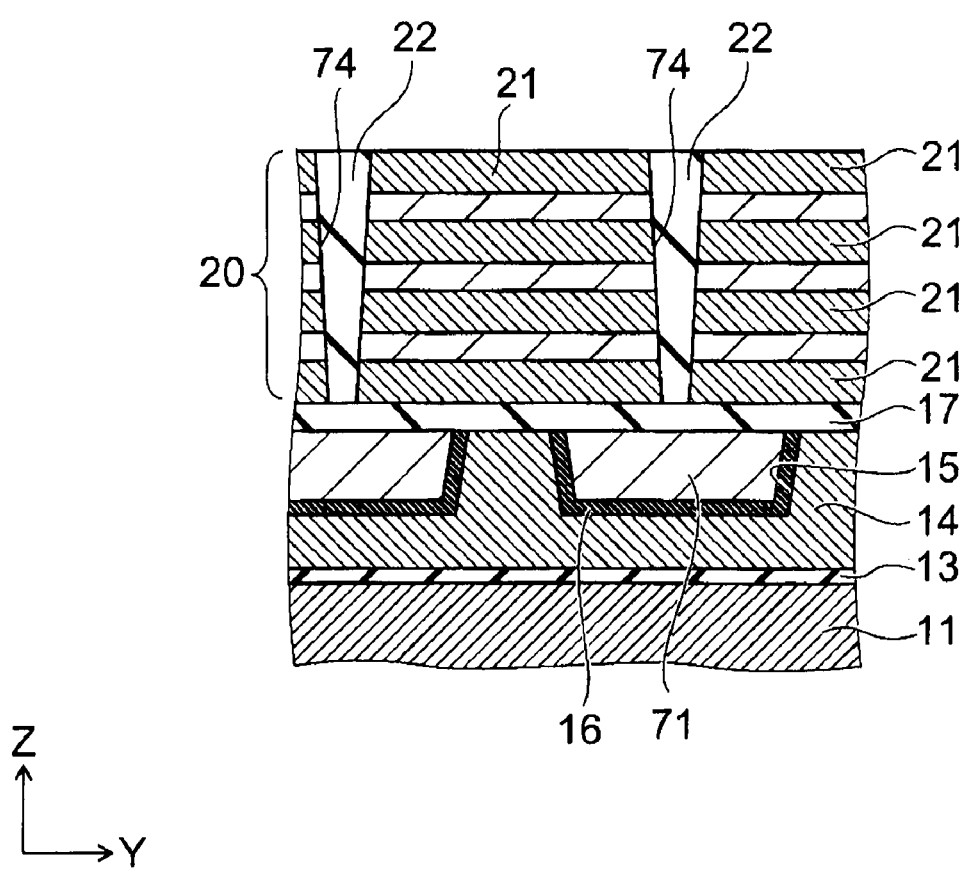
FIG. 8B is a process cross-sectional view along A-A' of FIG. 8A.

Then, as illustrated in FIGS. 8A and 8B, an insulation material, such as silicon oxide, is deposited on the entire surface. At this time, this insulation material is buried in the slits 74. Then, the entire surface is etched to remove the insulation material on the upper surface of the stacked body 20 while remaining let in the slits 74. Thus, the insulation plates 22 in a plate shape extended in the X direction and in the Z direction is formed in the slits 74. On the upper surface of the stacked body 20, the uppermost one of the gate electrodes 21 is exposed.

Figure 9A:
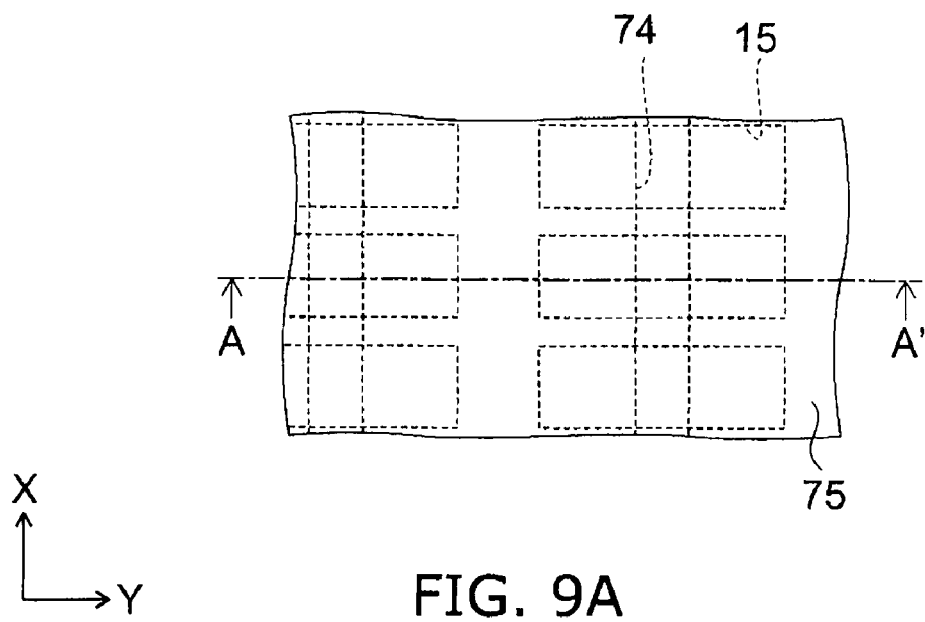
FIG. 9A is a process plan view illustrating the method for manufacturing the nonvolatile semiconductor memory device according to the first embodiment.
Figure 9B:
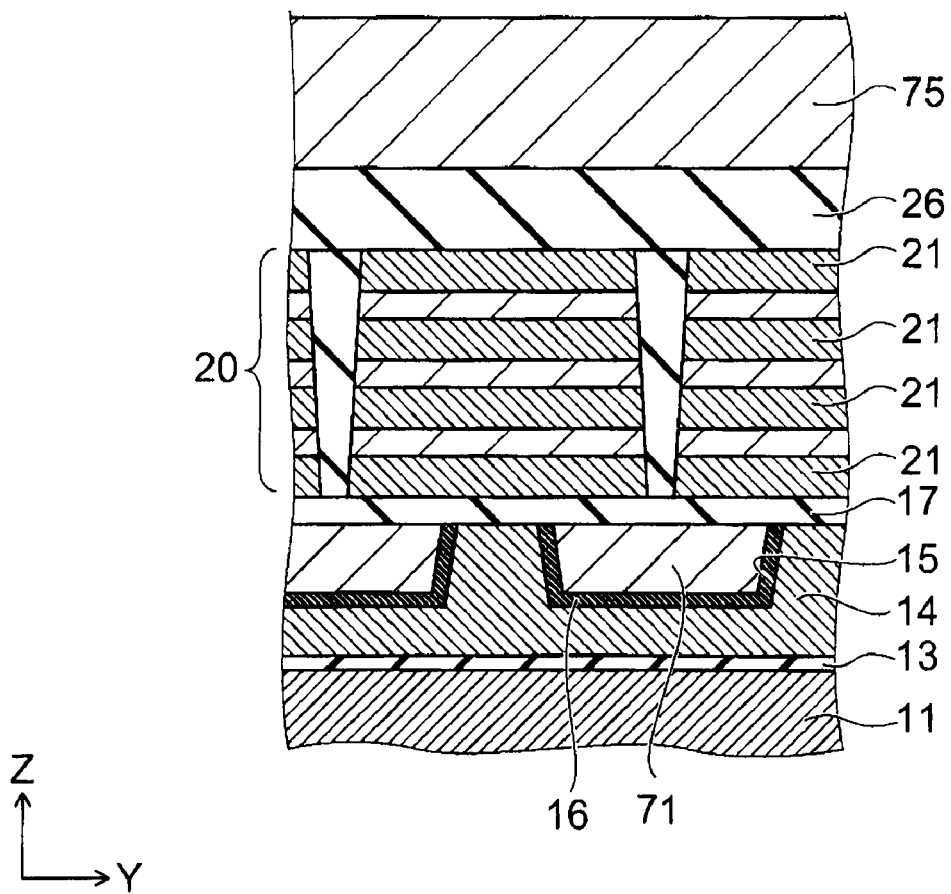
FIG. 9B is a process cross-sectional view along A-A' of FIG. 9A.

Then, as illustrated in FIGS. 9A and 9B, the silicon oxide film 26 is formed on the stacked body 20, and the boron-doped polysilicon film 75 is formed thereon. At this time, the silicon oxide film 26 is formed in a film thickness, which sufficiently ensures the voltage resistance between the uppermost one of the gate electrodes 21 and the boron-doped silicon film 75.

Figure 10A:
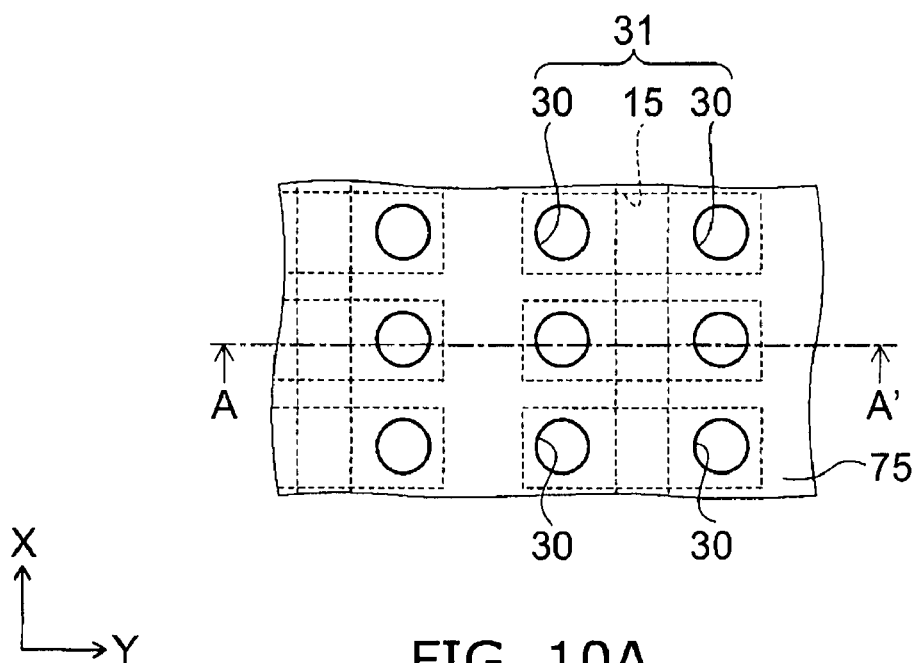
FIG. 10A is a process plan view illustrating the method for manufacturing the nonvolatile semiconductor memory device according to the first embodiment.
Figure 10B:
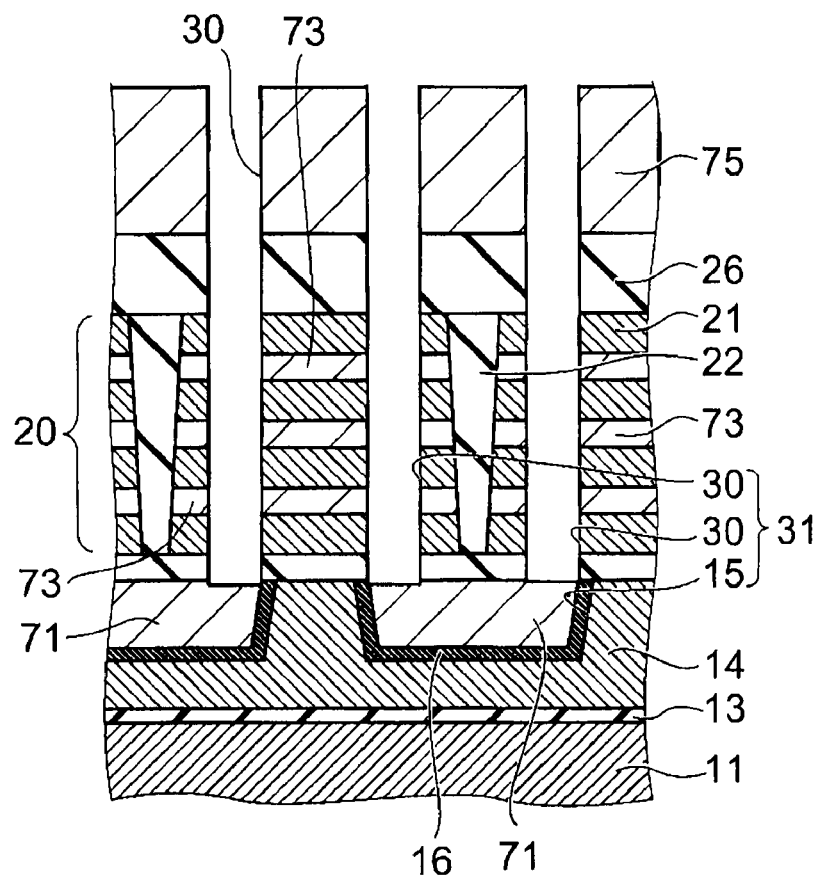
FIG. 10B is a process cross-sectional view along A-A' of FIG. 10A.

Then, as illustrated in FIGS. 10A and 10B, by photolithography and etching, a plurality of the through-holes 30 extended in the Z direction are formed to pierce the silicon oxide film 26 and the stacked body 20. The through-holes 30 are formed in a circle as viewed in the Z direction. The through-holes are arranged in a matrix in the X direction and the Y direction, and pairs of the through-holes adjacent to each other in the Y direction reach to the both ends of the recesses 15 in the Y direction. Thus, a pair of the through-holes 30 is communicated in the both ends of one recess 15, and the U-shaped hole 31 is formed.

Figure 11A:
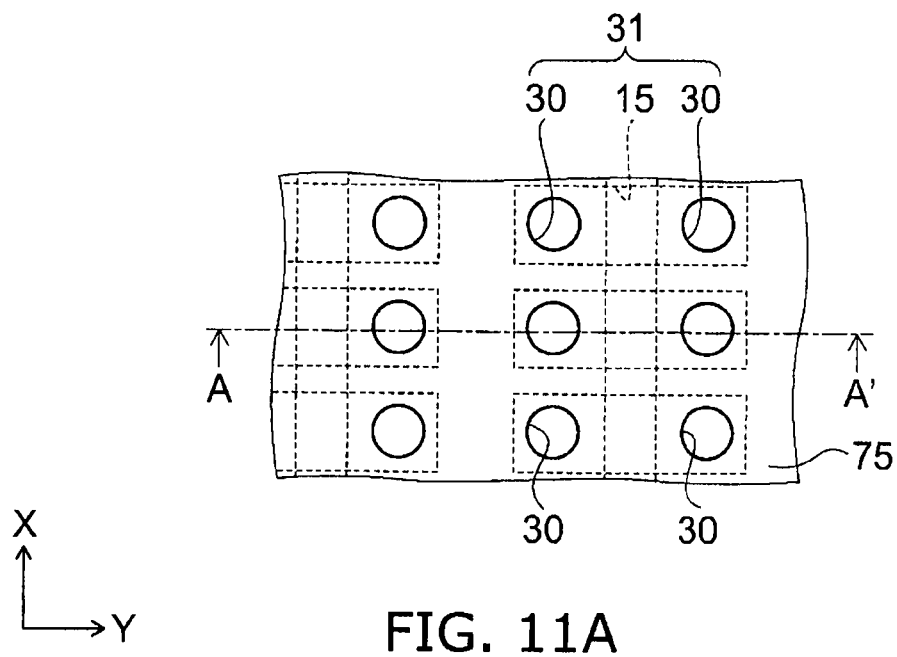
FIG. 11A is a process plan view illustrating the method for manufacturing the nonvolatile semiconductor memory device according to the first embodiment.
Figure 11B:
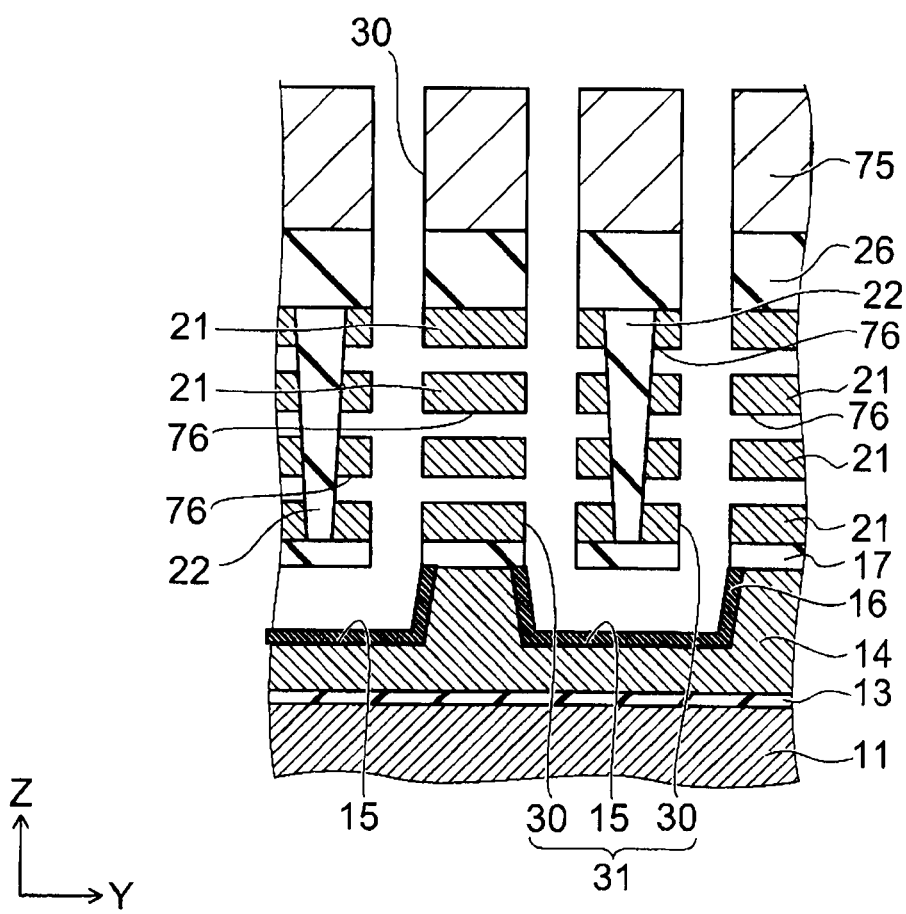
FIG. 11B is a process cross-sectional view along A-A' of FIG. 11A.

Next, as illustrated in FIGS. 11A and 11B, wet etching is performed via the through-hole 30. This wet etching is performed with, e.g., an alkaline etchant. Thus, the non-doped polysilicon layer 73 in the stacked body 20 (see FIG. 10B) and the non-doped silicon material 71 (see FIG. 10B) are removed. At this time, the etchant is suitably selected, whereby a high etching selectivity between the boron-doped silicon and the non-doped silicon can be realized, and the gate electrodes 21 of the boron-doped polysilicon layer 72 and the boron-doped silicon film 75 are not substantially etched and remain. As a result, the spaces 76 between the gate electrodes 21 in the Z direction are formed. At this time, the gate electrodes 21 are supported by the plate-shaped insulation plates 22. In FIG. 11B, a portion of the gate electrodes 21 located between the U-shaped holes 31 is illustrated as if floating in the air but actually is connected to a portion of the gate electrodes 21 joined to the insulation plate 22 at a position shifted in the X direction (the direction in and out of the drawing in FIG. 11B).

Figure 12A:
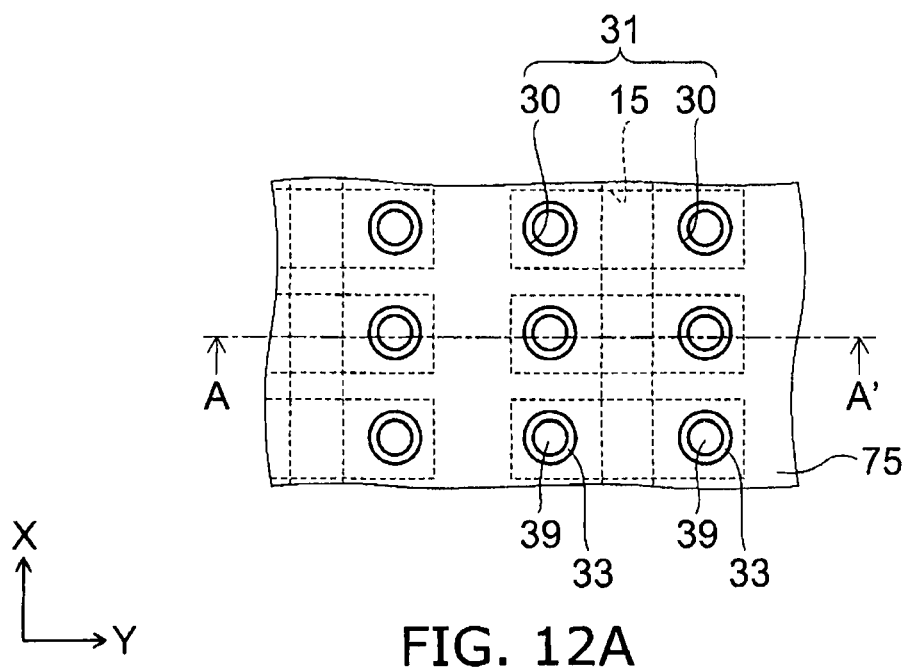
FIG. 12A is a process plan view illustrating the method for manufacturing the nonvolatile semiconductor memory device according to the first embodiment.
Figure 12B:
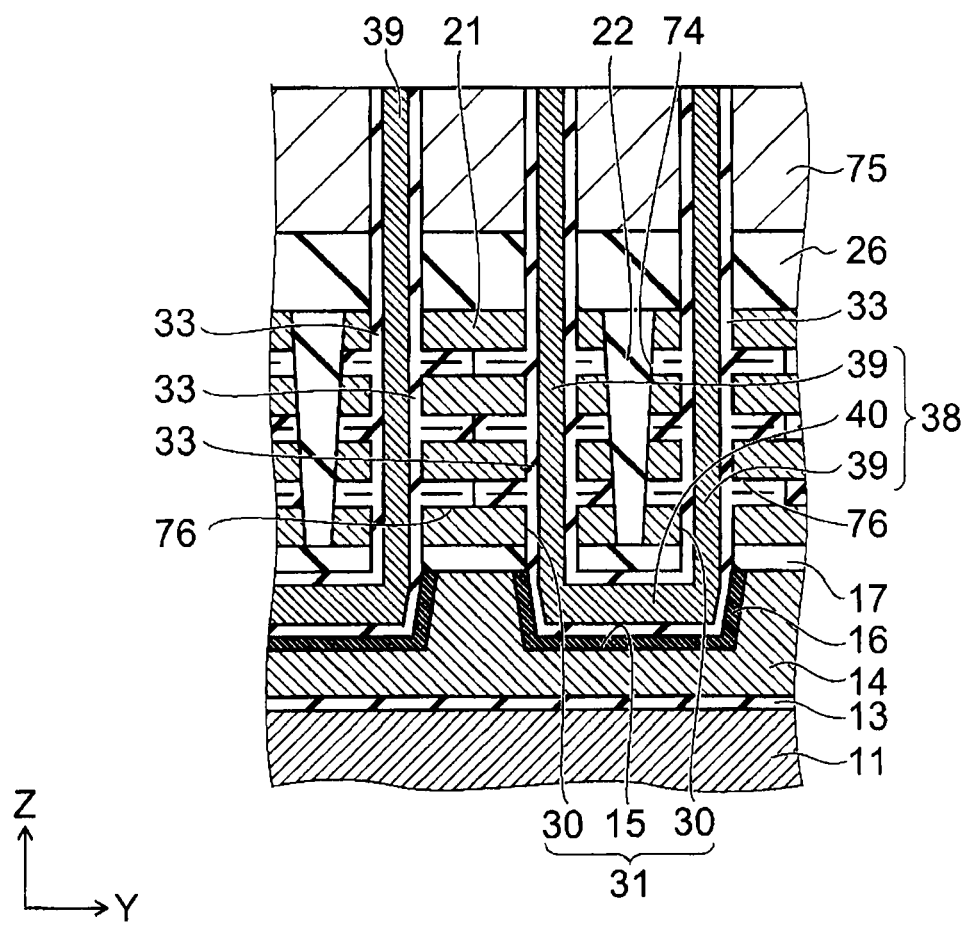
FIG. 12B is a process cross-sectional view along A-A' of FIG. 12A.

Then, as illustrated in FIGS. 12A and 12B and FIG. 3, silicon oxide is deposited by, e.g., ALD (Atomic Layer Deposition). This silicon oxide intrudes into the U-shaped holes 31 and deposits the block insulation film 35 on the interior surfaces of the U-shaped holes 31. The silicon oxide intrudes also into the spaces 76 via the through-holes 30 and deposits the block insulation film 35 also on the interior surfaces of the spaces 76, i.e., on the upper surfaces and the lower surfaces of the gate electrodes 21 and on the surfaces of the insulation plates 22 exposed in the spaces 76. In this embodiment, the deposition amount of the block insulation film 35 is a half or more of a distance between the gate electrodes 21 in the Z direction. Thus, as illustrated in FIG. 3, the space 76 is completely buried by the block insulation film 35, and a portion of the block insulation film 35 formed on the upper surface of one of the gate electrodes 21 and a portion thereof form on the lower surface of another one of the gate electrodes 21 disposed one step higher than the former gate electrode 21 are in contact with each other, and the seam 34a is formed in the contact surface between the both portions. The block insulation film 35, which has intruded in the same space 76 via the through-holes adjacent to each other comes into contact with each other in the space 76, and the seam 34b is formed in the contact surface.

Next, silicon nitride is deposited. Thus, the charge storage film 36 is formed on the block insulation film 35. At this time, the charge storage film 36 does not intrude into the spaces 76, which have been filled with the block insulation film 35. The charge storage film 36 is formed only in the U-shaped holes 31. Next, a silicon oxide film is deposited. Thus, the tunnel insulation film 37 is formed on the charge storage film 36. The tunnel insulation film 37 does not intrude into the spaces 76 either and is formed only in the U-shaped holes 31. The block insulation film 35, the charge storage film 36 and the tunnel insulation film 37 form the memory film 33.

Next, polysilicon containing an impurity, e.g., phosphorus is buried in the U-shaped pillars 31. Thus, the U-shaped pillars 38 are formed in the U-shaped pillars 31. A portion of the U-shaped pillar 38 disposed in the through-hole 30 becomes the silicon pillar 39 extended in the Z direction, and a portion of the U-shaped pillar disposed in the recess 15 becomes the connection member 40 extended in the Y direction. Then, the entire surface is etched to remove the polysilicon deposited on the boron-doped polysilicon film 75, the tunnel insulation film 37, the charge storage film 36 and the block insulation film 35, and the boron-doped polysilicon film 75 is exposed.

Figure 13A:
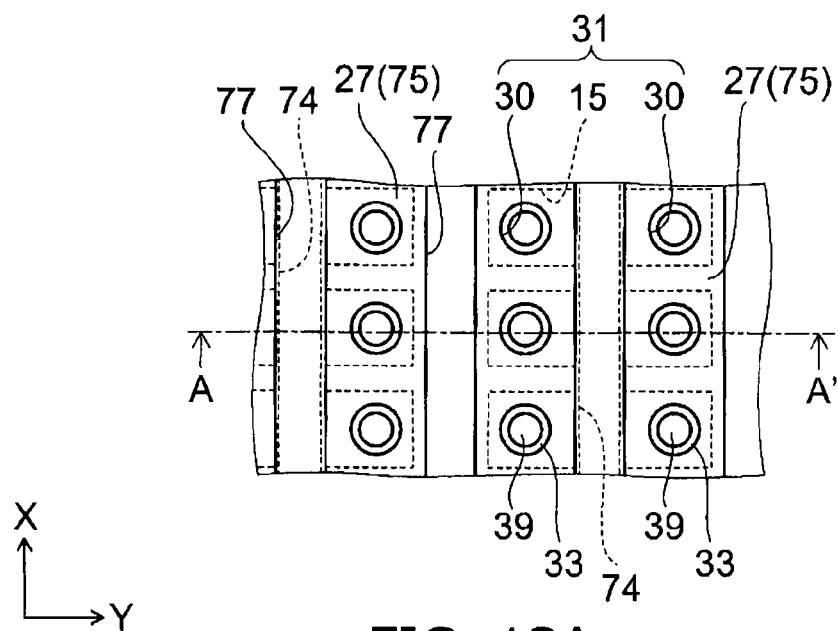
FIG. 13A is a process plan view illustrating the method for manufacturing the nonvolatile semiconductor memory device according to the first embodiment.
Figure 13B:
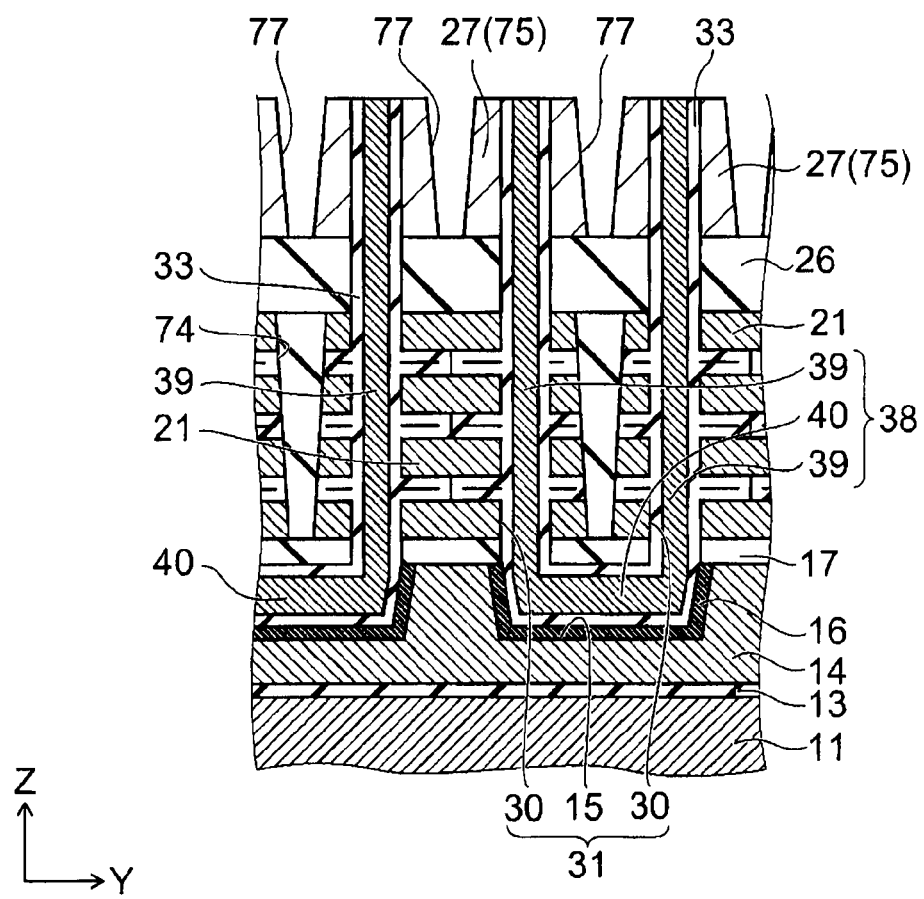
FIG. 13B is a process cross-sectional view along A-A' of FIG. 13A.

Next, as illustrated in FIGS. 13A and 13B, the boron-doped polysilicon film 75 is subjected to photolithography and etching to form a plurality of the slits 77 extended in the X direction from the upper surface side. At this time, the slits 77 are formed between columns containing a plurality of the through-holes 30 arranged in the X direction, and each of the slits 77 pierces the boron-doped polysilicon film 75 to reach to the silicon oxide film 26. Thus, the boron-doped polysilicon film 75 is divided with respect to each column of a plurality of the through-holes 30 arranged in the X direction and becomes a plurality of the control electrodes 27 extended in the X direction. Then, silicon oxide is buried in the slits 77.

Then, as illustrated in FIGS. 1A to 1C and FIG. 2, a resist mask (not illustrated) is formed on the stacked body 20, slimming the resist film and etching with this resist mask as a mask are alternately performed to process the ends of the stacked body 20 and the boron-doped polysilicon film 75 in a staircase pattern. Next, the silicon nitride film 41 is formed on the side surfaces of the stacked body 20 and the boron-doped polysilicon film 75 to bury the whole by the interlayer insulation film 42. Then, the plug 43 is formed in the interlayer insulation film 42 while the contacts 44 and 45 are formed using the silicon nitride film 41 as a stopper. Then, the source line 47, the interconnections 49 and 50 are formed on the interlayer insulation film 42, and the interlayer insulation film 42 is further deposited to form the plug 48. Then, the bit line 52 and the interconnection 52 are formed on the interlayer insulation film 42, and the silicon nitride film 54 is formed thereon, and the interlayer insulation film 55 is formed thereon. Thus, the nonvolatile semiconductor memory device 1 according to this embodiment is manufactured.

Next, the operation effects of this embodiment will be described.

In this embodiment, the block insulation film 35 is extended from the interior surfaces of the through-holes 30 onto the upper surfaces and the lower surfaces of the gate electrodes 21, and the gate electrodes 21 adjacent to each other in the Z direction are insulated from each other by the block insulation film 35. The block insulation film 35 is originally formed as a part of a MONOS film and is formed under conditions, which provide good dielectric strength. Therefore, in the device 1, the insulation between the gate electrodes 21 in the Z direction is high.

In this embodiment, the seams 34a and 34b are formed between the gate electrodes 21 adjacent to each other in the Z direction. The capacitance between the gate electrodes 21 adjacent to each other in the Z direction decreases by forming the seams 34a and 34b.

Furthermore, in this embodiment, when the through-holes 30 are formed in the stacked body 20 in the process illustrated in FIGS. 10A and 10B, only the boron-doped polysilicon layer 72 and the non-doped polysilicon layer 73 are present in the stacked body 20. No film such as silicon oxide film and the like that makes etching difficult is present; therefore, the through-holes 30 can be formed in a cylindrical shape having the interior surfaces made substantially vertical, i.e., the taper angle made substantially 90°. Accordingly, the lower parts of the through-holes 30 do not become thinner in comparison with the upper parts. This allows the memory cell transistors formed in the upper part of the stacked body 20 and the memory cell transistors formed in the lower part of the stacked body 20 to have a substantially equal diameter of the through-holes 30, and the variations in the characteristics of the memory cell transistors due to the variations in the diameter of the through-holes 30 can be suppressed, and the characteristics of the memory cell transistors can be made uniform.

The through-holes 30 have the interior surfaces tilted in the silicon oxide film 26, which make the diameter smaller downward. Accordingly, the diameter of a portion of the through-holes 30 formed in the gate electrodes 20 is smaller than the diameter of a portion of the through-hoes 30 formed in the control gates 27. However, the memory cell transistors formed at the intersections between the gate electrodes 21 and the silicon pillars 39 and the selective transistors formed at the intersections between the control electrodes 27 and the silicon pillars 39 may have different characteristics without problem because their functions in the device 1 are different.

Furthermore, in this embodiment, in the process illustrated in FIGS. 12A and 12B, the deposition amount of the block insulation film 35 is set at a half or more of a distance between the gate electrodes 21 in the Z direction. This allows all the inside part of the space 76 to be filled with the block insulation film 35. As a result, the charge storage film 36 to be formed in the later process does not intrude into the spaces 76, and accordingly, charges are not stored in a portion of the charge storage film 36, which intrudes into the spaces 76. The characteristics of the memory cell transistors are not changed due to the stored charges.

Furthermore, in this embodiment, polysilicon forming the gate electrodes 21 and the control electrodes 27 contains boron. This can make a high selectivity with respect to non-doped silicon. However, the impurity contained in the polysilicon forming the gate electrodes 21 and the control gates 27 is not limited to boron and can be any, e.g., phosphorus as far as the impurity can give conductivity to silicon and can ensure selectivity with respective to non-doped silicon.

Next, a comparative example of this embodiment will be described.

FIGS. 14A to 27B are views illustrating the method for manufacturing a nonvolatile semiconductor memory device according to this comparative example. Those of the respective drawings indicated by A are plan views of the nonvolatile semiconductor memory device according to this comparative example in the processes of its manufacturing method, and those of the respective drawings indicated by B are the sectional views along the A-A' line in the drawings indicated by A.

FIGS. 14A to 27B illustrate the memory array region Rm.

First, similar to the first embodiment described above, as illustrated in FIGS. 1A to 1C, STIs 12 are formed in an upper layer portion of a silicon substrate 11, transistors 61 are formed in the peripheral circuit region Rc, and a silicon oxide film 13 is formed on the upper surface of the silicon substrate 11 in the memory array region Rm.

Figure 14A:
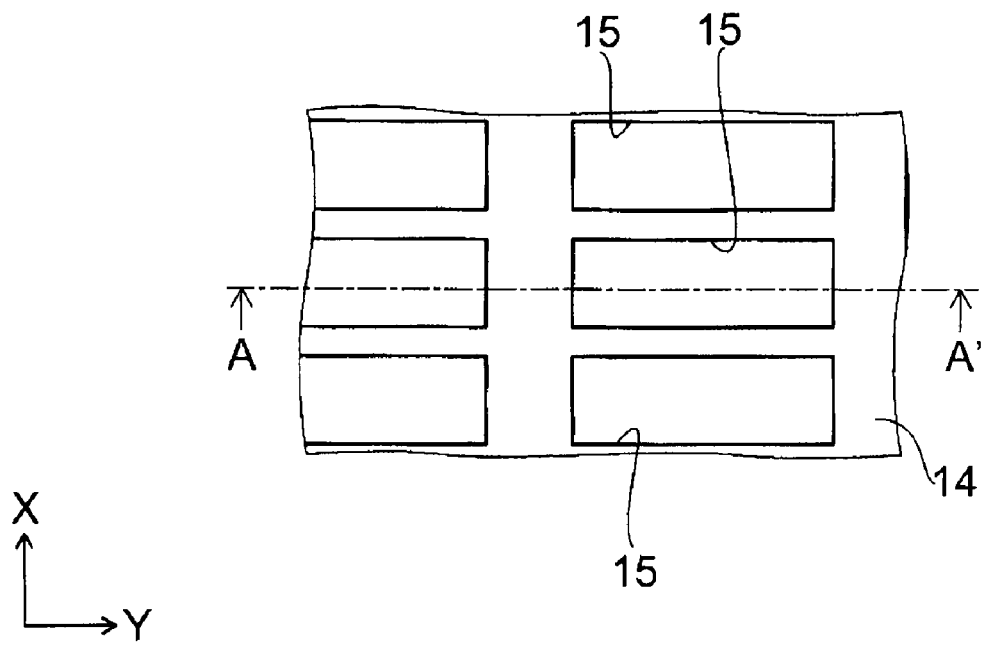
FIG. 14A is a process plan view illustrating a method for manufacturing a nonvolatile semiconductor memory device according to a comparative example.
Figure 14B:
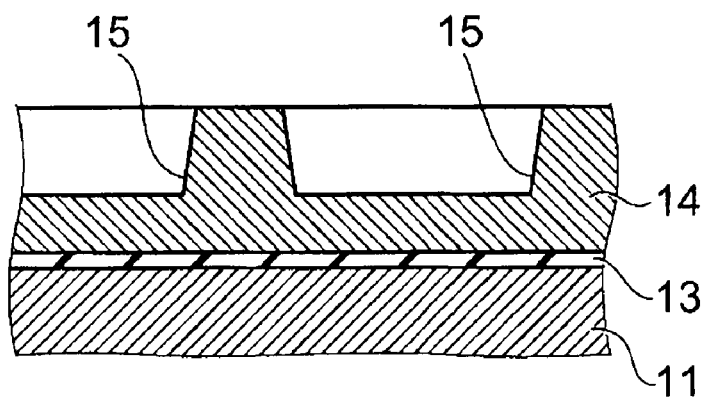
FIG. 14B is a process cross-sectional view along A-A' of FIG. 14A.

Next, as illustrated in FIGS. 14A and 14B, in the memory cell array region Rm, a back gate electrode 14 is formed on the silicon oxide film 13, and cuboid recesses 15 having the longitudinal direction in the Y direction are formed on the upper surface thereof.

Figure 15A:
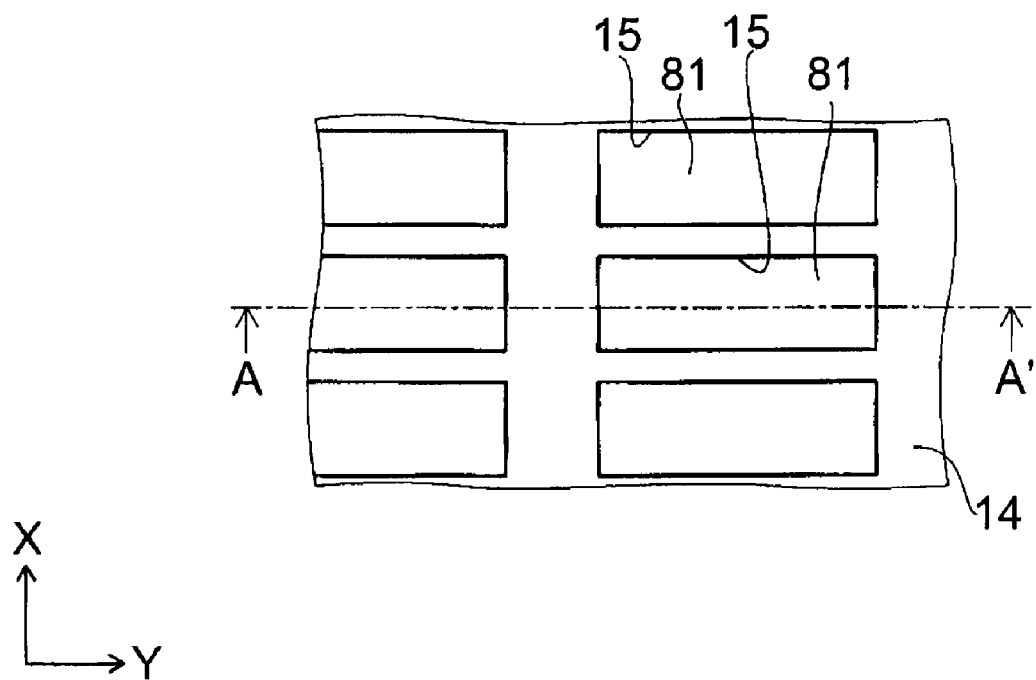
FIG. 15A is a process plan view illustrating the method for manufacturing the nonvolatile semiconductor memory device according to the comparative example.
Figure 15B:
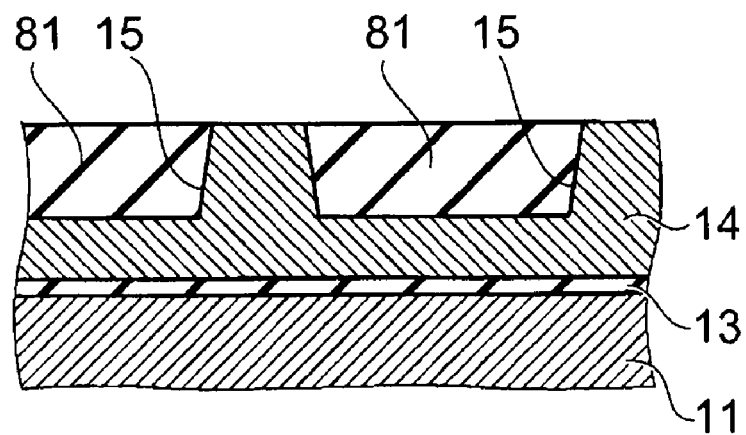
FIG. 15B is a process cross-sectional view along A-A' of FIG. 15A.

Next, as illustrated in FIGS. 15A and 15B, silicon nitride is deposited on the entire surface, and then the entire surface is etched. Thus, the silicon nitride is removed from the upper surface of the back gate electrode 14 to expose the regions of the upper surface of the back gate electrode between the recesses 15 while a sacrifice material 81 of silicon nitride is buried in the recesses 15.

Figure 16A:
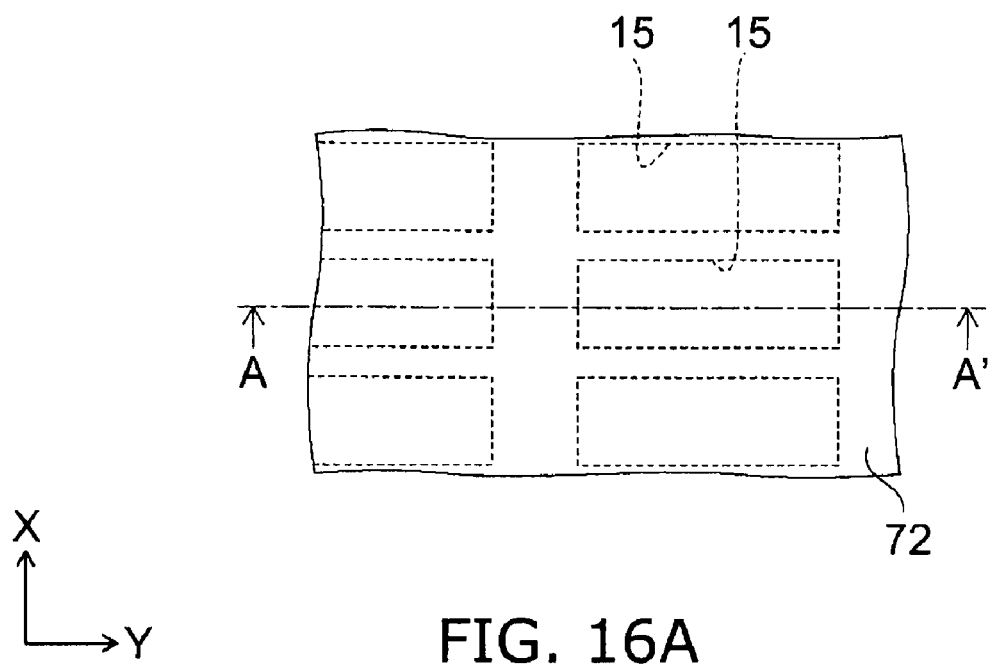
FIG. 16A is a process plan view illustrating the method for manufacturing the nonvolatile semiconductor memory device according to the comparative example.
Figure 16B:
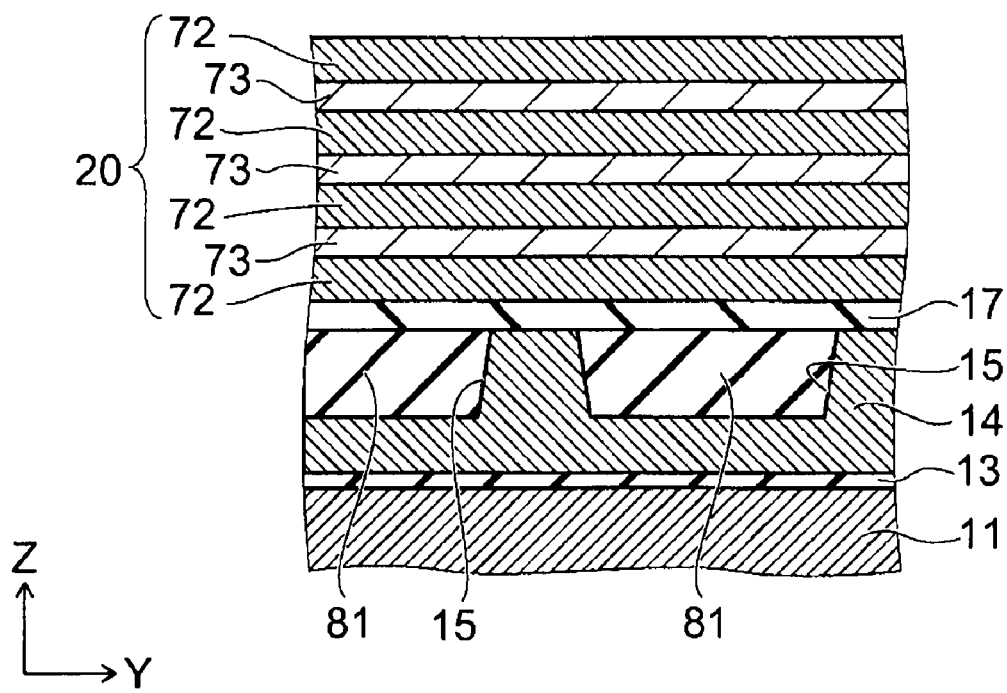
FIG. 16B is a process cross-sectional view along A-A' of FIG. 16A.

Next, as illustrated in FIGS. 16A and 16B, a silicon oxide film 17 is formed on the back gate electrode 14 and the sacrifice material 81. Next, a boron-doped polysilicon layer 72 and a non-doped polysilicon layer 73 are alternately stacked to form a stacked body 20.

Figure 17A:
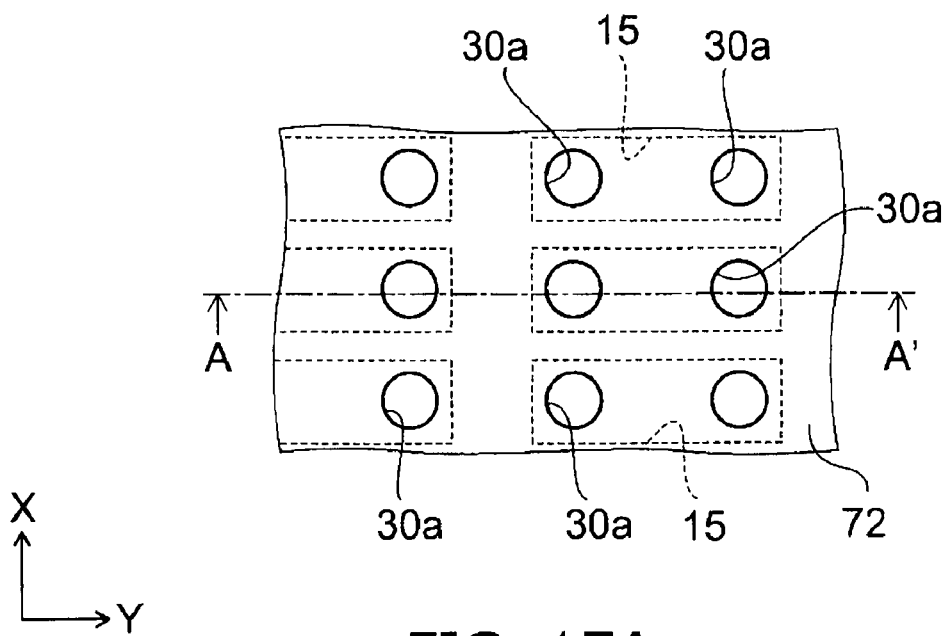
FIG. 17A is a process plan view illustrating the method for manufacturing the nonvolatile semiconductor memory device according to the comparative example.
Figure 17B:
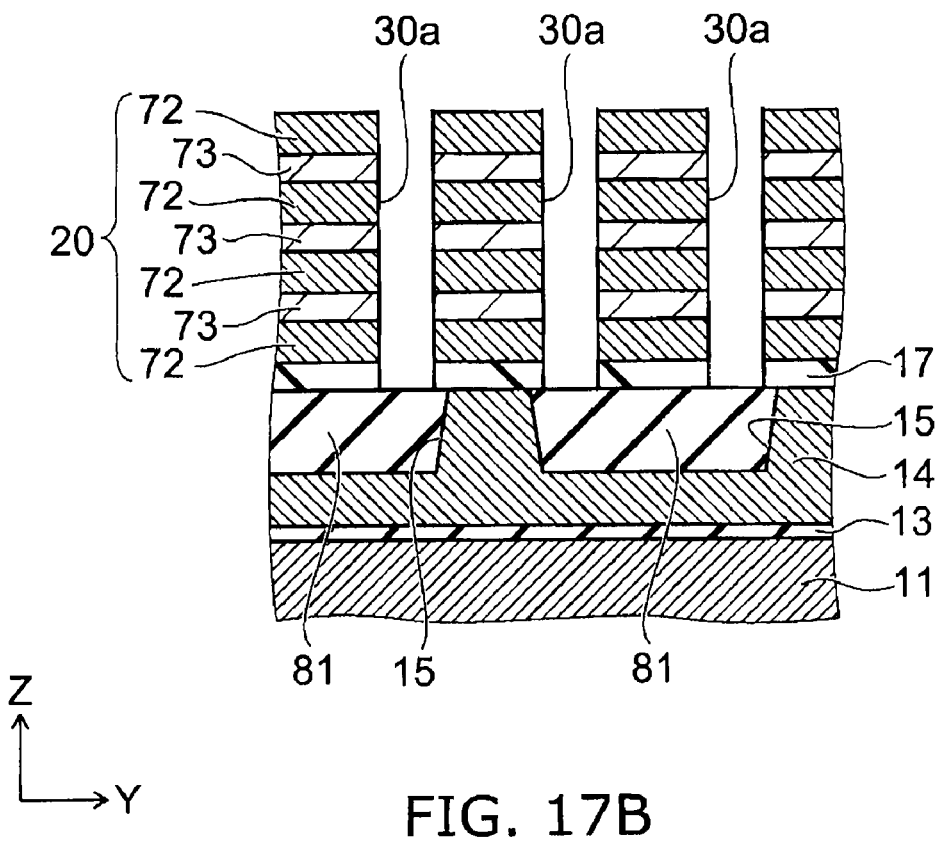
FIG. 17B is a process cross-sectional view along A-A' of FIG. 17A.

As illustrated in FIGS. 17A and 17B, by photolithography and etching, through-holes 30a are formed in the stacked body 20 from the upper surface side. The through-holes 30a are arranged in a matrix along the X direction and the Y direction. A pair of the through-holes 30a adjacent to each other in the Y direction reaches to the both ends of the recess 15 in the Y direction.

Figure 18A:
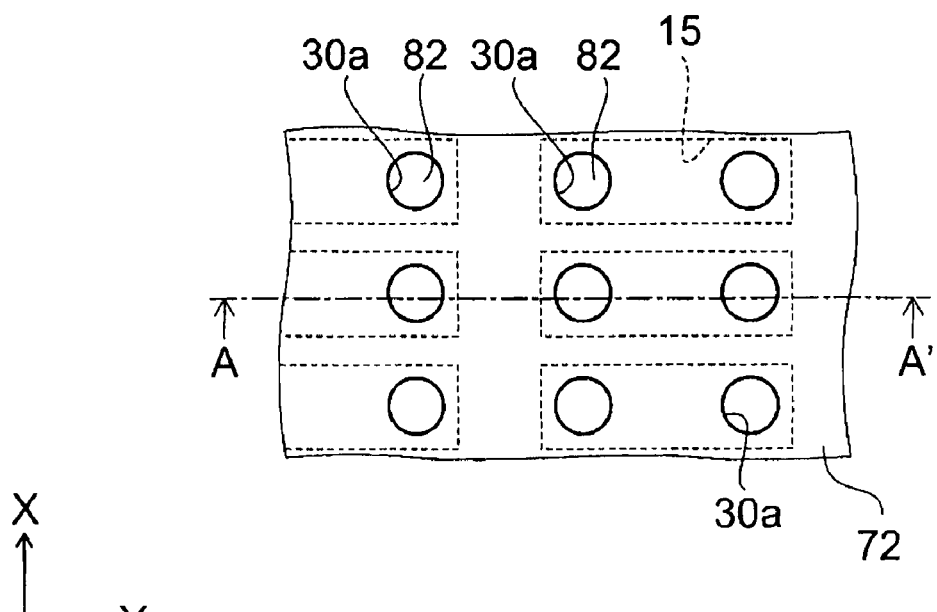
FIG. 18A is a process plan view illustrating the method for manufacturing the nonvolatile semiconductor memory device according to the comparative example.
Figure 18B:
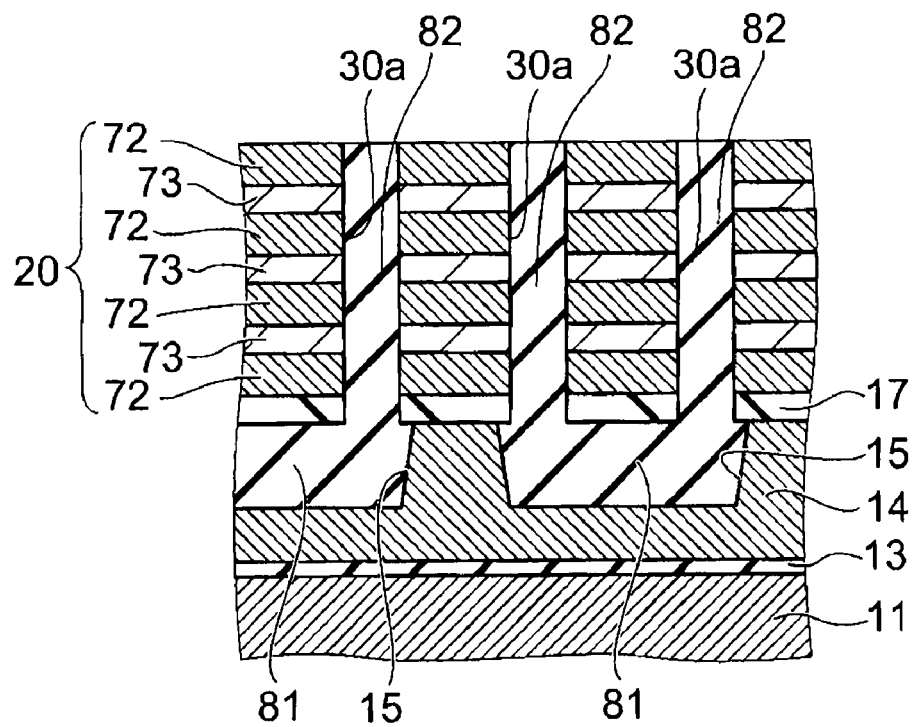
FIG. 18B is a process cross-sectional view along A-A' of FIG. 18A.

Next, as illustrated in FIGS. 18A and 18B, silicon nitride is deposited on the entire surface, and then the entire surface is etched to remove the silicon nitride deposited on the upper surface of the stacked body 20. Thus, a sacrifice material 82 of the silicon nitride is buried in the through-holes 30a.

Figure 19A:
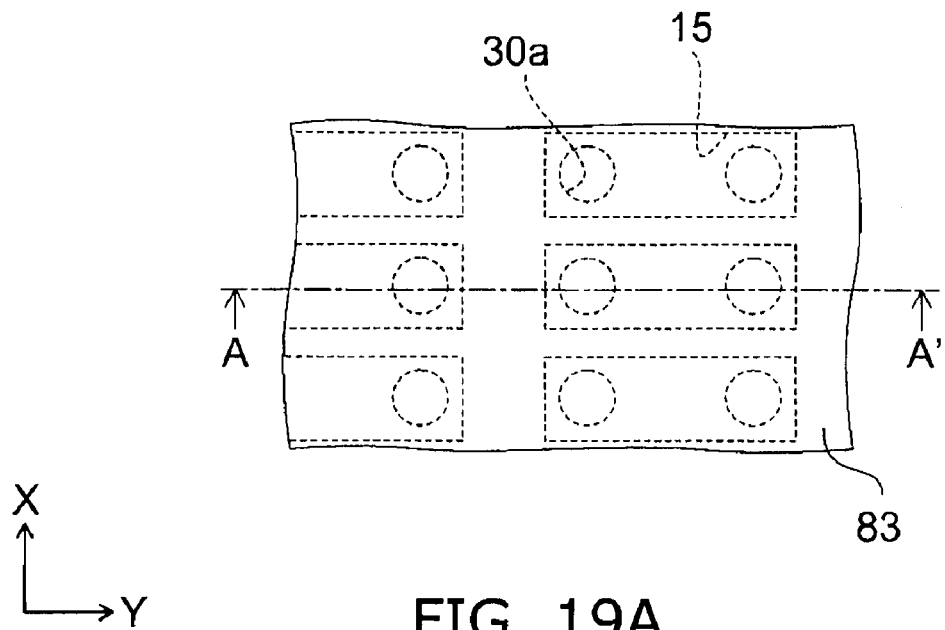
FIG. 19A is a process plan view illustrating the method for manufacturing the nonvolatile semiconductor memory device according to the comparative example.
Figure 19B:
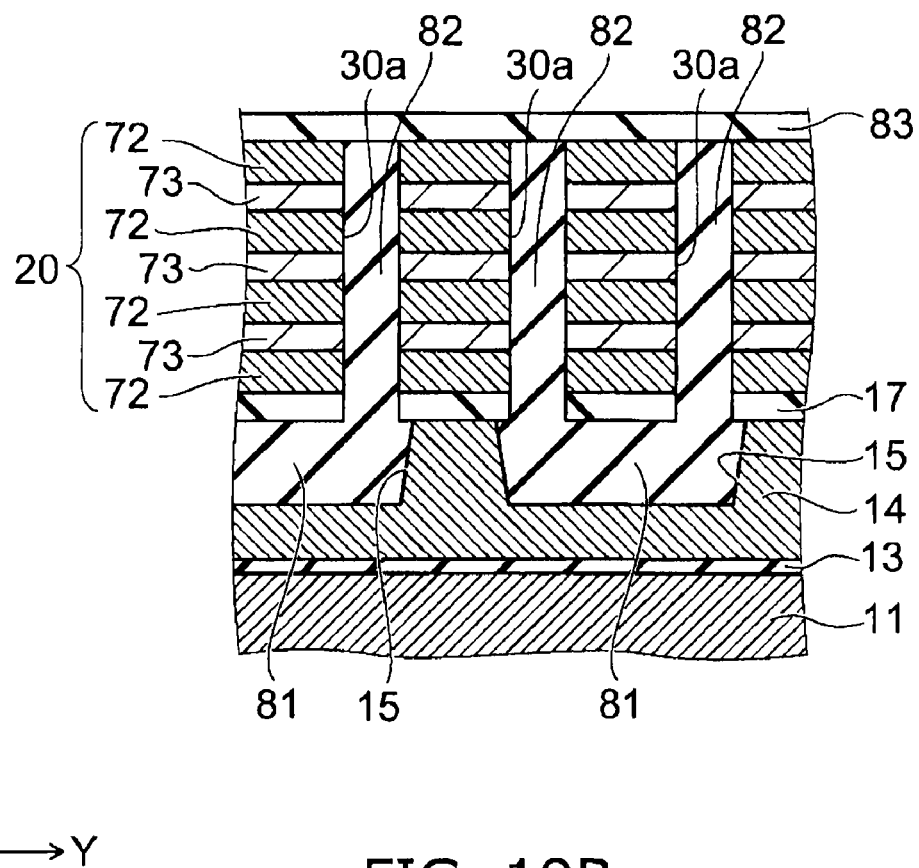
FIG. 19B is a process cross-sectional view along A-A' of FIG. 19A.

Next, as illustrated in FIGS. 19A and 19B, a silicon oxide film 83 is formed on the stacked body 20 to protect the uppermost layer of the boron-doped polysilicon layers 72.

Figure 20A:
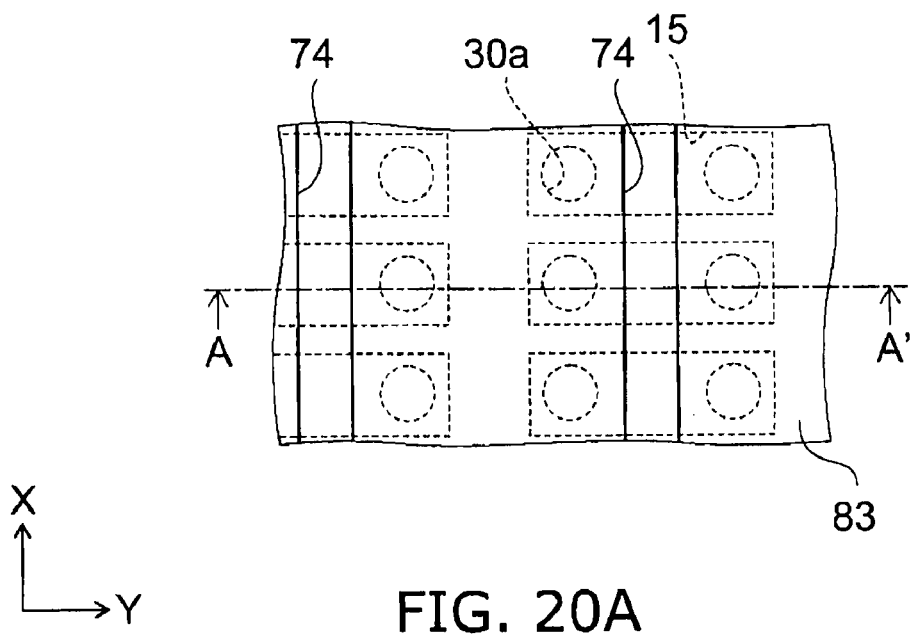
FIG. 20A is a process plan view illustrating the method for manufacturing the nonvolatile semiconductor memory device according to the comparative example.
Figure 20B:
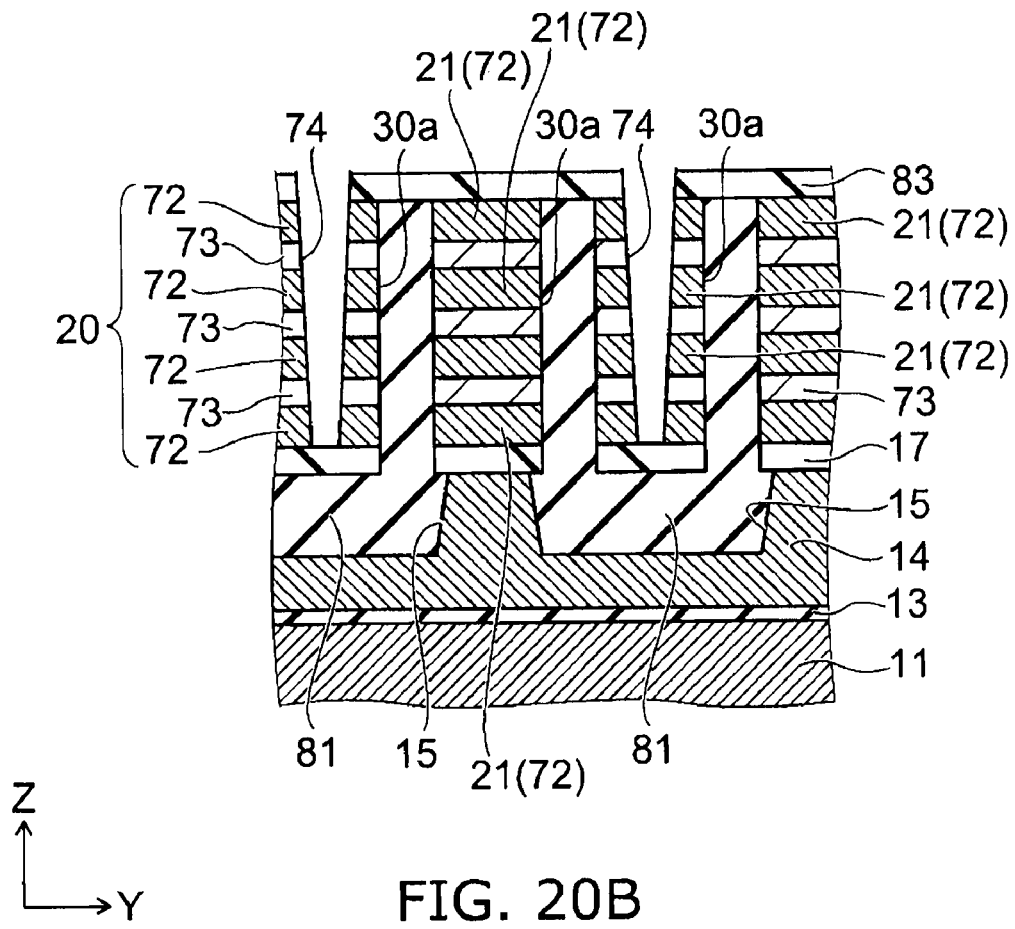
FIG. 20B is a process cross-sectional view along A-A' of FIG. 20A.

Next, as illustrated in FIGS. 20A and 20B, in the stacked body 20 and the silicon oxide film 83, a plurality of slits 74 are formed from the upper surface side. Each of the slits 74 extended in the X direction is formed to pierce the silicon oxide film 83 and the stacked body 20 in the Z direction and pass through the area immediately above the central portion of the recess 15 in the Y direction. Thus, the boron-doped polysilicon layer 72 is divided into a plurality of gate electrodes 21.

Figure 21A:
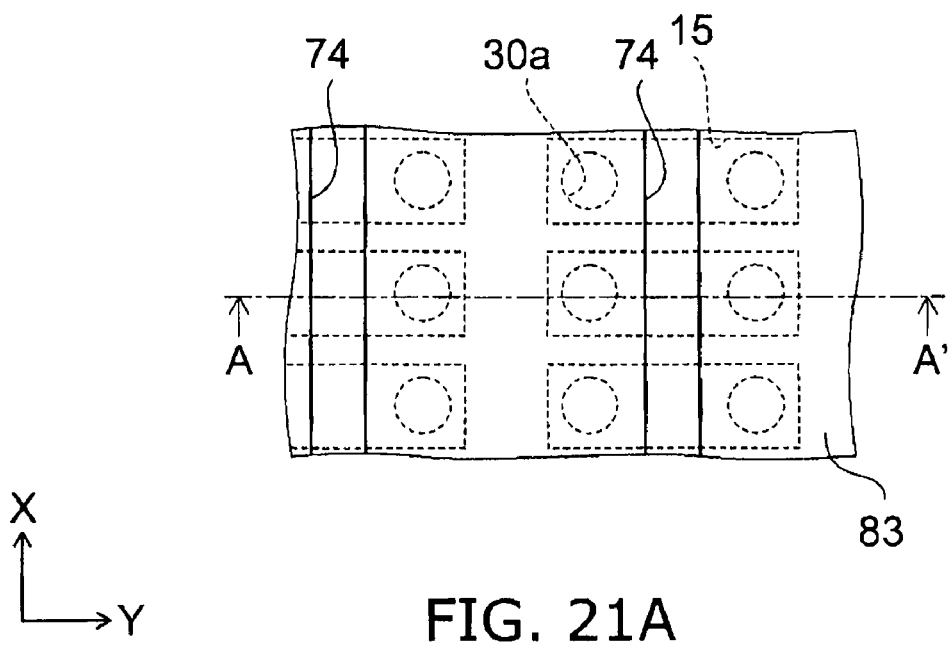
FIG. 21A is a process plan view illustrating the method for manufacturing the nonvolatile semiconductor memory device according to the comparative example.
Figure 21B:
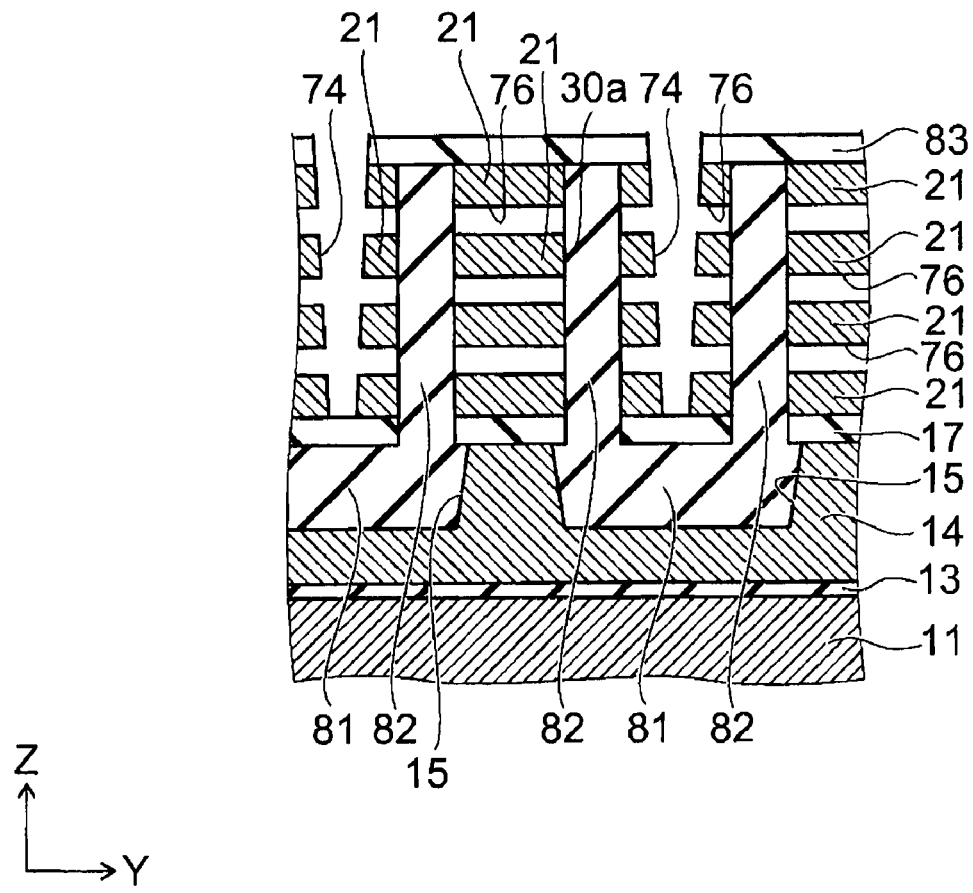
FIG. 21B is a process cross-sectional view along A-A' of FIG. 21A.

Next, as illustrated in FIGS. 21A and 21B, wet etching is performed via the slits 74. This wet etching uses an alkaline etchant. Thus, the non-doped polysilicon layer 73 in the stacked body 20 (see FIG. 20B) is removed, and spaces 76 between the gate electrodes 21 in the Z direction are formed. At this time, the gate electrodes 21 are supported by the cylindrical sacrifice member 82.

Figure 22A:
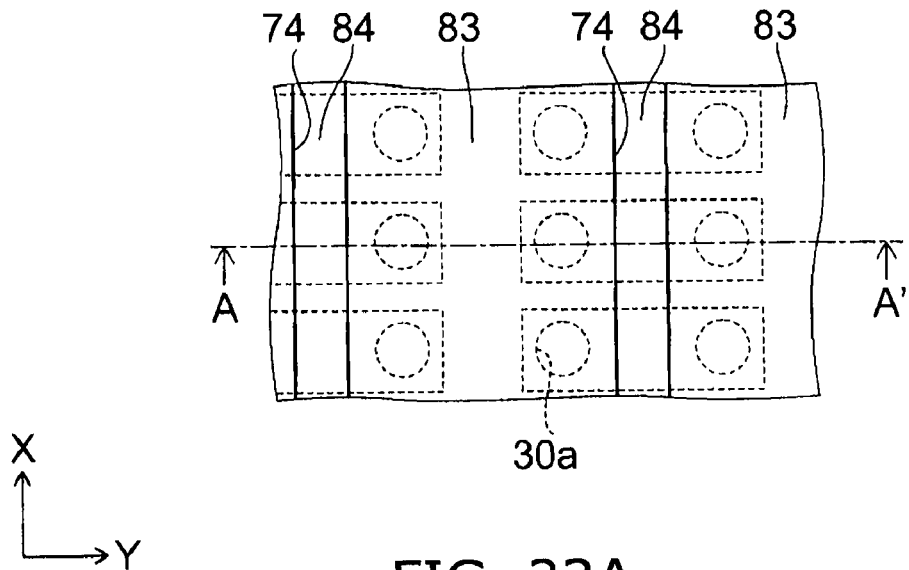
FIG. 22A is a process plan view illustrating the method for manufacturing the nonvolatile semiconductor memory device according to the comparative example.
Figure 22B:
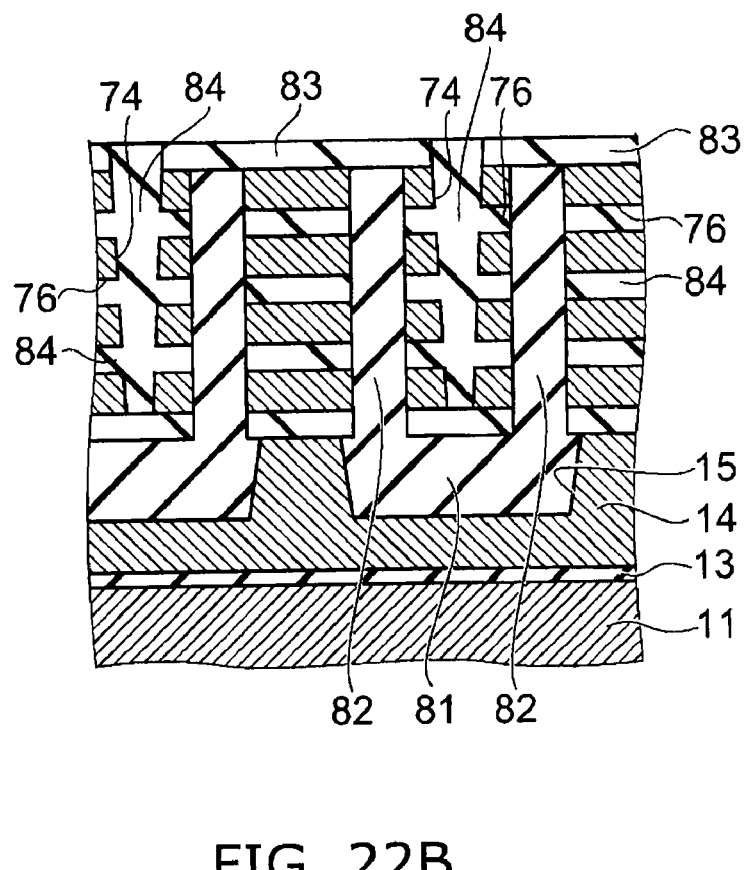
FIG. 22B is a process cross-sectional view along A-A' of FIG. 22A.

Next, as illustrated in FIGS. 22A and 22B, silicon oxide is deposited on the entire surface by, e.g., ALD. Thus, the silicon oxide 84 is buried in the spaces 76 and the slits 74.

Figure 23A:
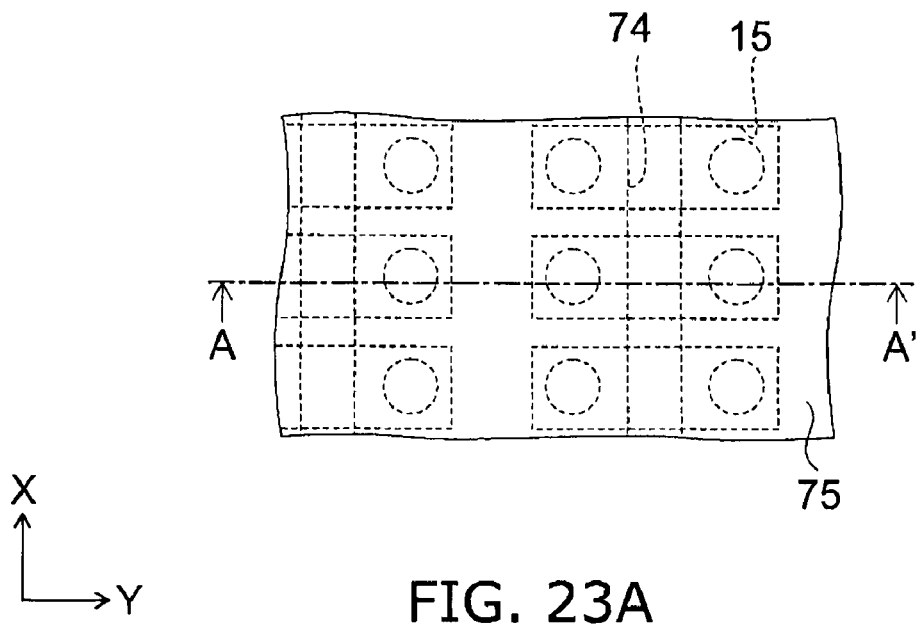
FIG. 23A is a process plan view illustrating the method for manufacturing the nonvolatile semiconductor memory device according to the comparative example.
Figure 23B:
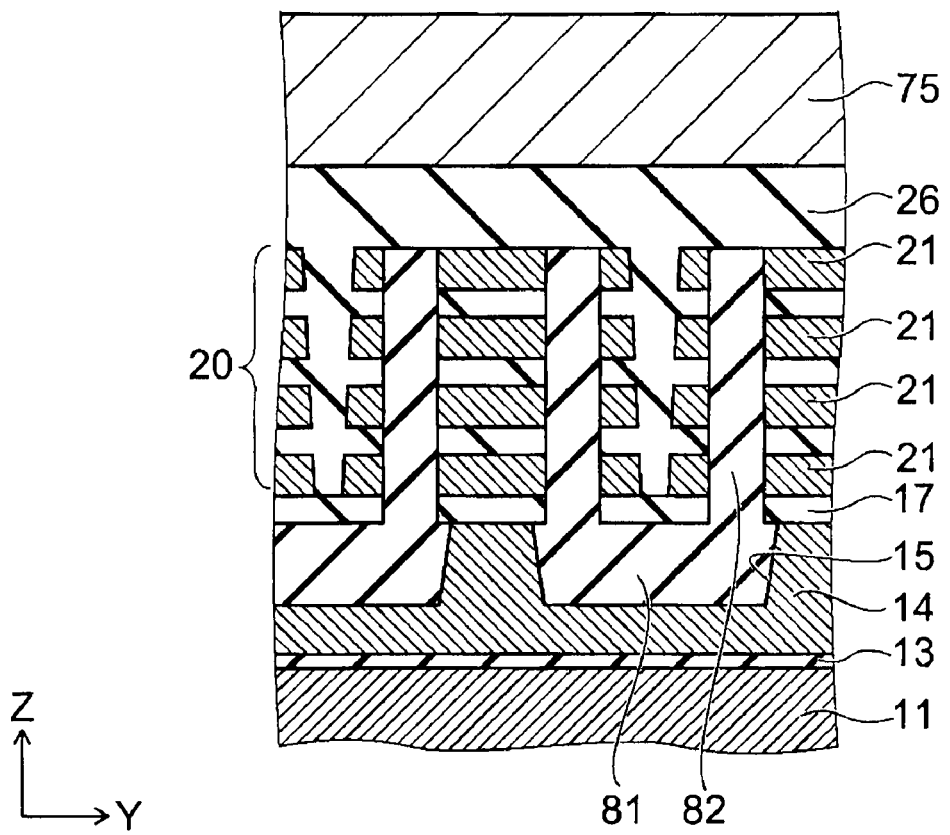
FIG. 23B is a process cross-sectional view along A-A' of FIG. 23A.

As illustrated in FIGS. 23A and 23B, a silicon oxide film 26 is formed on the stacked body 20, and a boron-doped polysilicon film 75 is formed thereon.

Figure 24A:
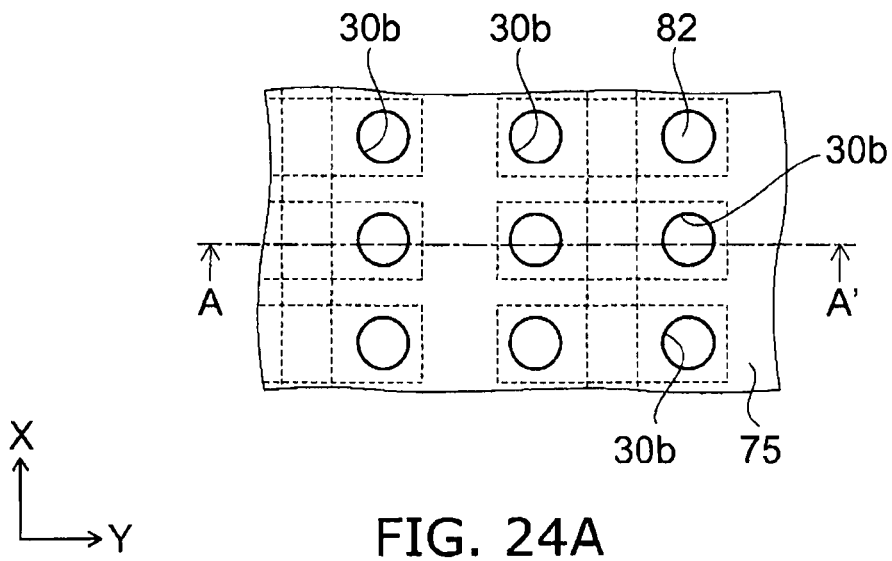
FIG. 24A is a process plan view illustrating the method for manufacturing the nonvolatile semiconductor memory device according to the comparative example.
Figure 24B:
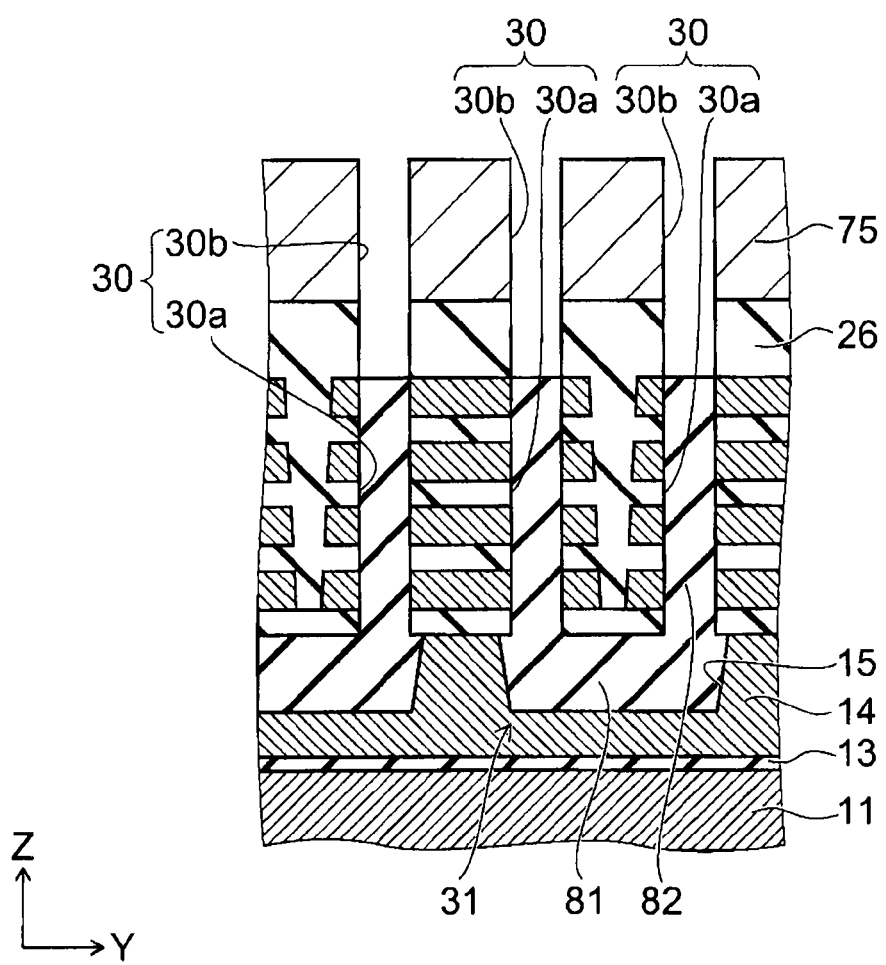
FIG. 24B is a process cross-sectional view along A-A' of FIG. 24A.

Then, as illustrated in FIGS. 24A and 24B, through-holes 30b are formed in the boron-doped polysilicon film 75 and the silicon oxide film 26. The through-holes 30b are formed in the areas directly on the through-holes 30a and are communicated with the through-holes 30a. The through holes 30a and 30b form continuous through-holes 30. The through-holes 30 and the recesses 15 form U-shaped holes 31.

Figure 25A:
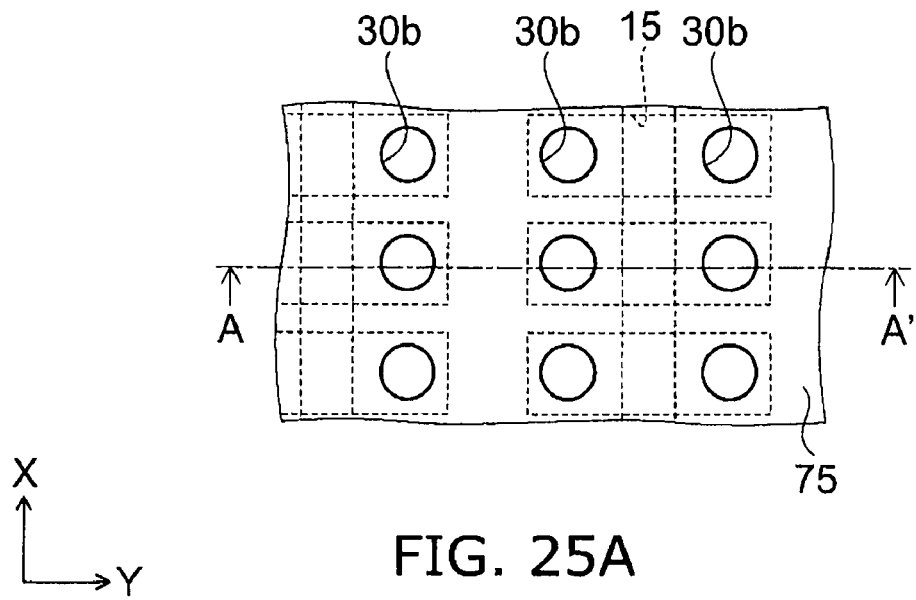
FIG. 25A is a process plan view illustrating the method for manufacturing the nonvolatile semiconductor memory device according to the comparative example.
Figure 25B:
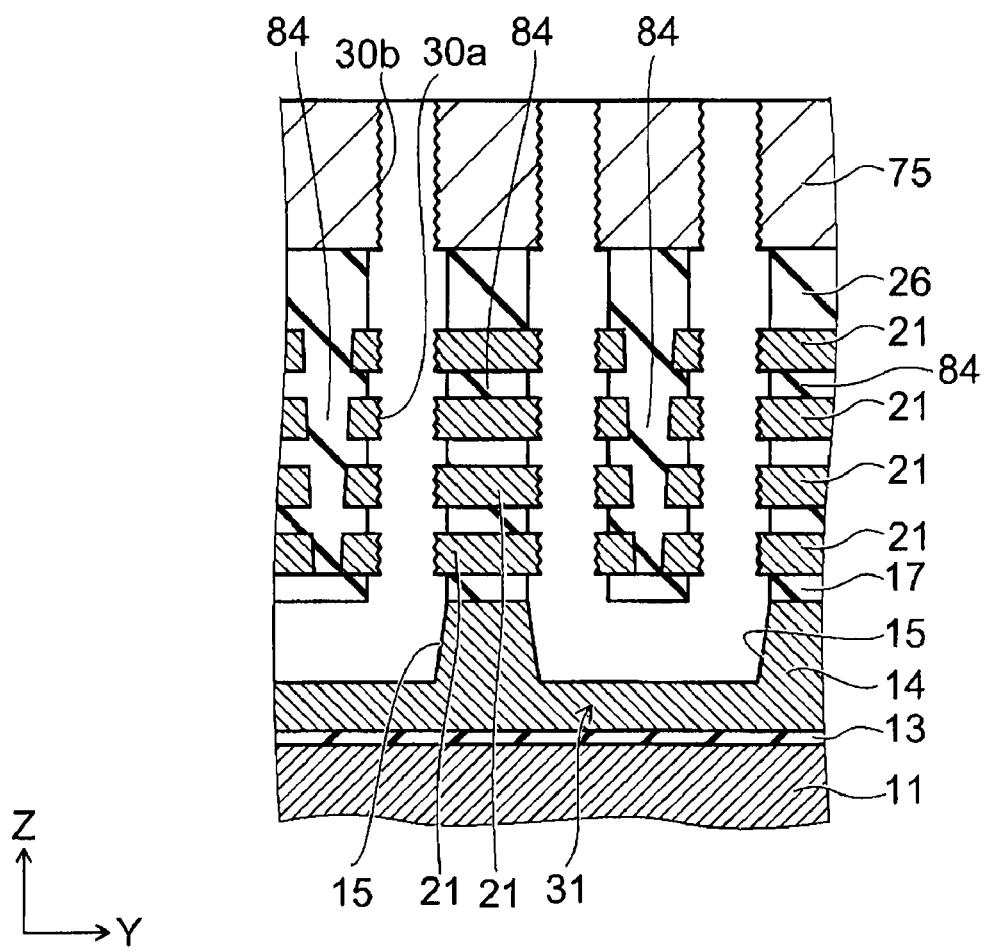
FIG. 25B is a process cross-sectional view along A-A' of FIG. 25A.

Next, as illustrated in FIGS. 25A and 25B, wet etching is performed with a high-temperature phosphoric acid to remove the sacrifice material 82 from the interiors of the through-holes 30a (see FIG. 24B) while removing the sacrifice material 81 form the insides of the recesses 15 (see FIG. 24B). At this time, portions of the silicon oxide film 26 and the silicon oxide 84 exposed in the through-holes 30 are removed to some extent, and concavities are formed in the side surfaces of the through-holes 30. Portions of the gate electrodes 21 formed of boron-doped silicon and the boron-doped polysilicon film 75 exposed in the through-holes 30 are also slightly etched, and the surfaces become rough.

Figure 26A:
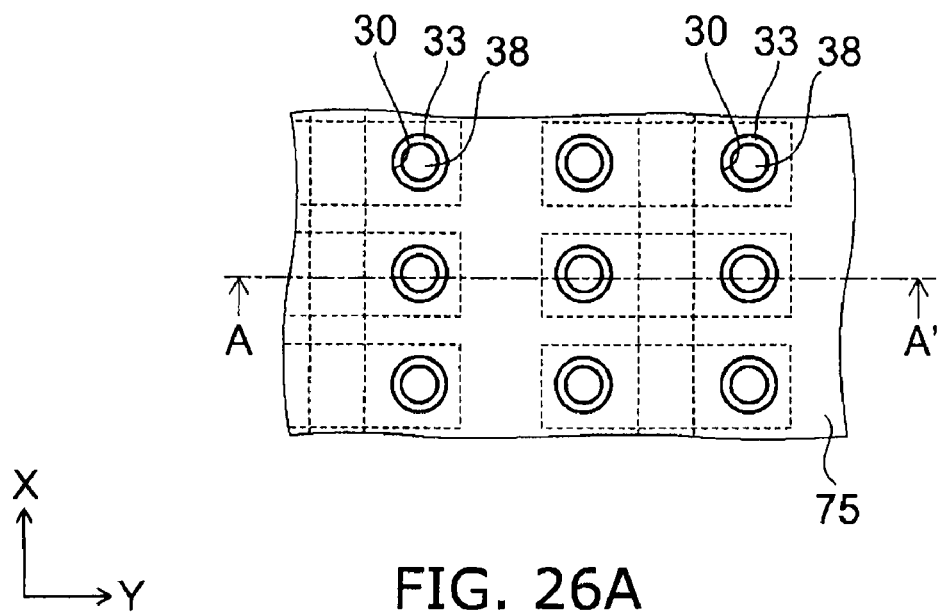
FIG. 26A is a process plan view illustrating the method for manufacturing the nonvolatile semiconductor memory device according to the comparative example.
Figure 26B:
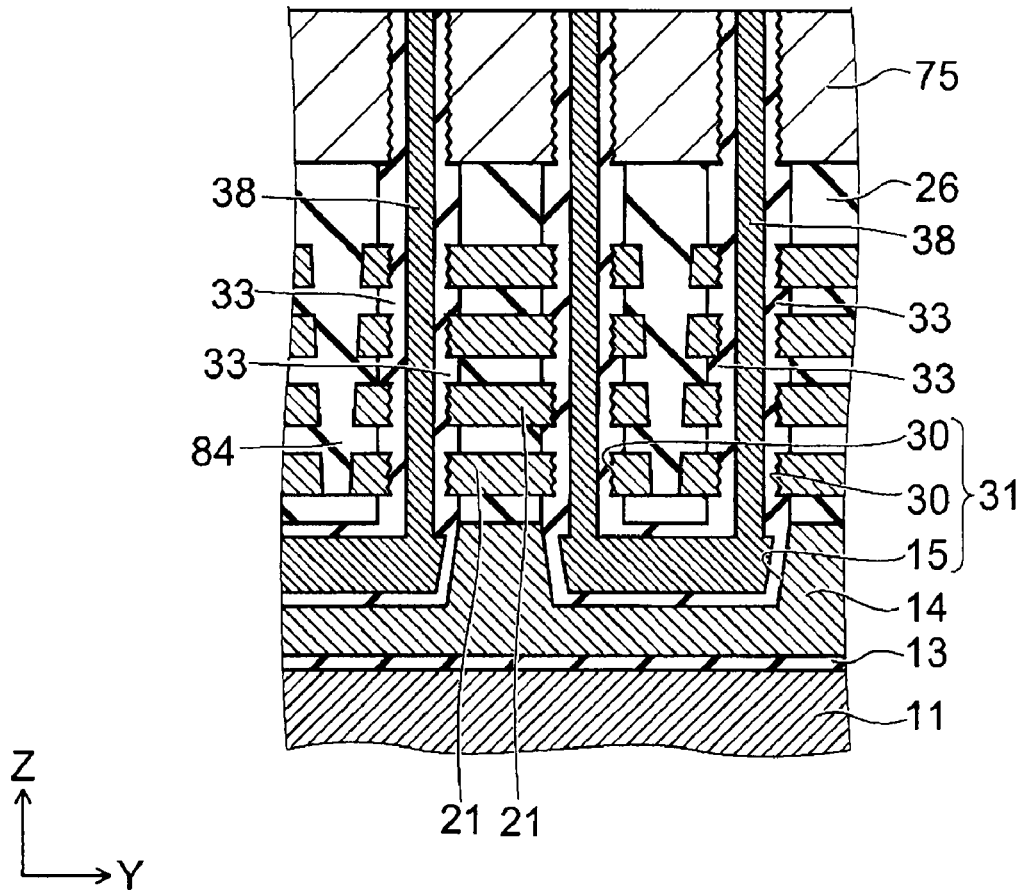
FIG. 26B is a process cross-sectional view along A-A' of FIG. 26A.

Then, as illustrated in FIGS. 26A and 26B, a block insulation film, a charge storage film and a tunnel insulation film are formed on the interior surfaces of the U-shaped holes 30 to form a memory film 33, and then polysilicon is buried inside the U-shaped holes to form U-shaped pillars 38.

Figure 27A:
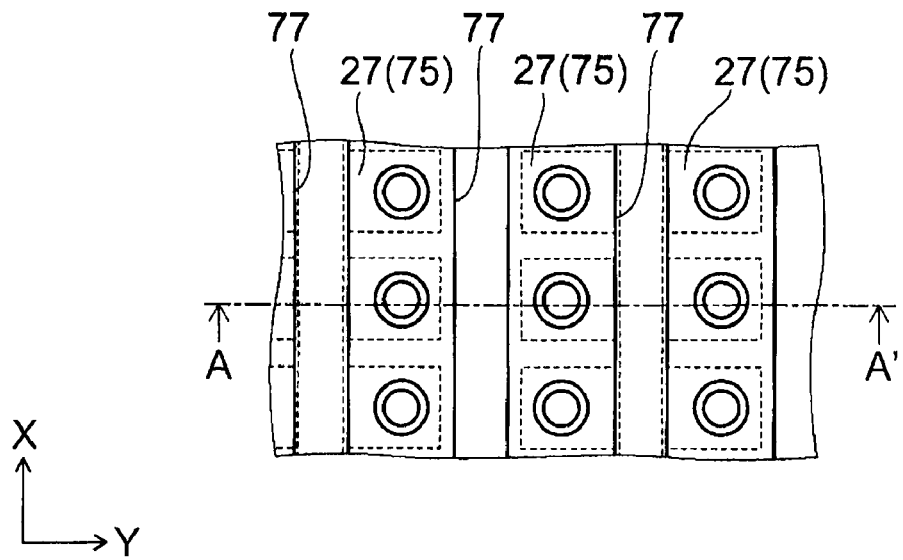
FIG. 27A is a process plan view illustrating the method for manufacturing the nonvolatile semiconductor memory device according to the comparative example.
Figure 27B:
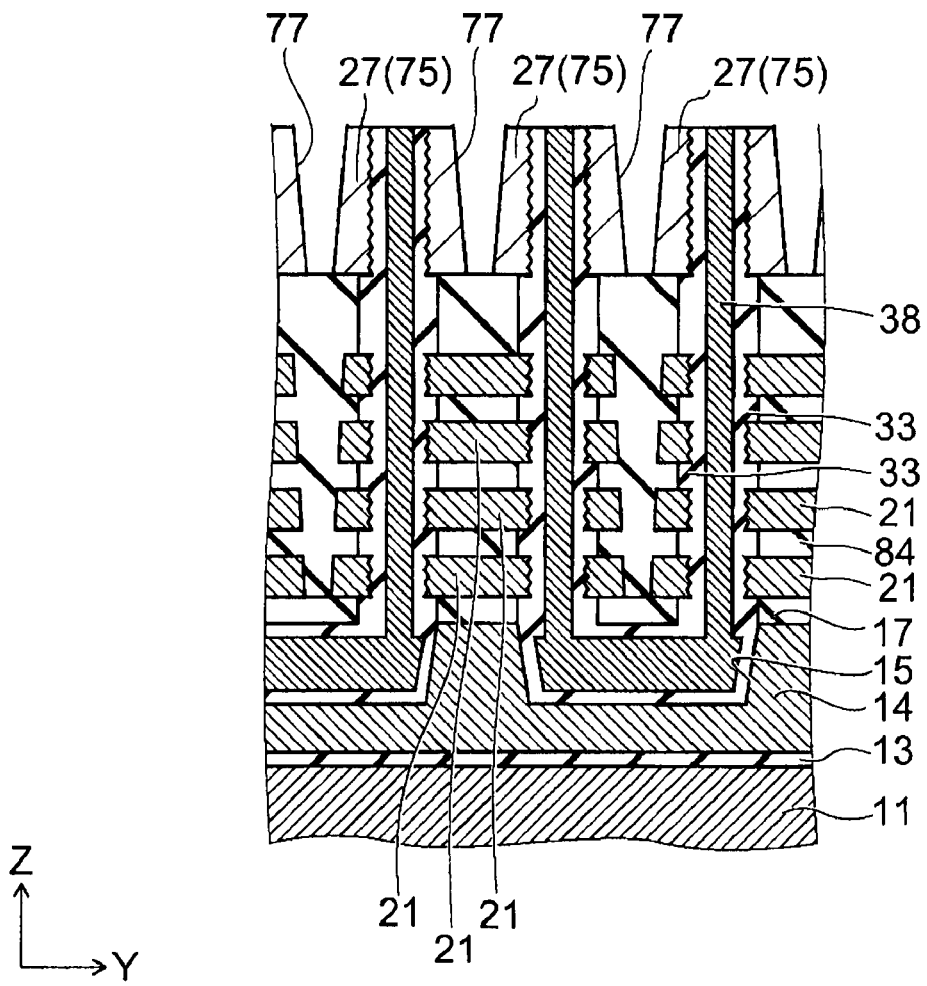
FIG. 27B is a process cross-sectional view along A-A' of FIG. 27A.

Next, as illustrated in FIGS. 27A and 27B, by photolithography and etching, a plurality of slits 77 extended in the X direction are formed in the boron-doped polysilicon film 75 from the upper surface side. Thus, the boron-doped polysilicon film 75 becomes a plurality of control electrodes 27 extended in the X direction.

The following processes of the manufacturing method are the same as that of the first embodiment described above. That is, the end of the stacked body 20 is processed in a staircase pattern and is buried by an interlayer insulation film 42, and a source line 47 and a bit line 52 and the like are formed. Thus, the nonvolatile semiconductor device according to this comparative example is manufactured.

In this comparative example, in the process illustrated in FIGS. 25A and 25B, the sacrifice materials 81 and 82 are removed with high-temperature phosphoric acid, which roughens the exposed surfaces of the through-holes 30 in the gate electrodes 21 and the control electrodes 27. This lowers the voltage resistance of the block dielectric film 35 in the memory cell transistors and the selective transistors.

In contrast to this, in the first embodiment described above, the process of burying a sacrifice material of silicon nitride is absent, and accordingly the process of removing the sacrifice material with high temperature phosphoric acid is absent. Thus, such problem dose not occurs.

In this comparative example, the silicon oxide 84 is present between the gate electrodes 21 and is in contact with the block insulation film 35. In the process illustrated in FIGS. 25A and 25B, the etching amount of the silicon oxide 84 with high-temperature phosphoric acid differs depending on the positions in the up-to-down direction, and accordingly the receding amount of the silicon oxide 84 by this etching also differs depending on the position in the up-to-down direction. Generally, less unreacted one of the high-temperature phosphoric acid reaches to a lower part of the stacked body 20, and the receding amount of the silicon oxide 84 becomes smaller. As a result, the diameter of the through-holes 30 varies depending on the positions in the up-to-down direction, and the characteristics of the memory transistors change.

In contrast to this, in the first embodiment described above, the block insulation film 35 is buried between the gate electrodes 21 in the Z direction, and the silicon oxide 84 is absent. Thus, the diameter of the through-holes 30 does not vary depending on the receding amounts of the silicon oxide 84, and the characteristics of the memory cell transistors do not change.

Furthermore, in this comparative example, the sacrifice material 81 is buried in the recesses 15 in the process illustrated in FIGS. 15A and 15B, the sacrifice material 82 is buried in the through-holes 30a in the process illustrated in FIGS. 18A and 18B, and the sacrifice materials 81 and 82 are removed in the process illustrated in FIGS. 25A and 25B. Accordingly, the number of the processes is large.

In contrast to this, in the first embodiment descried above, the non-doped polysilicon layer 73 and the non-doped silicon material 71 are removed via the through-holes 30 in the process illustrated in FIGS. 11A and 11B. Thus, once a sacrifice material is buried in the through-holes 30, there is no process of removing the sacrifice material in the later processes. Further, the slits 74 are formed in the stacked body 20 in the process illustrated in FIGS. 7A and 7B, subsequently the insulation plates 22 are buried in the slits 74. Thus, once a sacrifice material is buried in the slits 74, there is no process of removing the sacrifice material in the later processes. As a result, the device 1 can be manufactured with a small number of processes.

Furthermore, in this comparative example, the gate electrodes 21 are supported by the cylindrical sacrifice material 82 after the non-doped polysilicon layer 73 is removed in the process illustrated in FIGS. 21A and 21B. Thus, the strength of the structure body as a whole is low, and the fall of the sacrifice material 82 could break the structure.

In contrast to this, in the first embodiment described above, as illustrated in FIGS. 11A and 11B, the gate electrodes 21 are supported by the plate-shaped insulation plate 22 after the non-doped polysilicon layer 73 is removed. The strength of the structure body is accordingly high, and easy to handle.

Next, a second embodiment of this invention will be described.

FIGS. 28A to 30B are views illustrating a method for manufacturing a nonvolatile semiconductor memory device according to this embodiment. The drawings of the respective drawings indicated by A are plan views of the nonvolatile semiconductor memory device in the processes of its manufacturing method. The drawings of the respective drawings indicated, by B are the sectional views along the A-A' line in the drawings indicated by A.

FIGS. 28A to 30B illustrate the memory array region Rm.

First, the structure body illustrated in FIGS. 11A and 11B is formed by the process described in the aforementioned first embodiment.

Figure 28A:
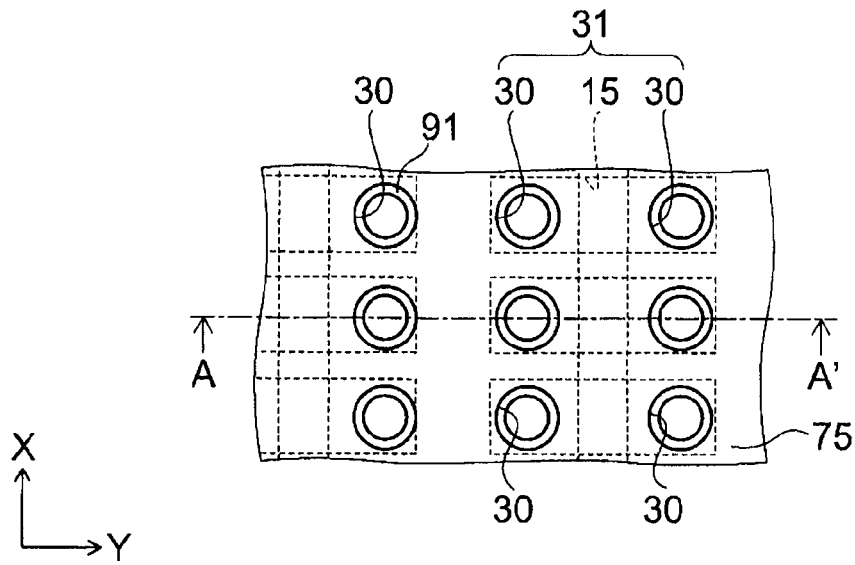
FIG. 28A is a process plan view illustrating a method for manufacturing a nonvolatile semiconductor memory device according to a second embodiment of the invention.
Figure 28B:
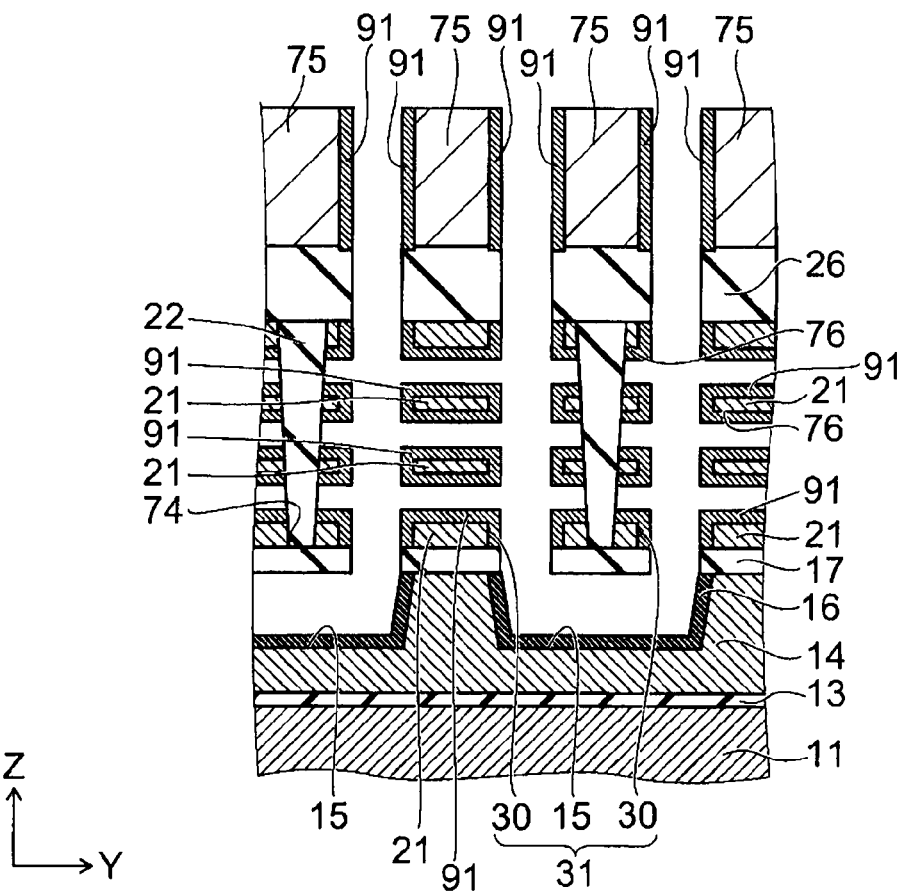
FIG. 28B is a process cross-sectional view along A-A' of FIG. 28A.

Next, as illustrated in FIGS. 28A and 28B, a metal such as nickel, cobalt or the like, is deposited on the interior surfaces of the Y-shaped holes 31 and the interior surfaces of spaces 76 by, e.g., CVD (Chemical Vapor Deposition). Then, heat treatment is performed. Thus, a metal silicide layer 91 is formed on the surfaces of the U-shaped holes 31 and the spaces 76 where silicon is exposed, i.e., the exposed surfaces of the gate electrodes 21 and the exposed surfaces of the boron-doped polysilicon film 75. A metal to be deposited is not limited to nickel or cobalt and can be nay metal as far as the metal reacts with silicon to form metal silicide and reduces electric resistance more than before the reaction.

Figure 29A:
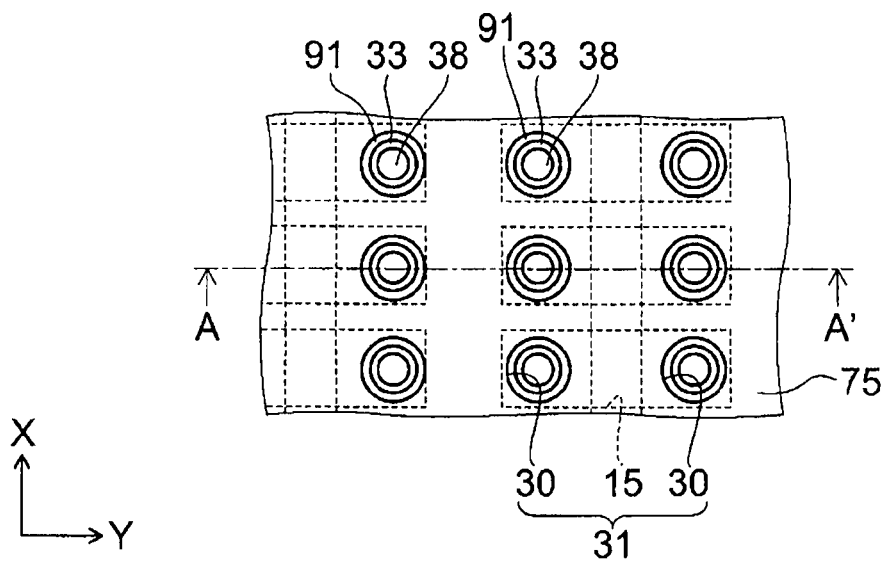
FIG. 29A is a process plan view illustrating the method for manufacturing the nonvolatile semiconductor memory device according to the second embodiment.
Figure 29B:
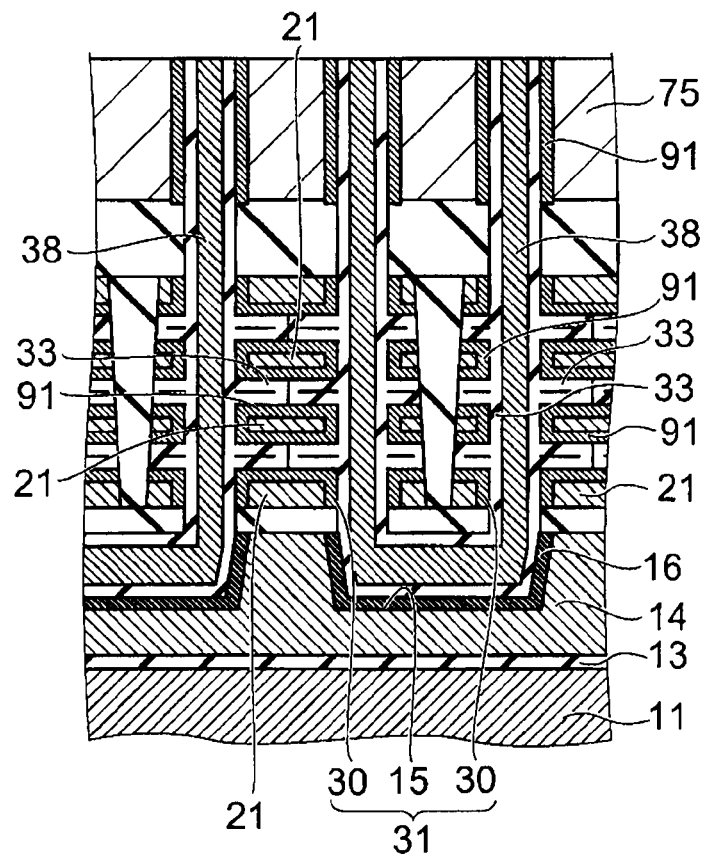
FIG. 29B is a process cross-sectional view along A-A' of FIG. 29A.
Figure 30A:
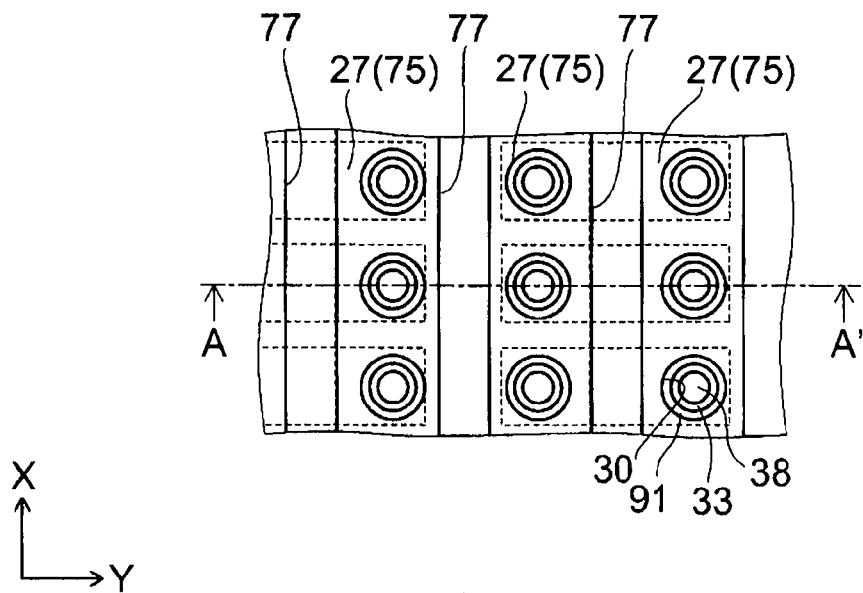
FIG. 30A is a process plan view illustrating the method for manufacturing the nonvolatile semiconductor memory device according to the second embodiment.
Figure 30B:
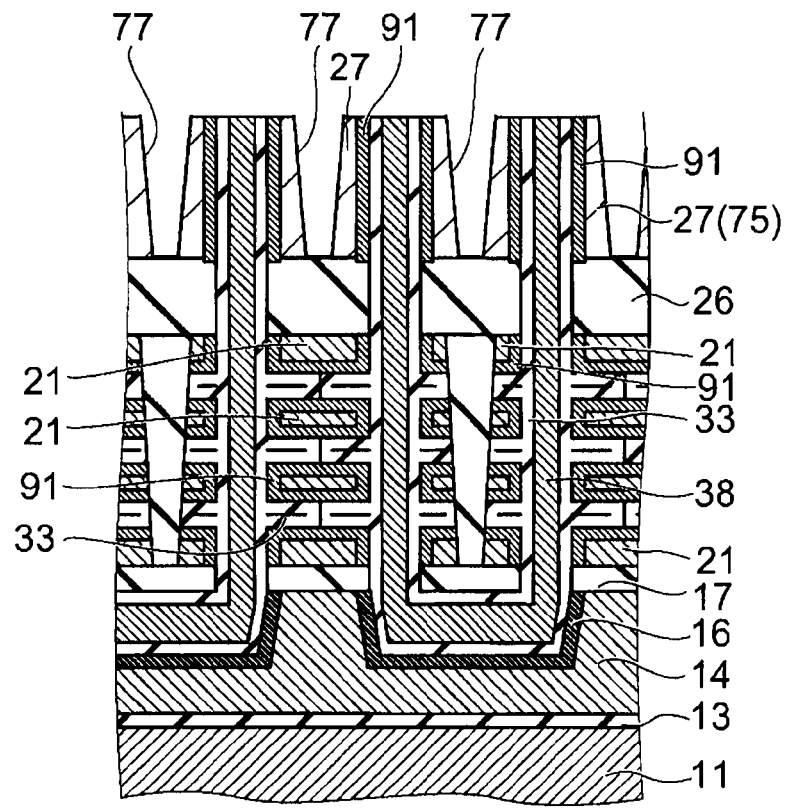
FIG. 30B is a process cross-sectional view along A-A' of FIG. 30A.

The following processes are the same as the processes of the first embodiment described above illustrated in FIGS. 12A and 12B and the following drawings. That is, as illustrated in FIGS. 29A and 29B, the memory film 33 is deposited in the spaces 76 and in the U-shaped holes 31. At this time, as illustrated in FIG. 3, the spaces 76 are filled with the block insulation film 35, the charge storage film 36 is deposited on the block insulation film 35, and the tunnel insulation film 37 is deposited thereon. Then, the U-shaped pillars 38 are buried in the U-shaped holes 31. Next, as illustrated in FIGS. 30A and 30B, the slits 77 are formed in the boron-doped polysilicon film 75 to divide the boron-doped polysilicon film 75 into a plurality of the control electrodes 27. Then, the source line 47, the bit line 51 and the like are formed. The manufacturing method according to this embodiment except the process described above is the same as the manufacturing method according to the first embodiment described above.

According to this embodiment, the metal silicide layer 91 can be formed in the regions opposed to the block insulation film 35 on the surfaces of the gate electrodes 21 and the surfaces of the control electrodes 27. Thus, the resistances of the gate electrodes 21 and the control electrodes 27 can be decreased in comparison with the resistances of the first embodiment described above. The configuration and the operational effects of this embodiment except the configuration and the operational effects describe above are the same as those of the first embodiment described above.

Next, a third embodiment of this invention will be described.

FIGS. 31A to 39B are views illustrating a method of a nonvolatile semiconductor memory device according to this embodiment. The drawings of the respective drawings indicated by A are plan views of the nonvolatile semiconductor memory device in the processes of its manufacturing method, and the drawings of the respective drawings indicated by B are the sectional views along the A-A' line in the drawings indicated by A.

FIGS. 31A to 39B illustrate the memory array region Rm.

First, the structure body illustrated in FIGS. 7A and 7B is formed by the process described in the aforementioned first embodiment.

Figure 31A:
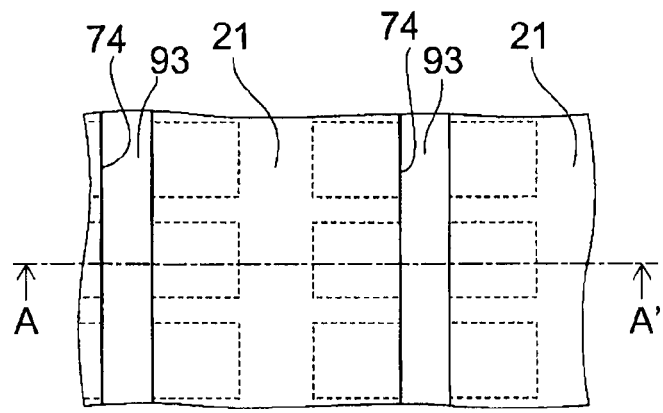
FIG. 31A is a process plan view illustrating a method for manufacturing a nonvolatile semiconductor memory device according to a third embodiment of the invention.
Figure 31B:
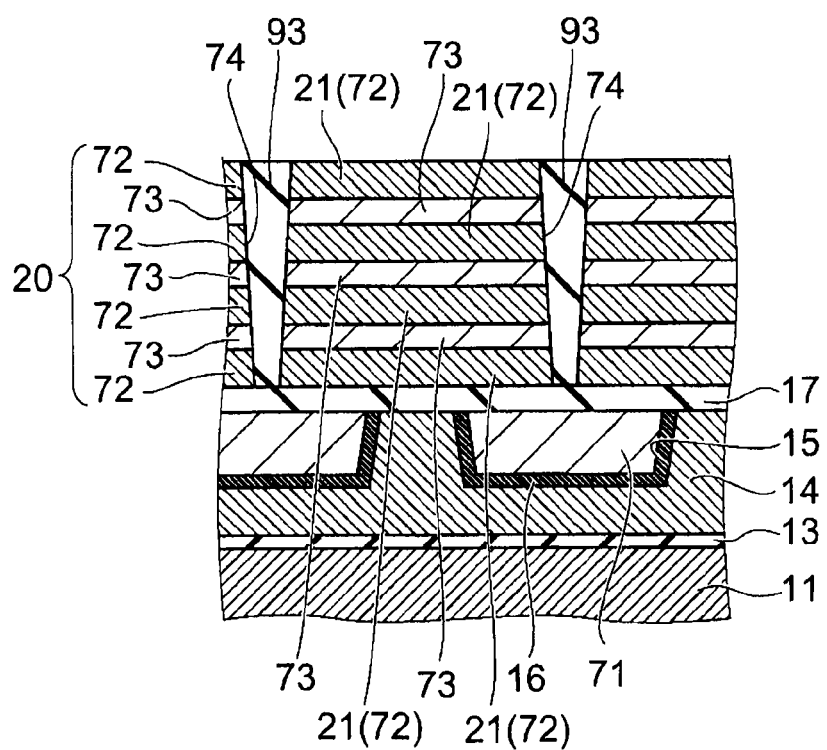
FIG. 31B is a process cross-sectional view along A-A' of FIG. 31A.

Then, as illustrated in FIGS. 31A and 31B, silicon nitride is deposited on the entire surface. This silicon nitride is buried also in the slits 74. Then, the entire surface is etched to remove the silicon nitride from the upper surface of the stacked body 20, but the silicon nitride is left in the slits 74. Thus, the sacrifice material 93 is buried in the slits 74. The uppermost one of the gate electrodes 21 is exposed on the upper surface of the stacked body 20.

The following processes illustrated in FIGS. 32A to 35B are the same as the processes described in the aforementioned first embodiment with reference to FIGS. 9A to 12B.

Figure 32A:
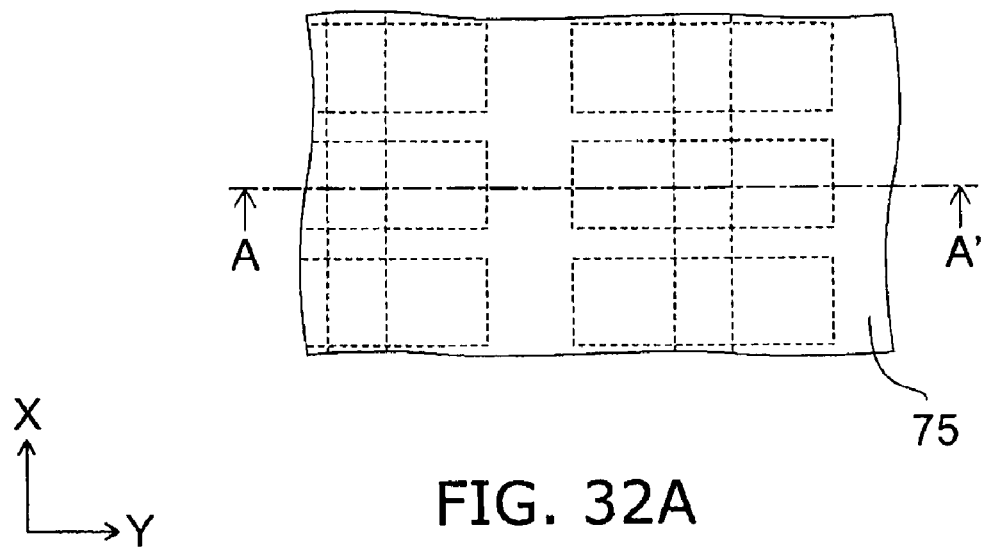
FIG. 32A is a process plan view illustrating the method for manufacturing the nonvolatile semiconductor memory device according to the third embodiment.
Figure 32B:
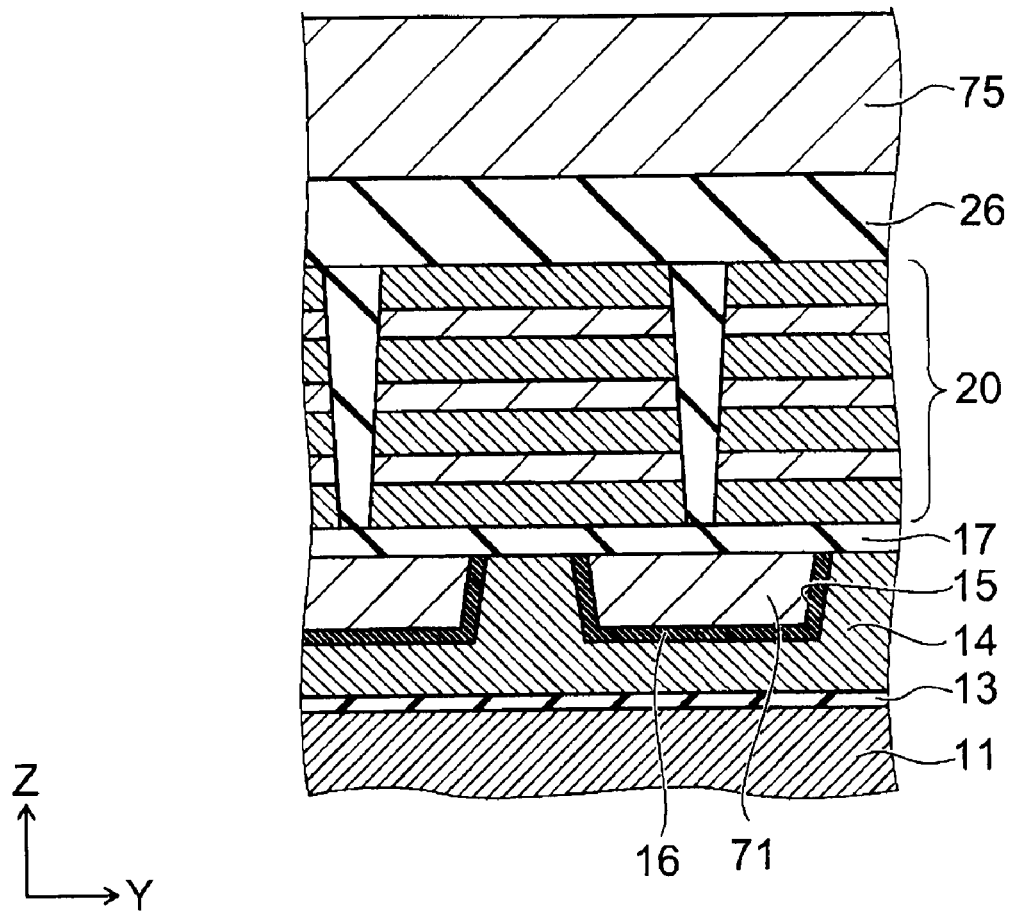
FIG. 32B is a process cross-sectional view along A-A' of FIG. 32A.

That is, as illustrated in FIGS. 32A and 32B, the silicon oxide film 26 is formed on the stacked body 20, and the boron-doped polysilicon film 75 is formed thereon.

Figure 33A:
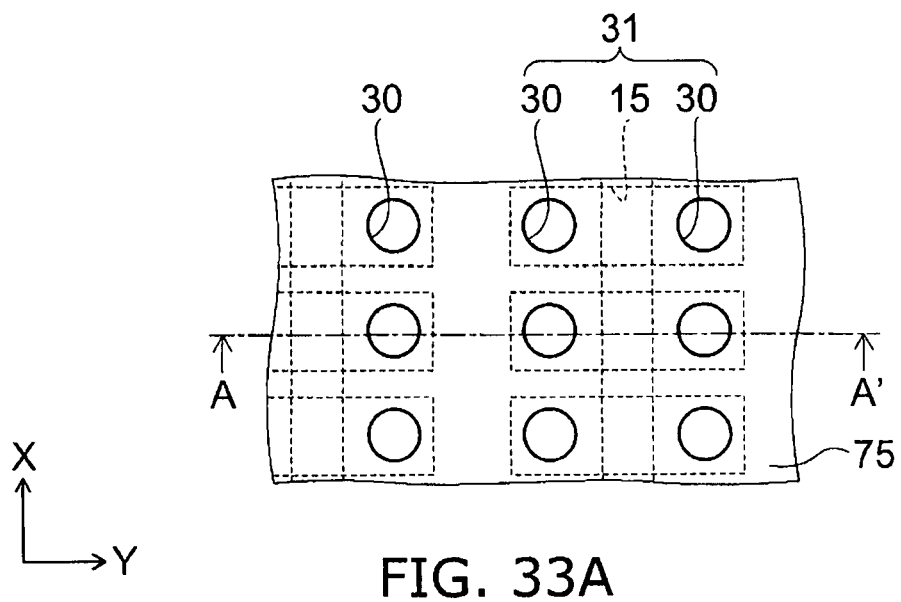
FIG. 33A is a process plan view illustrating the method for manufacturing the nonvolatile semiconductor memory device according to the third embodiment.
Figure 33B:
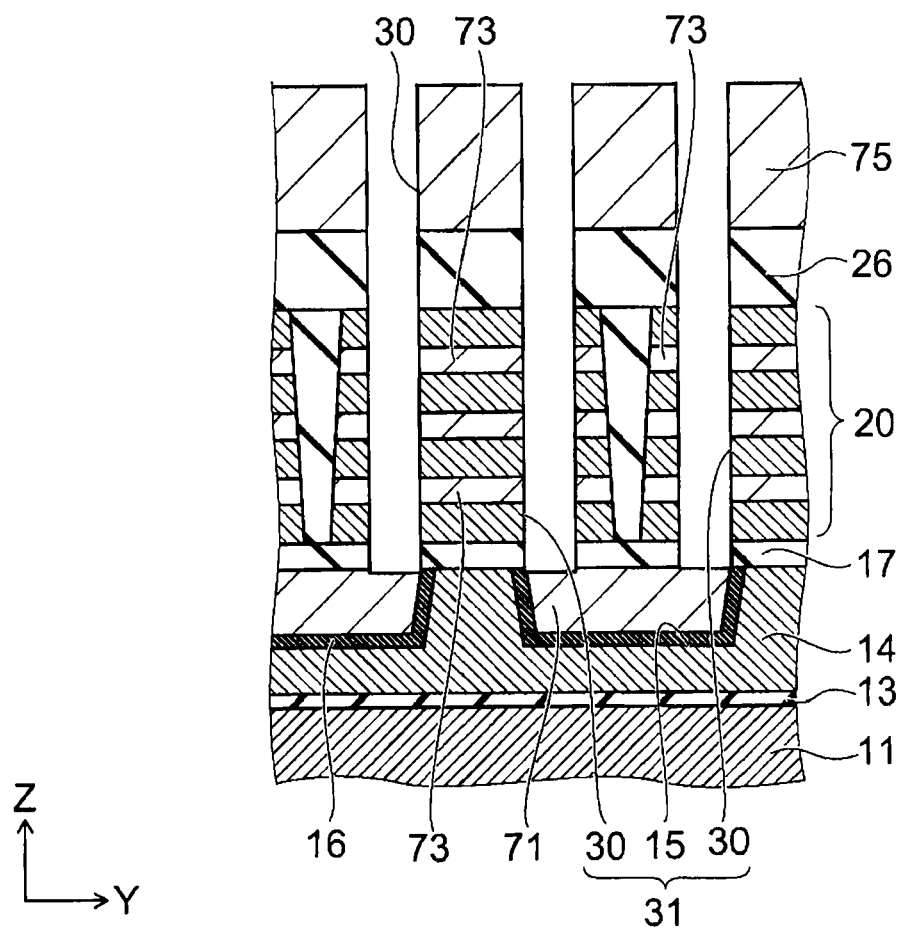
FIG. 33B is a process cross-sectional view along A-A' of FIG. 33A.

Next, as illustrated in FIGS. 33A and 33B, a plurality of through-holes 30 extended in the Z direction are formed in the boron-doped polysilicon film 75, the silicon oxide film 26 and the stacked body 20. At this time, a pair of the through-holes 30 adjacent to each other in the Y direction reaches to the both ends of the recess 15 in the Y direction.

Figure 34A:
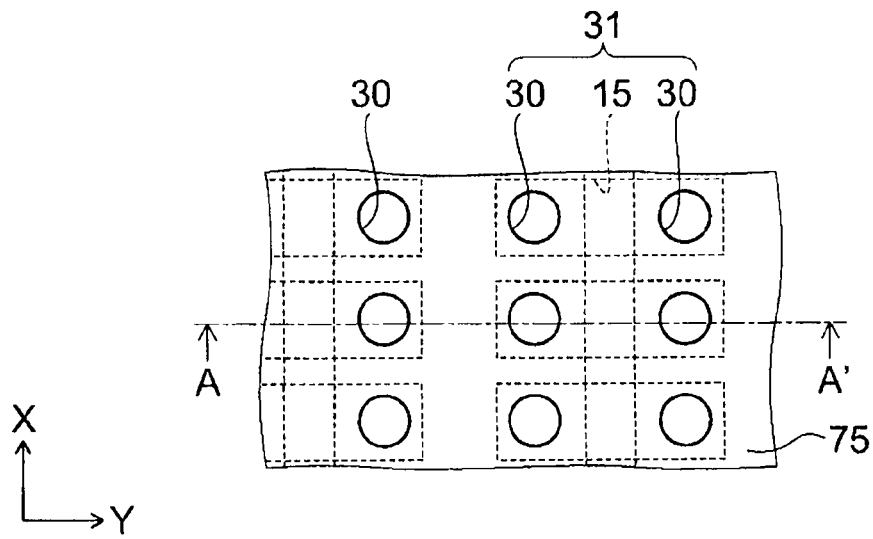
FIG. 34A is a process plan view illustrating the method for manufacturing the nonvolatile semiconductor memory device according to the third embodiment.
Figure 34B:
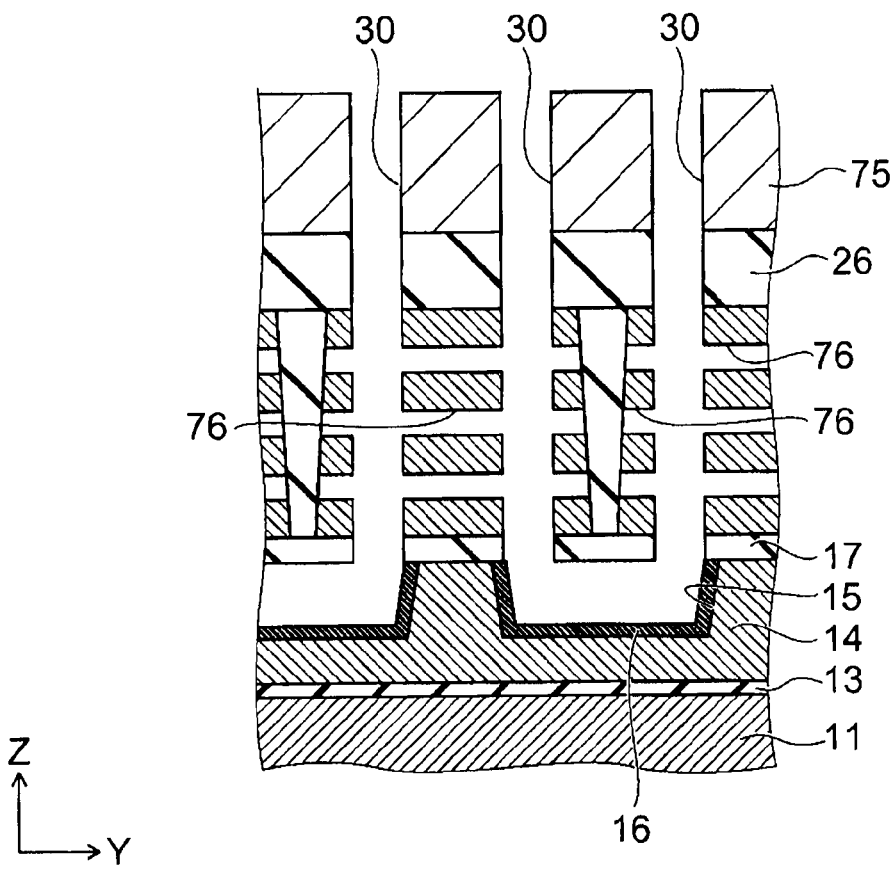
FIG. 34B is a process cross-sectional view along A-A' of FIG. 34A.

Next, as illustrated in FIGS. 34A and 34B, with an alkaline etchant, wet etching is performed via the through-holes 30 to remove the non-doped polysilicon layer 73 (see FIG. 33B) and the non-doped silicon material 71 (see FIG. 33B).

Figure 35A:
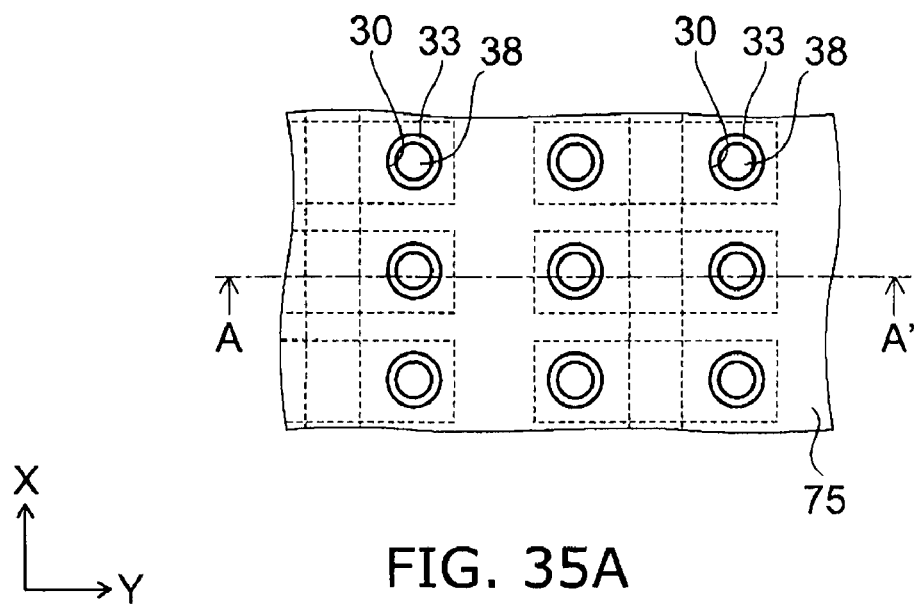
FIG. 35A is a process plan view illustrating the method for manufacturing the nonvolatile semiconductor memory device according to the third embodiment.
Figure 35B:
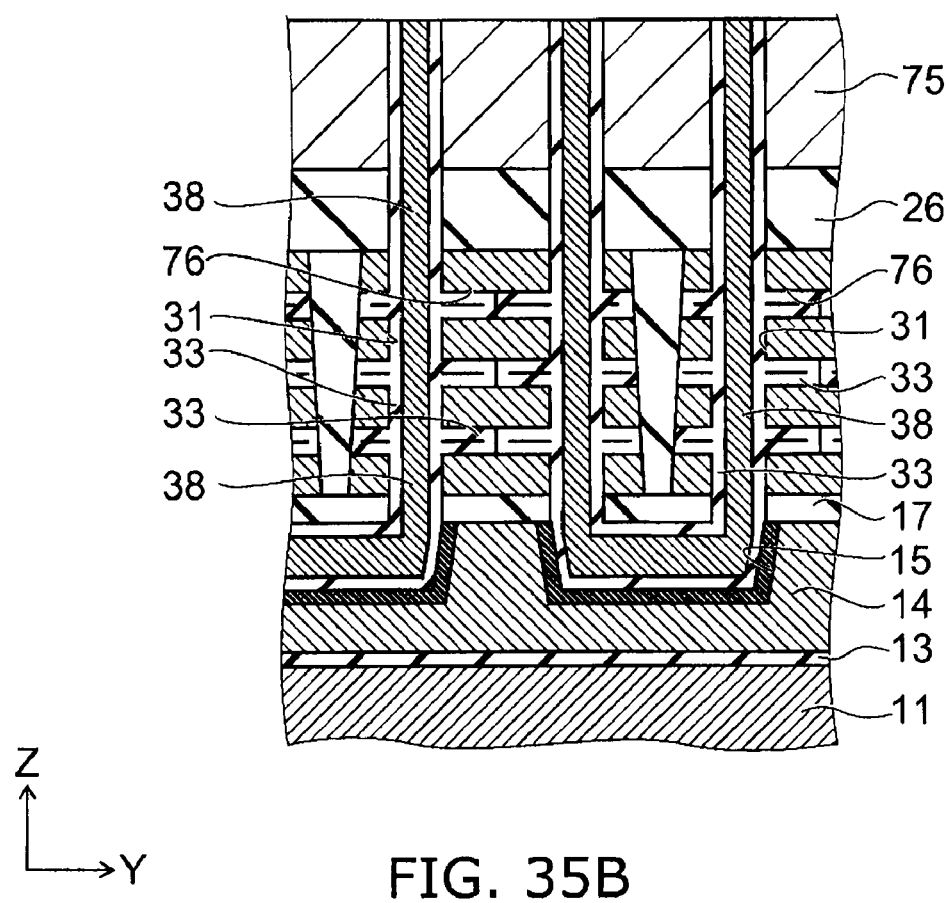
FIG. 35B is a process cross-sectional view along A-A' of FIG. 35A.

Then, as illustrated in FIGS. 35A and 35B, the memory film 33 is formed in the U-shaped holes 31 and the spaces 76. That is, as illustrated in FIG. 3, the block insulation film 35 is buried in the spaces 76 while the block insulation film 35 is formed on the interior surfaces of the U-shaped holes 31. Then, the charge storage film 36 and the tunnel insulation film 37 are sequentially formed. Then, the U-shaped pillars 38 are buried in the U-shaped holes 31.

The following processes are different from those of the first embodiment described above.

Figure 36A:
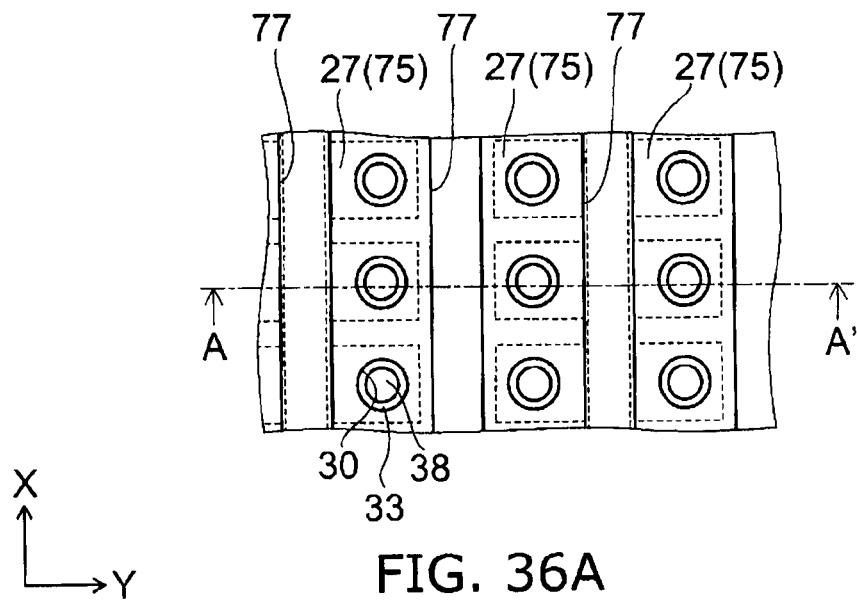
FIG. 36A is a process plan view illustrating the method for manufacturing the nonvolatile semiconductor memory device according to the third embodiment.
Figure 36B:
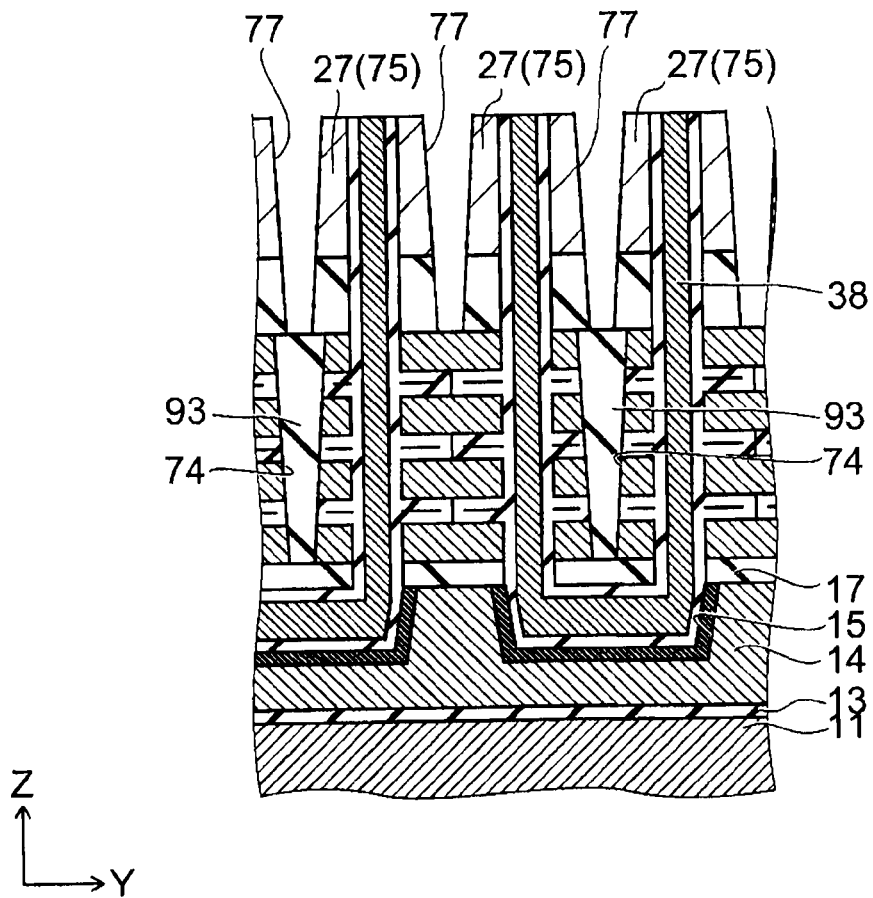
FIG. 36B is a process cross-sectional view along A-A' of FIG. 36A.

That is, as illustrated in FIGS. 36A and 36B, slits 77 extended in the X direction are formed to pierce the boron-doped polysilicon film 75 and the silicon oxide film 26. Thus, the boron-doped polysilicon film 75 is divided into a plurality of control electrodes 27. At this time, the slits 77 are formed with respect to each column of the through-holes 30 arranged in columns along the X direction but are formed alternately in the areas directly on the slits 77, and the sacrifice material 93 is exposed on the bottom surfaces of the slits 77.

Figure 37A:
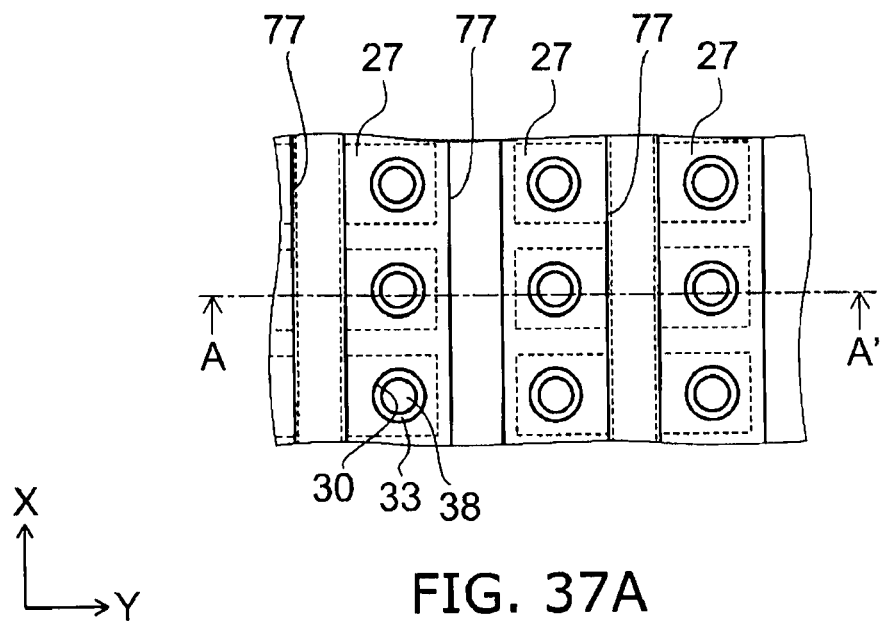
FIG. 37A is a process plan view illustrating the method for manufacturing the nonvolatile semiconductor memory device according to the third embodiment.
Figure 37B:
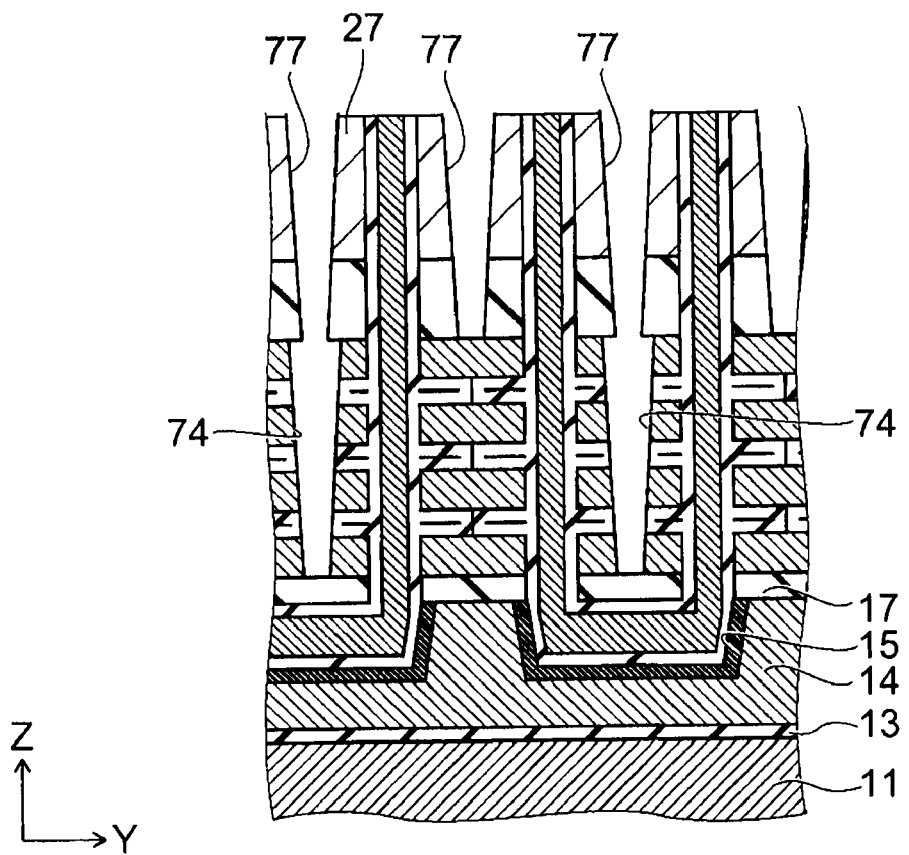
FIG. 37B is a process cross-sectional view along A-A' of FIG. 37A.

Next, as illustrated in FIGS. 37A and 37B, with high-temperature phosphoric acid, wet etching is performed via the slits 77 to remove the sacrifice material 93 (see FIG. 36B).

Thus, the insides of the slits 77 become void, and the gate electrodes 21 are exposed on the interior surfaces of the slits 74.

Figure 38A:
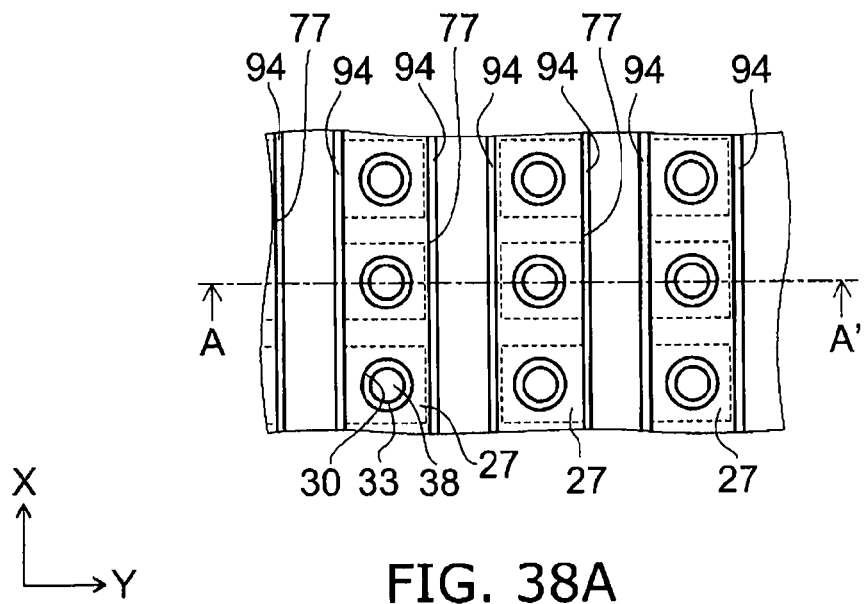
FIG. 38A is a process plan view illustrating the method for manufacturing the nonvolatile semiconductor memory device according to the third embodiment.
Figure 38B:
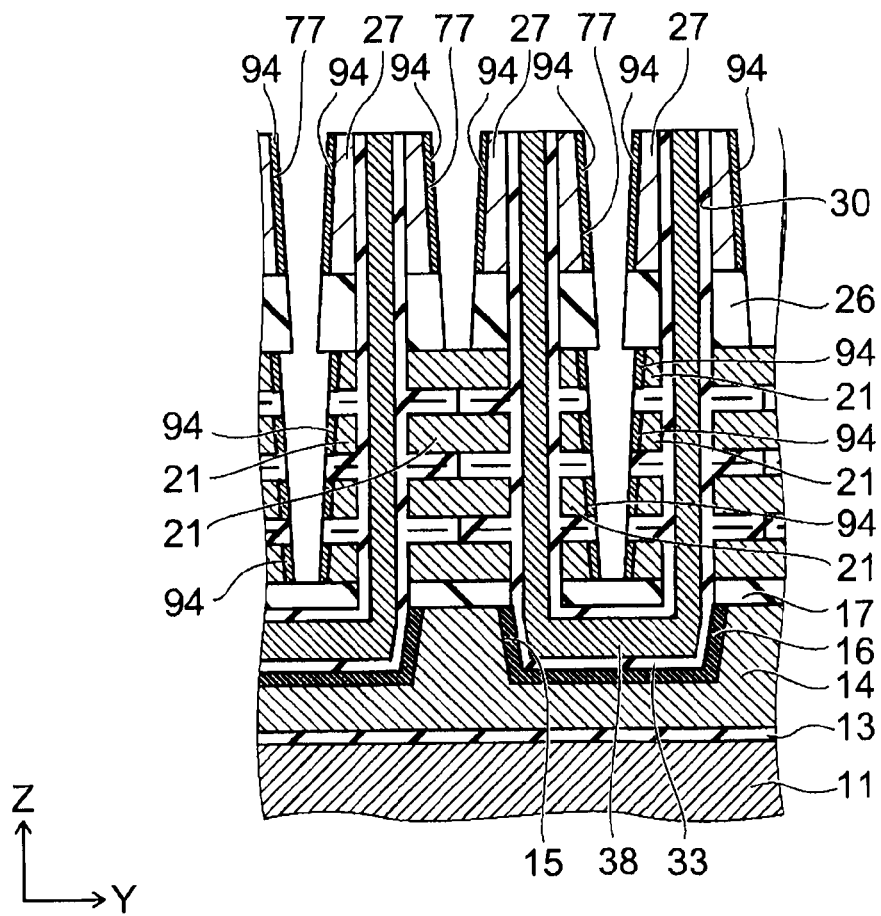
FIG. 38B is a process cross-sectional view along A-A' of FIG. 38A.

Next, as illustrated in FIGS. 38A and 38B, a metal, such as nickel, cobalt or the like, is deposited on the interior surfaces of the slits 74 and on the interior surfaces of the slits 77. Then, heat treatment is performed. Thus, a metal silicide layer 94 is formed on the interior surfaces of the slits 74 and 77 where silicon is exposed, i.e., on the interior surfaces of the slits 74 where the gate electrodes 21 are exposed and on the interior surfaces of the slits 77 where the selective electrodes 27 are exposed. Similar to the second embodiment described above, a metal to be deposited is not limited to nickel or cobalt and can be any metal as far as the metal reacts with silicon to form metal silicide and decreases the electric resistance more than before the reaction.

Figure 39A:
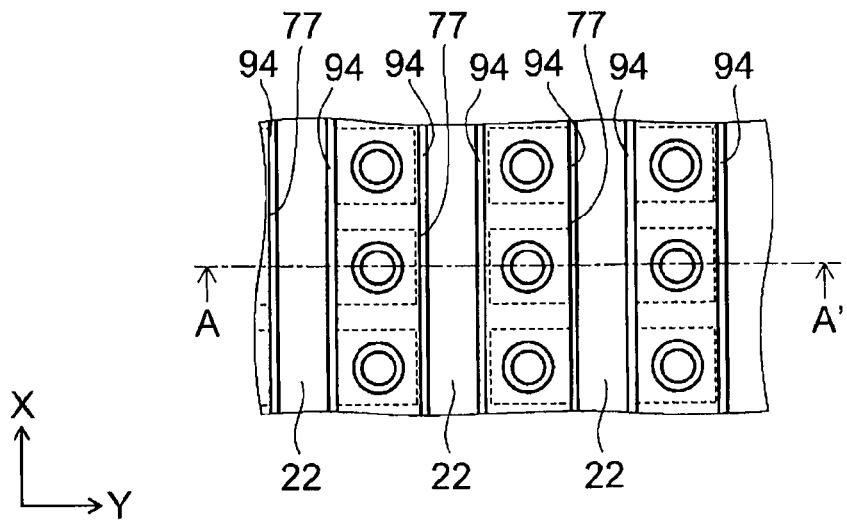
FIG. 39A is a process plan view illustrating the method for manufacturing the nonvolatile semiconductor memory device according to the third embodiment.
Figure 39B:
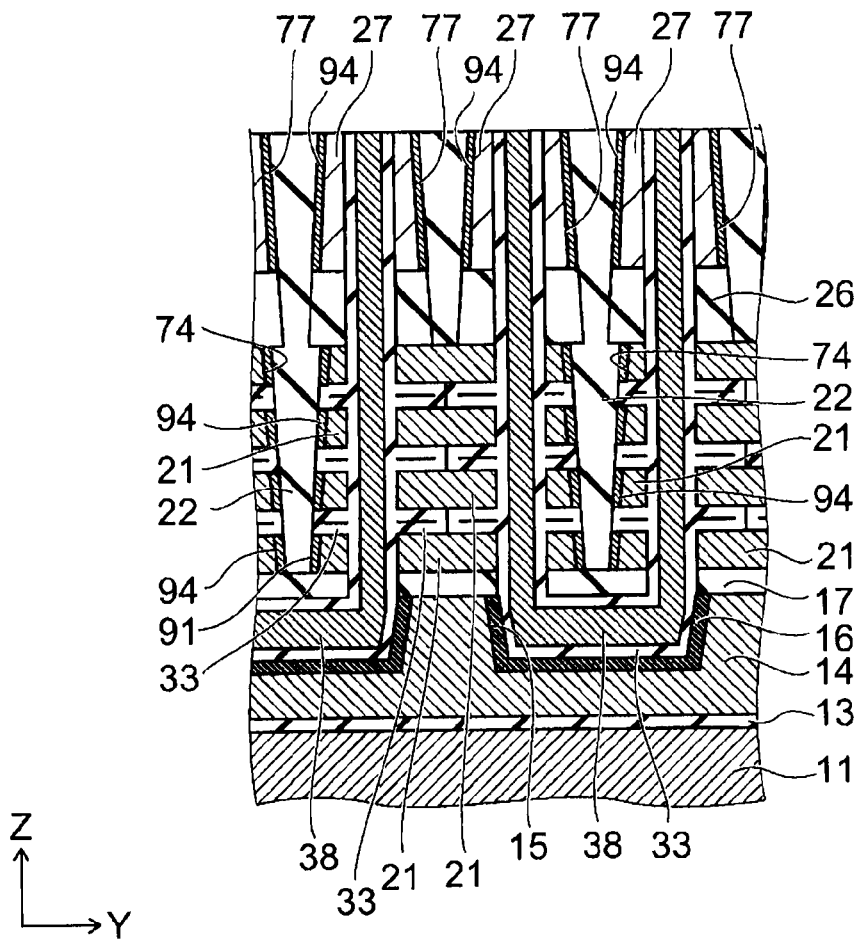
FIG. 39B is a process cross-sectional view along A-A' of FIG. 39A.

Next, as illustrated in FIGS. 39A and 39B, an insulation material, such as silicon oxide or the like, is deposited on the entire surface, and then the entire surface is etched to bury the insulation material in the slits 74 and 77. Thus, insulation plates 22 are formed in the slits 74.

Then, similar to the first embodiment described above, a source line 47, a bit line 52, and the like are formed. The manufacturing method according to this embodiment except the process described above is the same as the manufacturing method according to the first embodiment described above.

According to this embodiment, in comparison with the second embodiment described above, the metal silicide layer 94 can be formed in the regions opposed to the insulation plates 22 on the surfaces of the gate electrodes 21 and the surfaces of the control electrodes 27, i.e., in the regions not opposed to the silicon pillars 39. Thus, the influence of the presence of the metal silicide layer 94 on the operations of the memory transistors and the selective transistors can be suppressed. The configuration and operational effects of this embodiment except those described above are the same as those of the second embodiment described above.

Hereinabove, the invention is described with reference to embodiments, but the invention is not limited to these embodiments. The respective embodiments described above to which those skilled in the art suitably have added or deleted constituent elements or have made design changes, or have added or deleted processes or have made changes to the conditions are contain the scope of the invention as far as they have the spirits of this invention.

For example, each of the aforementioned embodiments describes that the deposition amount of the block insulation film 35 is set at a half or more of a distance between the gate electrodes 21 adjacent to each other in the Z direction, whereby the insides of the spaces 76 are completely filled by block insulation film 35 to prevent the intrusion of the charge storage film 36 into the spaces 76. However, the invention is not limited to the embodiments, and the deposition amount of the block insulation film 35 is set at below a half excluding a half of a distance to intrude the charge storage film 36 into the spaces 76. The tunnel insulation film 37 together with the charge storage film 36 may be intruded into the spaces 76. However, it is necessary to prevent the intrusion of the silicon pillars 39 into the spaces 76.

Each of the aforementioned embodiments describes that in the respective step of the stacked body 20, one gate electrode 21 is provided for two columns of the silicon pillars 30 arranged along the X direction. However, this invention is not limited to thereto. For example, one gate electrode 21 may be provided for one column of the silicon pillars 39.

Furthermore, the respective embodiments described above show that the memory strings are formed along the U-shaped pillars 38 in a U-shape. However, this invention is not limited to thereto. It is possible that the source lines in place of the back gate electrode 14 are disposed between the silicon substrate 11 and the stacked body 20, I-shaped silicon pillars are connected between the bit lines disposed above the stacked body 20 and the source line disposed below the stacked body 20, and the memory strings are configured along the silicon pillars.

The invention claimed is:

1. A method of manufacturing a nonvolatile semiconductor memory device comprising:
    forming a stacked body by alternately stacking impurity-doped silicon layers and silicon layers without impurity on an upper surface of a substrate;
    forming a slit in the stacked body from an upper surface side of the stacked body to divide each of the impurity-doped silicon layers into a plurality of gate electrodes, the slit being extended in a first direction parallel to an upper surface of the substrate;
    burying an insulation material in the slit to form an insulation plate;
    forming a through-hole so as to pierce the stacked body, the through-hole being extended in an up-to-down direction perpendicular to the upper surface of the substrate;
    removing the silicon layers without impurity by performing wet etching via the through-hole;
    depositing a block insulation film on an interior surface of the through-hole and on an upper surface and a lower surface of the gate electrodes;
    depositing a charge storage film on the block insulation film;
    depositing a tunnel insulation film on the charge storage film; and
    burying a semiconductor material in the through-hole to form a semiconductor pillar extended in the up-to-down direction.

2. The method of manufacturing a nonvolatile semiconductor memory device according to claim 1, wherein
    a deposition amount of the block insulation film is a half or more of a distance between the gate electrodes in the up-to-down direction.

3. The method of manufacturing a nonvolatile semiconductor memory device according to claim 1, further comprising
    forming a metal silicide layer on an exposed surface of the gate electrodes after the removing the silicon layer without impurity.

4. The method of manufacturing a nonvolatile semiconductor memory device according to claim 1, wherein
    the wet-etching is performed with an alkaline etchant.

5. The method of manufacturing a nonvolatile semiconductor memory device according to claim 1, wherein
    boron is used as the impurity.

6. The method of manufacturing a nonvolatile semiconductor memory device according to claim 1, further comprising:
    forming a back gate electrode on the substrate; and
    forming a recess in the back gate electrode,
    the slit being formed so as to pass through an area immediately above the central part of the recess in a second direction orthogonal to the first direction and the up-to-down direction,
    the through-hole being formed so as to reach one of both ends of a connection member in the second direction, and
    the semiconductor material being buried also in the recess to form the connection member in the burying the semiconductor material in the through-hole.

7. The method of manufacturing a nonvolatile semiconductor memory device according to claim 6, further comprising:
forming an insulation film on the stacked body;
forming a conductive film on the insulation film;
dividing the conductive film with respect to a column consisting of a plurality of the through-holes arranged in the first direction to form a plurality of control electrodes;
forming a source line on the control electrodes so as to be extended in the first direction and be connected to one of a pair of semiconductor pillars, the pair of the semiconductor pillars being connected to the connection member; and
forming a bit line on the control electrodes so as to be extended in the second direction and be connected to another one of the pair of semiconductor pillars,
the through-holes being formed so as to pierce both the conductive film and the insulation film.

8. A method of manufacturing a nonvolatile semiconductor memory device comprising:
forming a stacked body by alternately stacking impurity-doped silicon layers and silicon layers without impurity on an upper surface of a substrate;
forming a slit on an upper surface of the stacked body to divide each of the impurity-doped silicon layers into a plurality of gate electrodes, the slit being extended in a first direction parallel to an upper surface of the substrate;
burying a sacrifice material in the slit;
forming a through-hole so as to pierce the stacked body, the through-hole being extended in an up-to-down direction perpendicular to the upper surface of the substrate;
removing the silicon layers without impurity by performing wet-etching via the through-hole;
depositing a block insulation film on an interior surface of the through-hole and an upper surface and a lower surface of the gate electrodes;
depositing a charge storage film on the block insulation film;
depositing a tunnel insulation film on the charge storage film;
burying a semiconductor material in the through-hole to form a semiconductor pillar extended in the up-to-down direction;
removing the sacrifice material;
forming a metal silicide layer on a surface of each of the gate electrodes exposed in the slit; and
burying an insulation material in the slit to form an insulation plate.

9. The method of manufacturing a nonvolatile semiconductor memory device according to claim 8, wherein
a deposition amount of the block insulation film is a half or more of a distance between the gate electrodes in the up-to-down direction.

* * * * *